(12) United States Patent
Yoon et al.

(10) Patent No.: US 10,297,781 B2
(45) Date of Patent: May 21, 2019

(54) ORGANIC LIGHT EMITTING DISPLAY DEVICE AND DRIVING METHOD OF THE SAME

(71) Applicant: LG DISPLAY CO., LTD., Seoul (KR)

(72) Inventors: Siu Yoon, Paju-si (KR); Seung Chan Choi, Paju-si (KR); Jun Ho Lee, Paju-si (KR); Sung Bin Ryu, Paju-si (KR); Ki Tae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/637,993

(22) Filed: Jun. 29, 2017

(65) Prior Publication Data

US 2018/0006263 A1 Jan. 4, 2018

(30) Foreign Application Priority Data

Jun. 30, 2016 (KR) .................. 10-2016-0083057
Sep. 27, 2016 (KR) .................. 10-2016-0124196

(51) Int. Cl.
*H01L 51/52* (2006.01)
*H01L 51/05* (2006.01)
(Continued)

(52) U.S. Cl.
CPC ....... *H01L 51/5212* (2013.01); *G09G 3/3233* (2013.01); *H01L 51/0508* (2013.01);
(Continued)

(58) Field of Classification Search
CPC ............. H01L 51/5212; H01L 51/0508; H01L 51/5008; H01L 27/1108; H01L 27/3276; H01L 27/1248; H01L 29/7866; G09G 3/3677; G02F 1/1368; G06F 3/044

USPC .......................................................... 345/82
See application file for complete search history.

(56) References Cited

U.S. PATENT DOCUMENTS 5,406,107 A * 4/1995 Yamaguchi ......... H01L 27/1108
257/393
2011/0063266 A1 3/2011 Chung et al.
(Continued)

FOREIGN PATENT DOCUMENTS

KR 10-2015-0106370 A 9/2015

OTHER PUBLICATIONS

European Office Action dated Jan. 31, 2019 for EP Application No. 17178623.9—1209, 7 pages.

*Primary Examiner* — Fred Tzeng
(74) *Attorney, Agent, or Firm* — Seed Intellectual Property Law Group LLP

(57) ABSTRACT

An organic light emitting display device includes a plurality of pixels each having a pixel driving circuit. Each of the pixels includes an organic light emitting diode and a driving TFT that controls driving of the organic light emitting diode and includes an active layer of low temperature poly-silicon, a gate node, a source node, and a drain node. The pixels include first to fifth switching TFTs electrically connected to the driving TFT and each including an active layer of an oxide semiconductor, a gate node, a source node, and a drain node. Further, the pixels include a storage capacitor connected between the gate node of the driving TFT and the source node of the fifth switching TFT and a coupling capacitor electrically connected in series to the storage capacitor and configured to cause capacitive coupling to supply a bootstrapped voltage to the gate node of the driving TFT.

24 Claims, 31 Drawing Sheets

(51) Int. Cl.
*H01L 51/50* (2006.01)
*G09G 3/3233* (2016.01)
*H01L 27/32* (2006.01)

(52) U.S. Cl.
CPC . *H01L 51/5008* (2013.01); *G09G 2300/0819* (2013.01); *G09G 2300/0852* (2013.01); *G09G 2300/0861* (2013.01); *G09G 2310/0213* (2013.01); *G09G 2310/0286* (2013.01); *G09G 2320/0247* (2013.01); *G09G 2320/0252* (2013.01); *H01L 27/3288* (2013.01); *H01L 51/0504* (2013.01)

(56) References Cited

U.S. PATENT DOCUMENTS

| | | | |
|---|---|---|---|
| 2011/0108830 A1* | 5/2011 | Park | H01L 29/7869 257/43 |
| 2012/0313084 A1* | 12/2012 | Tsai | H01L 29/78606 257/40 |
| 2013/0141316 A1 | 6/2013 | Lee et al. | |
| 2014/0049531 A1 | 2/2014 | Kwak | |
| 2015/0243203 A1 | 8/2015 | Kim et al. | |
| 2015/0243718 A1* | 8/2015 | Kwon | H01L 27/1248 257/43 |
| 2015/0309346 A1* | 10/2015 | Oh | G02F 1/1368 349/47 |
| 2016/0005372 A1* | 1/2016 | Yu | G09G 3/3677 345/208 |
| 2016/0034097 A1* | 2/2016 | Chae | G06F 3/044 345/173 |
| 2016/0063922 A1 | 3/2016 | Tsai et al. | |
| 2017/0025068 A1 | 1/2017 | Jeoung et al. | |
| 2017/0270886 A1* | 9/2017 | Yu | G09G 3/3677 |
| 2018/0151654 A1* | 5/2018 | Lee | H01L 27/3276 |

* cited by examiner

ORGANIC LIGHT EMITTING DISPLAY DEVICE AND DRIVING METHOD OF THE SAME

CROSS-REFERENCE TO RELATED APPLICATIONS

This application claims the priority of Korean Patent Application No. 10-2016-0083057 filed on Jun. 30, 2016 and Korean Patent Application No. 10-2016-0124196 filed on Sep. 27, 2016, in the Korean Intellectual Property Office, the disclosure of which is incorporated herein by reference.

BACKGROUND

Technical Field

The present disclosure relates to an organic light emitting display device and a driving method of the same, and more particularly, to an organic light emitting display device capable of reducing a flicker and a driving method of the same.

Description of the Related Art

Recently, as information technology has developed display devices have been rapidly grown up that can represent information contained in electrical signals in the form of visual images. Thus, various display devices with excellent performance, such as thinner, weight-lighter, and low power consumption have been developed.

Specific examples of the display devices include a Liquid Crystal Display (LCD) device, a Plasma Display Panel (PDP) device, a Field Emission Display (FED) device, an Organic Light Emitting Display (OLED) device, and the like.

Each of a plurality of pixels constituting an OLED device includes an organic light emitting diode including an organic emission layer between an anode and a cathode and a pixel driving circuit that independently drives the organic light emitting diode. The pixel driving circuit includes a switching thin film transistor (hereinafter, referred to as "TFT"), a driving TFT, and a capacitor. Herein, the switching TFT charges the capacitor with a data voltage in response to a scan pulse. Also, the driving TFT controls the amount of current to be supplied to the organic light emitting diode depending on the data voltage charged in the capacitor and thus controls the amount of light emission of the organic light emitting diode.

The OLED device is a self-light emitting display device. The OLED device does not need a separate light source unlike an LCD device. Thus, the OLED device can be manufactured into a lightweight and thin form. Further, the OLED device is advantageous in terms of power consumption since it is driven with a low voltage. Also, the OLED device has excellent color expression ability, a high response speed, a wide viewing angle, and a high contrast ratio (CR). Therefore, the OLED device has been researched as a next-generation display device in many fields. In addition, the organic light emitting diode has a surface emitting structure and thus can be easily implemented into a flexible form.

In the OLED device having the above-described advantages, the pixels are different from each other in a threshold voltage (Vth) and mobility of the driving TFT due to a process variation or the like. Also, a voltage drop of a high-potential voltage (VDD) occurs, so that the amount of current for driving the organic light emitting diode is changed. Therefore, there is a luminance difference between the pixels. Such a luminance difference is recognized as a flicker by a user.

Also, after an emission control signal is applied in an emission section in which each pixel emits light, an increase rate of the amount of current driving the organic light emitting diode may be decreased due to a parasitic capacitance in the pixel or a voltage change in the pixel. Thus, there may be a delay in emission by the organic light emitting diode with a sufficient luminance. Therefore, a low luminance can be recognized, so that a flicker phenomenon may occur.

Accordingly, there has been demanded an OLED device having a new structure in which a flicker phenomenon rarely occurs.

BRIEF SUMMARY

The inventors of the present disclosure recognized that an OLED device can suppress a delay of a current flowing in an organic light emitting diode caused by a difference in a threshold voltage (Vth) and mobility of a driving TFT due to a process variation or the like and a voltage drop of a high-potential voltage (VDD) in the pixel.

Accordingly, an object to be achieved by the present disclosure is to provide an OLED device and a driving method of the same. In the OLED device, a coupling capacitor is used in each pixel driving circuit to rapidly increase a voltage of a gate node and a source node in a driving TFT of a pixel driving circuit during an emission section. Thus, a delay of a current flowing in an organic light emitting diode can be improved.

The objects of the present disclosure are not limited to the aforementioned objects, and other objects, which are not mentioned above, will be apparent to a person having ordinary skill in the art from the following description.

According to an aspect of the present disclosure, there is provided an OLED device. The OLED device includes a plurality of pixels each including a pixel driving circuit.

The plurality of pixels includes an organic light emitting diode and a driving TFT configured to control driving of the organic light emitting diode and including an active layer of low temperature poly-silicon (LTPS), a gate node, a source node, and a drain node.

Also, the plurality of pixels includes first to fifth switching TFTs electrically connected to the driving TFT and each including an active layer prepared using an oxide semiconductor, a gate node, a source node, and a drain node.

Further, the plurality of pixels includes a storage capacitor connected between the gate node of the driving TFT and the source node of the fifth switching TFT and a coupling capacitor electrically connected in series to the storage capacitor and configured to cause capacitive coupling so as to supply a bootstrapped voltage to the gate node of the driving TFT.

According to another aspect of the present disclosure, there is provided an OLED device. The OLED device includes a plurality of pixels each including an organic light emitting diode and a pixel driving circuit that drives the organic light emitting diode.

Also, the pixel driving circuit includes a driving TFT configured to control driving of the organic light emitting diode and having a gate node as a first node, a drain node as a second node, and a source node as a third node. Further, the pixel driving circuit includes first to fifth switching TFTs electrically connected to the driving TFT, a storage capacitor connected to a fourth node as the drain node of the fifth switching TFT and configured to store a voltage to be applied to the driving TFT DT. Furthermore, the pixel driving circuit includes a coupling capacitor configured to supply a bootstrapped voltage to the first node as the gate node of the driving TFT.

Also, the pixel driving circuit includes an initialization period in which an initialization voltage Vinit is supplied to the fourth node and a high-potential voltage VDD is supplied to the first node. Further, the pixel driving circuit includes a sampling period in which a data voltage Vdata is supplied to the third node and a threshold voltage Vth of the driving TFT DT is scanned when the high-potential voltage VDD is decreased to the data voltage Vdata in the first node.

Furthermore, the pixel driving circuit includes a voltage holding section in which the first to fifth switching TFTs are turned off and each node is floated. Moreover, the pixel driving circuit includes a connection section in which the third node and the fourth node are electrically connected to each other and the data voltage Vdata held in the third node is supplied to the fourth node. Besides, the pixel driving circuit includes an emission section in which a voltage of the first node is rapidly increased by the coupling capacitor and a voltage of the source node of the driving TFT is also increased according to the increased voltage of the first node, so that a delay of a current involved in emission by the organic light emitting diode is minimized.

Details of other exemplary embodiments will be included in the detailed description and the accompanying drawings.

According to the present disclosure, a coupling capacitor is used in each pixel driving circuit of an OLED device to rapidly increase a voltage of a gate node and a source node in a driving TFT. Thus, a delay of a current flowing in an organic light emitting diode during an emission period can be improved, so that it is possible to suppress a flicker phenomenon.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
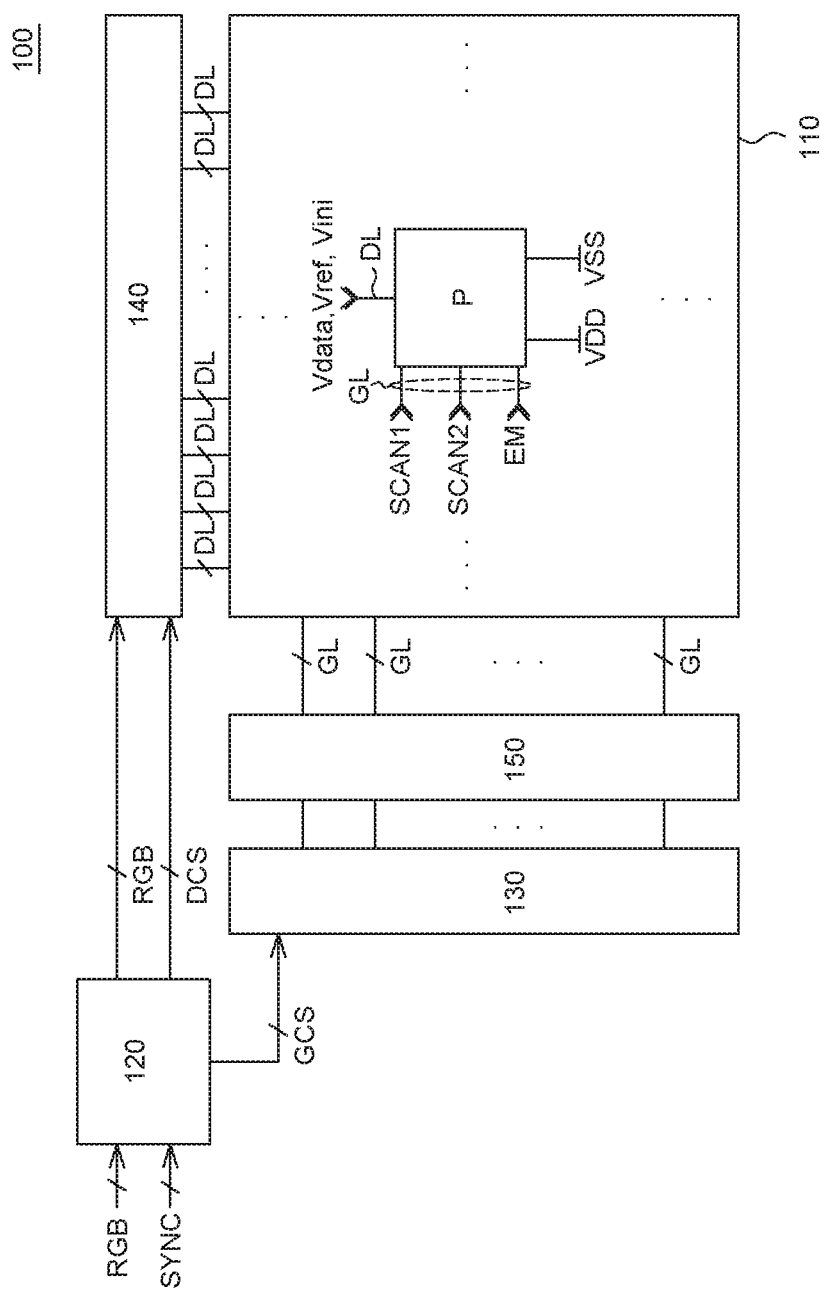
FIG. 1 is a schematic block diagram of a display device provided to explain a gate driving circuit according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Further, in the following description, a detailed explanation of well-known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

In the present disclosure, a TFT may be of a P-type or an N-type. Also, in explaining pulse-type signals, a gate high voltage (VGH) state is defined as "high state" and a gate low voltage (VGL) state is defined as "low state".

Hereinafter, various exemplary embodiments of the present disclosure will be described in detail with reference to the accompanying drawings.

FIG. 1 is a schematic block diagram of a display device provided to explain a gate driving circuit according to an exemplary embodiment of the present disclosure.

Referring to FIG. 1, an OLED device 100 includes a display panel 110 including a plurality of pixels P and a gate driving circuit 130 that supplies a gate signal to each of the plurality of pixels P. Also, the OLED device 100 includes a data driving circuit 140 that supplies a data signal to each of the plurality of pixels P and a timing controller 120 that controls the gate driving circuit 130 and the data driving circuit 140.

The timing controller 120 processes image data RGB input from the outside so as to be suitable for the size and resolution of the display panel 110, and then supplies the image data RGB to the data driving circuit 140. The timing controller 120 generates a plurality of gate control signals GSC and a plurality of data control signals DCS by using synchronization signals SYNC, e.g., a dot clock signal, a data enable signal, a horizontal synchronization signal, and a vertical synchronization signal, which are input from the outside. Further, the timing controller 120 supplies the generated the plurality of gate and data control signals GCS and DCS to the gate driving circuit 130 and the data driving circuit 140, respectively, and thus controls the gate driving circuit 130 and the data driving circuit 140. Herein, the plurality of gate control signals GCS may include a luminance control signal CS, and specific characteristics of the luminance control signal CS will be described later with reference to FIG. 3.

The gate driving circuit 130 supplies a gate signal to a gate line GL in response to the gate control signal GCS supplied from the timing controller 120. Herein, the gate signal includes at least one scan signal and an emission control signal. Although FIG. 1 illustrates that the gate driving circuit 130 is disposed on one side of the display panel 110 as being spaced from the display panel 110, the number and position of the gate driving circuits 130 is not limited thereto. That is, the gate driving circuit 130 may be disposed on one side or both sides of the display panel 110 in a GIP (Gate In Panel) manner.

The data driving circuit 140 converts the image data RGB into a data voltage in response to a data control signal DCS supplied from the timing controller 120 and supplies the converted data voltage to the pixel P through a data line DL.

In the display panel 110, a plurality of gate lines GL and a plurality of data lines DL are disposed to intersect with each other and each of the plurality of pixels P is connected to the gate lines GL and the data lines DL. Specifically, one pixel P is supplied with a gate signal from the gate driving circuit 130 through a gate line GL, a data signal from the data driving circuit 140 through a data line DL, and various power source through a power supply line.

More specifically, one pixel P receives at least one scan signal and an emission control signal through the gate line GL, a data voltage or a reference voltage through the data line DL, and a high-potential voltage VDD, a low-potential voltage VSS, and an initialization voltage Vinit through the power supply line.

Herein, the gate line GL may include a first scan signal line SCAN1, a second scan signal line SCAN2, and an emission control signal line EM, and the data line DL may include a voltage line. The voltage line is configured to supply the data voltage Vdata, the reference voltage Vref, and the initialization voltage Vinit to each of the plurality of pixels P. Also, the power supply line is connected to the display panel 110 through the timing controller 120 so as to supply power to each of the plurality of pixels P.

Accordingly, one pixel P receives the scan signal and the emission control signal through the gate line GL, the data voltage Vdata, the reference voltage Vref, and the initialization voltage Vinit through the data line DL, and the high-potential voltage VDD and the low-potential voltage VSS through the power supply line.

Also, each pixel P includes an organic light emitting diode and a pixel driving circuit configured to control driving of the organic light emitting diode. Herein, the organic light emitting diode includes an anode, a cathode, and an organic emission layer between the anode and the cathode. The pixel driving circuit includes a plurality of switching elements, a driving switching element, and a capacitor. Herein, the switching element may be configured as a TFT. In the pixel driving circuit, a driving TFT controls the amount of current to be supplied to the organic light emitting diode depending on a difference between a data voltage charged in the capacitor and a reference voltage so as to control the amount of light emission of the organic light emitting diode. Further, the plurality of switching TFTs receives scan signals and emission control signals supplied through the gate lines GL and charges the capacitor with a data voltage.

The luminance control unit 150 is disposed between the gate driving circuit 130 and the display panel 110. The luminance control unit 150 is electrically connected to the gate driving circuit 130 and the display panel 110 through the gate line GL. The luminance control unit 150 may supply a gate signal supplied from the gate driving circuit 130 to the display panel 110 in a distributed manner during a plurality of divided refresh sections. The configuration of the luminance control unit 150 will be described in detail later with reference to FIG. 2.

The OLED device 100 according to an exemplary embodiment of the present disclosure includes the gate driving circuit 130 and the data driving circuit 140 for driving the display panel 110 including the plurality of pixels P, and the timing controller 120 for controlling the gate driving circuit 130 and the data driving circuit 140. Particularly, the OLED device 100 may further include the luminance control unit 150 between the display panel 110 and the gate driving circuit 130. The luminance control unit 150 is capable of controlling luminance of the plurality of pixels P. The luminance control unit 150 controls timing of supplying a gate signal during a refresh section where the display panel 110 is refreshed. Thus, a decrease in luminance of the display panel 110 can be suppressed. Therefore, since a luminance decrease in the display panel 110 is suppressed, a flicker phenomenon caused by the luminance decrease can be reduced. The configuration of the luminance control unit 150 will be described in detail later with reference to FIG. 2.

I. [Driving Method] Refresh Section-Divided Drive

Figure 2:
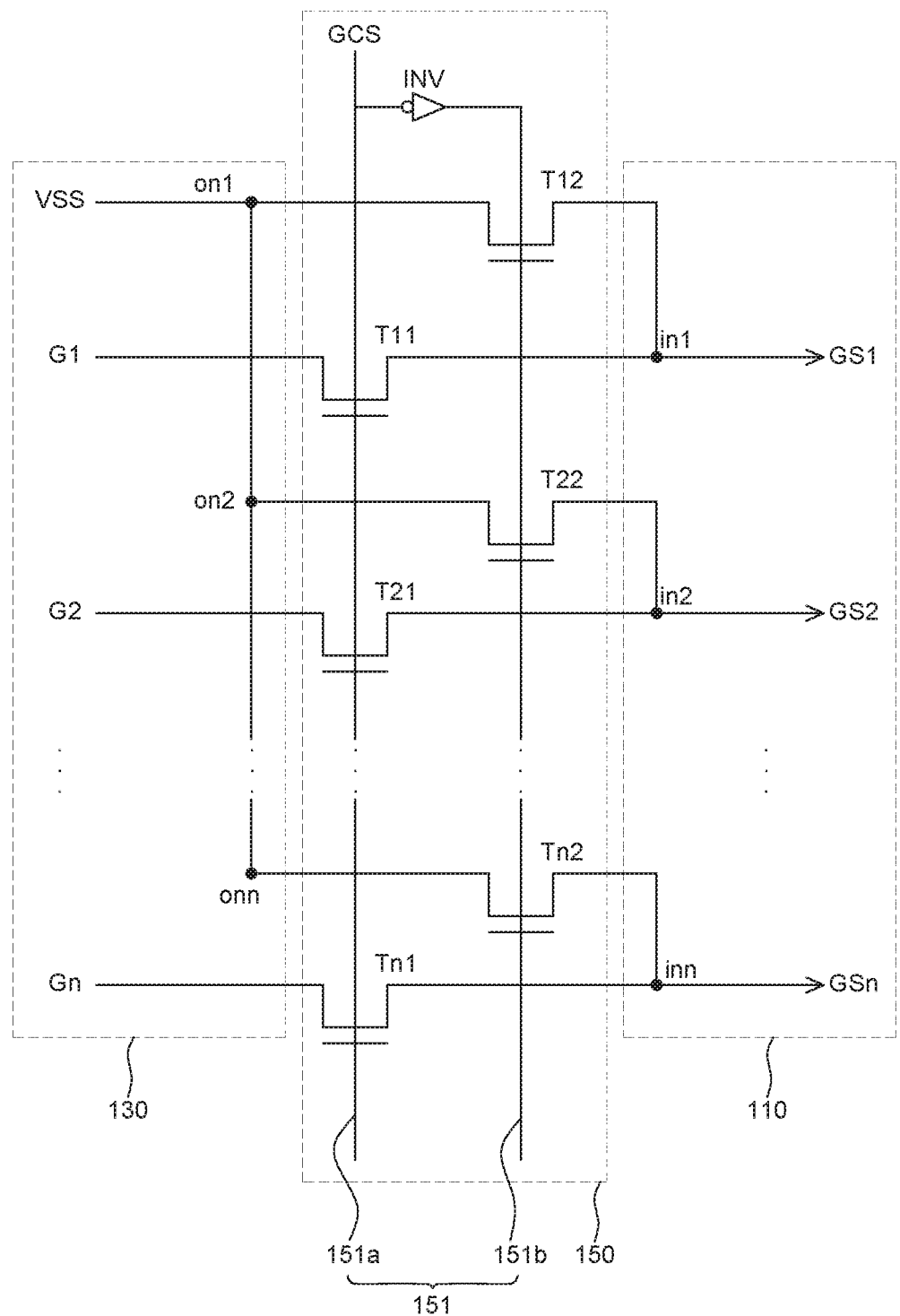
FIG. 2 is a circuit diagram showing a configuration of a luminance control unit according to an exemplary embodiment of the present disclosure.

FIG. 2 is a circuit diagram showing a configuration of a luminance control unit according to an exemplary embodiment of the present disclosure. For convenience in explanation, FIG. 1 will also be referred to hereinafter.

Referring to FIG. 2, the luminance control unit 150 is disposed between the gate driving circuit 130 and the display panel 110. Specifically, the luminance control unit 150 is disposed between the gate driving circuit 130 and the display panel 110 and electrically connected to a plurality of gate lines G1 to Gn and a power supply line VSS. Further, the luminance control unit 150 includes a part of the plurality of gate lines and a part of the power supply line at a position between the gate driving circuit 130 and the display panel 110 and electrically connecting the gate driving circuit 130 and the display panel 110. Herein, the power supply line VSS is a low-potential power supply line configured to supply a gate low voltage VGL. In some exemplary embodiments, the power supply line VSS may be substituted by a high-potential power supply line configured to supply a gate high voltage VGH.

Also, the luminance control unit 150 includes a first switching element Tx1, a second switching element Tx2, and a first luminance control signal line 151a. Herein, x denotes the number of the order of alignment of the gate lines GL and is a natural number of 1 to the maximum number of the gate lines GL. For example, x is a natural number of 1 to 1536.

The first switching element Tx1 is electrically connected to each of the plurality of gate lines G1 to Gn. Specifically, the first switching element Tx1 includes a gate connected to the first luminance control signal line 151a and is disposed between a gate line connected to an output node onx of the gate driving circuit 130 and a gate line connected to an input node inx of the display panel 110. For example, on the first gate line G1, a first switching element T11 of the first gate line is disposed between the output node onx of the gate driving circuit 130 and the input node inx of the display panel 110 as being connected to the first gate line G1.

Therefore, the first switching element Tx1 determines whether or not to supply the gate signal GS including the gate high voltage VGH to each of the plurality of gate lines G1 to Gn during a predetermined period of time. Specifically, the first switching element Tx1 shorts or opens each of the plurality of gate lines G1 to Gn in response to a luminance control signal input through the first luminance control signal line 151a connected to the gate. For example, if the luminance control signal is in a high state, the first switching element Tx1 is turned on and thus shorts the gate line Gx connected to the first switching element Tx1. Thus, the gate line Gx connected to the turned-on first switching element Tx1 may supply a gate signal GSx to the display panel 110. A waveform of the luminance control signal and its resultant output of a gate signal and luminance will be described later with reference to FIG. 3 and FIG. 4.

A second switching element Tx2 is electrically connected between each of the plurality of gate lines and the power supply line. Specifically, the second switching element Tx2 includes a gate connected to a second luminance control signal line 151b and is disposed between a power supply line VSS connected to the output node onx of the gate driving circuit 130 and a gate line connected to the input node inx of the display panel 110. In this case, the second luminance control signal line 151b is connected to an output node of an inverter INV in the first luminance control signal line 151a. That is, the second switching element Tx2 includes a gate electrically connected to the output node of the inverter INV.

Therefore, the second switching element Tx2 supplies the gate low voltage VGL to each of the plurality of gate lines G1 to Gn during a predetermined period of time. Specifically, the second switching element Tx2 is shorted or opened such that the gate low voltage VGL can be supplied to the gate line Gx from the input node inx of the display panel 110 through the power supply line VSS in response to a luminance control signal input through the second luminance control signal line 151b. For example, if the luminance control signal is in a high state, a luminance control signal in a low state is input into the gate of the second switching element Tx2 through the second luminance control signal line 151b and the second switching element Tx2 is turned off. If the luminance control signal is in a low state, a luminance control signal in a high state is input into the gate of the second switching element Tx2 through the second luminance control signal line 151b and the second switching element Tx2 is turned on. Thus, the gate line Gx connected to the turned-on second switching element Tx2 may supply a gate low voltage VGL to the display panel 110. A waveform of the luminance control signal and its resultant output of a gate signal and luminance will be described later with reference to FIG. 3 and FIG. 4.

The luminance control signal line 151 includes the first luminance control signal line 151a and the second luminance control signal line 151b. The luminance control signal line 151 is electrically connected to the first switching element Tx1 and the second switching element Tx2. Specifically, the first luminance control signal line 151a is connected to the first switching element Tx1 and the second luminance control signal line 151b is connected to the second switching element Tx2. Further, the luminance control unit 150 may include the inverter INV that controls the first switching element Tx1 and the second switching element Tx2 to operate reversely to each other. The second luminance control signal line 151b is connected to the gate of the second switching element Tx2 in the output node of the inverter INV connected to the first luminance control signal line 151a.

The luminance control signal line 151 supplies a luminance control signal to the first switching element Tx1 and the second switching element Tx2. Specifically, luminance control signals reversed to each other through the first luminance control signal line 151a and the second luminance control signal line 151b are supplied to the first switching element Tx1 and the second switching element Tx2, respectively. Therefore, the first switching element Tx1 and the second switching element Tx2 connected to the same gate line Gx operate in opposite ways to each other. For example, while a luminance control signal in a high state is supplied to the first luminance control signal line 151a, the first switching element Tx1 is turned on. While a luminance control signal in a low state is supplied to the second luminance control signal line 151b, the second switching element Tx2 is turned off.

Further, if the first switching element Tx1 is turned on, the second switching element Tx2 is turned off, so that the gate signal GSx is output through the gate line Gx. If the first switching element Tx1 is turned off, the second switching element Tx2 is turned on, so that the gate low voltage VGL is output as a low-potential voltage signal through the gate line Gx. Therefore, by controlling a section in which a luminance control signal is in a high state, it is possible to determine a gate line Gx that outputs a gate signal GSx during a refresh section. A specific method of controlling an operation of a switching element depending on a waveform of the luminance control signal will be described later with reference to FIG. 3 and FIG. 4.

The OLED device 100 according to an exemplary embodiment of the present disclosure includes the first switching element Tx1 connected to each of the plurality of gate lines G1 to Gn, the power supply line VSS, the second switching element Tx2 connected between the power supply line VSS and each of the plurality of gate lines G1 to Gn, and the luminance control signal line 151 connected to the gates of the first switching element Tx1 and the second switching element Tx2. Therefore, during a predetermined refresh section, only the first switching element Tx1 connected to a predetermined gate line Gx is turned on in response to a luminance control signal input through the luminance control signal line 151. Thus, a gate signal GSx is output. That is, the luminance control signal may determine the gate line Gx that outputs the gate signal GSx during a refresh section. Further, a plurality of refresh sections may be set in a frame in response to the luminance control signal, and a gate signal may be output through a different gate line during each of the plurality of refresh sections.

Figure 3:
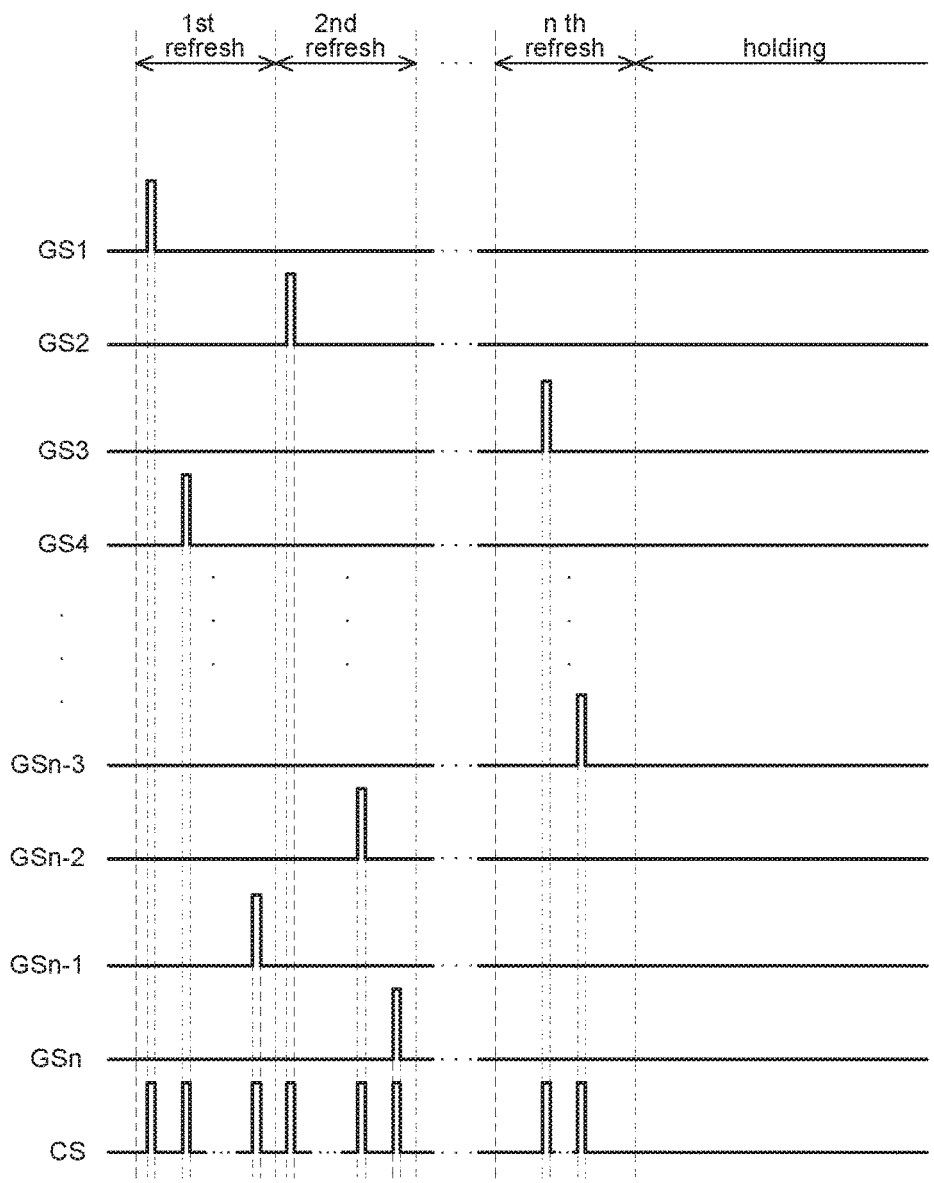
FIG. 3 is a waveform diagram showing a gate signal and a luminance control signal in a low-speed driving mode of an OLED device according to an exemplary embodiment of the present disclosure.
Figure 4:
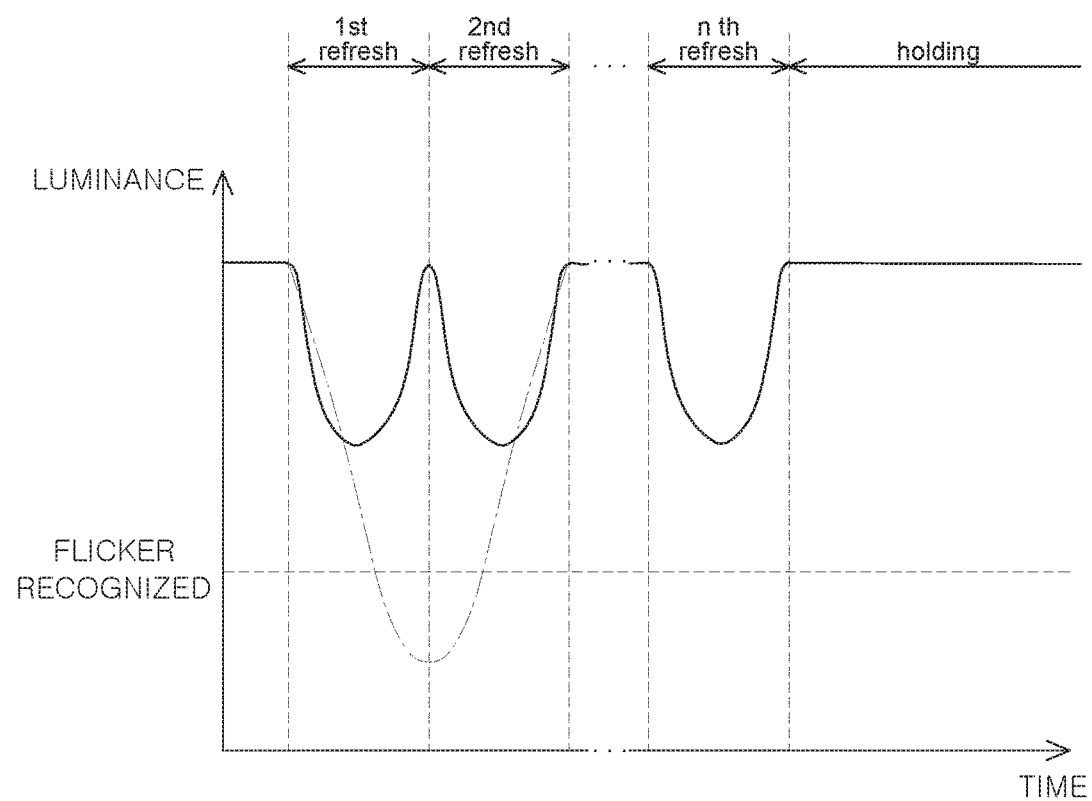
FIG. 4 is a luminance graph in the low-speed driving mode of the OLED device according to an exemplary embodiment of the present disclosure.

FIG. 3 is a waveform diagram showing a gate signal and a luminance control signal in a low-speed driving mode of an OLED device according to an exemplary embodiment of the present disclosure. FIG. 4 is a luminance graph in the low-speed driving mode of the OLED device according to an exemplary embodiment of the present disclosure. For convenience in explanation, FIG. 1 and FIG. 2 will be referred to hereinafter.

A low-speed driving mode of the OLED device 100 is controlled such that the entire refresh section is shorter than a horizontal holding section during a unit time.

Referring to FIG. 3, the entire refresh section includes k number of refresh sections. During the entire refresh section, a gate signal GSx including a pulse having a gate high voltage VGH during a short section may be output through a gate line. That is, the gate signal GSx may be output irregularly throughout each of the k number of refresh sections, but the gate signal GSx is supplied only once to all of the gate lines Gx during the entire refresh section.

For example, each of the plurality of refresh sections may be maintained for a time period equal to the result of dividing the entire refresh section of 16.6 msec by k. During a first refresh section, the first gate signal GS1 may be output through the first gate line G1, a fourth gate signal GS4 may be output through a fourth gate line G4, and an n–1th gate signal GSn–1 may be output through an n–1th gate line Gn–1. During a second refresh section, a second gate signal GS2 may be output through a second gate line G2, an n–2th gate signal GSn–2 may be output through an n–2 gate line Gn–2, and an nth gate signal GSn may be output through an nth gate line Gn. During a kth refresh section, a third gate line GS3 may be output through a third gate line G3 and an n–3th gate signal GSn–3 may be output through an n–3th gate line Gn–3. Thus, during the first to kth refresh sections, the gate signals GS1 to GSn are output through all of the gate lines G1 to Gn, respectively.

The luminance control signal CS controls each of the plurality of gate lines whether or not to output a gate signal. Specifically, the luminance control signal CS controls an operation of the first switching element connected to the gate line to output a gate signal during a predetermined refresh section. At the same time, the luminance control signal CS controls an operation of the second switching element to output a gate low voltage during a predetermined refresh section.

As such, the luminance control signal CS is supplied to the luminance control unit 150 in order for a gate signal to be distributed and output to each of the gate lines during the entire refresh section. Thus, the luminance control unit 150 may control a predetermined gate line Gx to output a gate signal GSx during each of the plurality of refresh sections in response to the luminance control signal CS supplied to the luminance control signal line 151.

Particularly, the entire refresh section may include two refresh sections. That is, the entire refresh section may include the first refresh section and the second refresh section. During each of the first refresh section and the second refresh section, a gate signal may be output only to a predetermined gate line.

Thus, the luminance control signal may determine a gate line that outputs a gate signal during each of the first refresh section and the second refresh section. For example, the luminance control signal may control an odd-numbered gate line to output a gate signal during the first refresh section among the plurality of refresh sections. Also, the luminance control signal may control an even-numbered gate line to output a gate signal during the second refresh section among the plurality of refresh sections. A gate signal to be output when the entire refresh section is divided into two refresh sections and its resultant luminance change will be described later with reference to FIG. 5 and FIG. 6. Further, the output of a gate signal may be controlled such that a refresh blank section is included among the plurality of refresh sections. A gate signal to be output when the entire refresh section includes a refresh blank section and its resultant luminance change will be described later with reference to FIG. 7 and FIG. 8.

In FIG. 4, a solid line is a graph showing a luminance change during a refresh section and a holding section caused by a low-speed driving method according to the exemplary embodiment illustrated in FIG. 3. Also, a dashed-dotted line is a graph showing a luminance change during a refresh section and a holding section caused by a low-speed driving method according to Comparative Example. In a Comparative Example, the first to nth gate lines G1 to Gn output gate signals GS1 to GSn in sequence without dividing a refresh section by the low-speed driving method.

Figure 5:
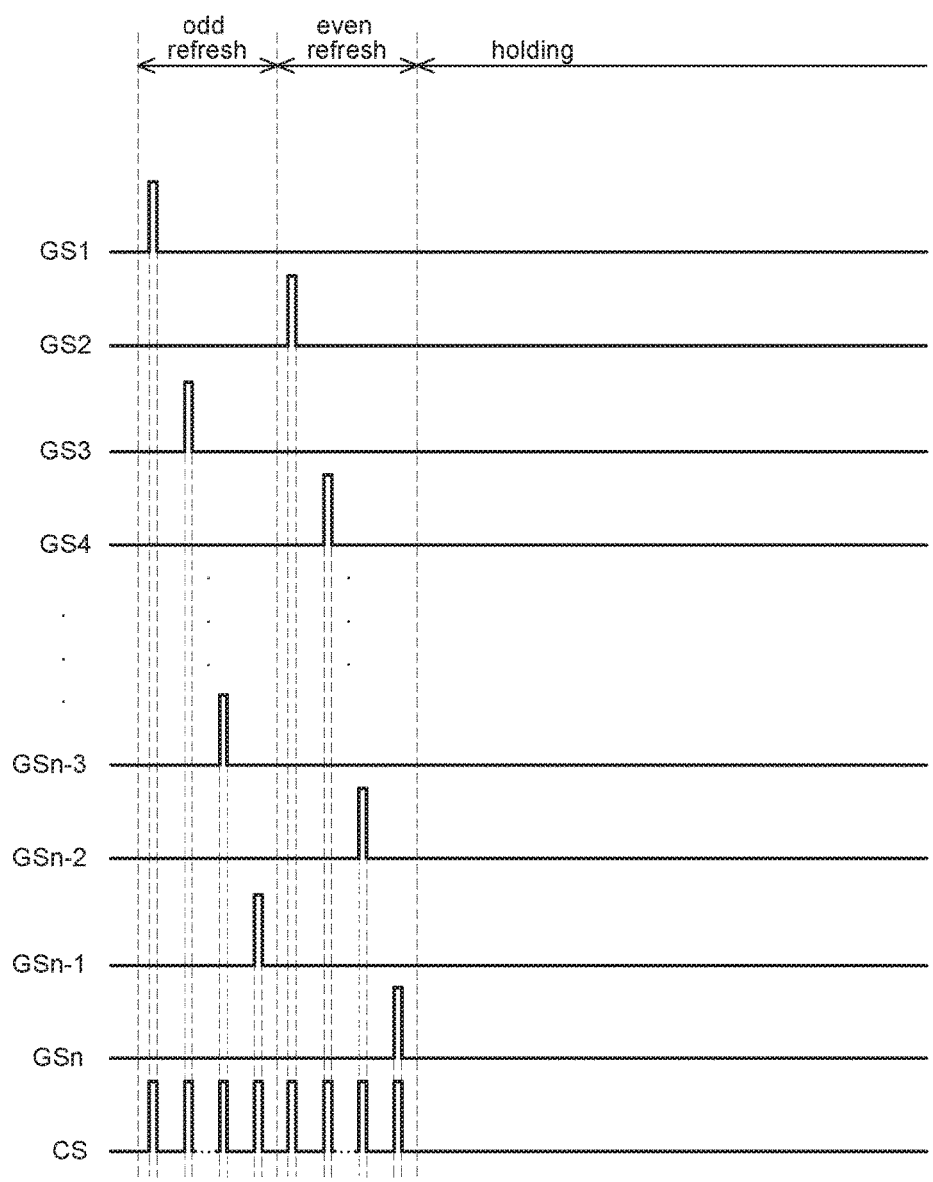
FIG. 5 is a waveform diagram showing a gate signal in a low-speed driving mode of an OLED device according to another exemplary embodiment of the present disclosure.

Referring to FIG. 4, the luminance of the OLED device is decreased during each of the plurality of refresh sections by a low-speed driving mode illustrated in FIG. 5. That is, during the entire refresh section, the luminance is decreased by being divided k times. Specifically, during the first refresh section, only pixels disposed on the first gate line G1, the fourth gate line G4, and the n–1th gate line Gn–1 are initialized but pixels disposed on the other gate lines are not initialized. Therefore, a luminance decrease during the first refresh section is smaller than that in the case where all of the pixels are initialized. Also, during the second refresh section, only pixels disposed on the second gate line G2, the n–2th gate line Gn–2, and the nth gate line Gn are initialized but pixels disposed on the other gate lines are not initialized. Therefore, a luminance decrease during the second refresh section is smaller than that in the case where all of the pixels are initialized. In the same manner, a luminance decrease during each of the first to kth refresh sections may be smaller than that in the case where all of the pixels are initialized.

Therefore, a luminance decrease during the entire refresh section is divided into luminance decreases during the k number of refresh sections, respectively. Thus, the minimum values of luminance are remarkably increased. Accordingly, a luminance decrease which can be recognized does not occur during the refresh section, so that a flicker phenomenon can be reduced even in the low-speed driving mode. In this case, the entire refresh section may be slightly longer than the refresh section in the Comparative Example. However, even if the entire refresh section is increased, it cannot be recognized by the human eye. Also, since the refresh section is divided into a plurality of sections, the luminance is increased. Thus, a flicker phenomenon can be suppressed.

Particularly, in an OLED device including a multi-type TFT, a switching TFT in a pixel is configured as an oxide semiconductor TFT and a driving TFT in the pixel is configured as an LTPS TFT. In this case, a refresh section is divided in an interlaced manner. Thus, during the refresh section, a time interval in which the switching TFT is driven can be secured as much as possible, so that the reliability of the switching TFT can be secured and a luminance decrease during the refresh section can be reduced.

Figure 6:
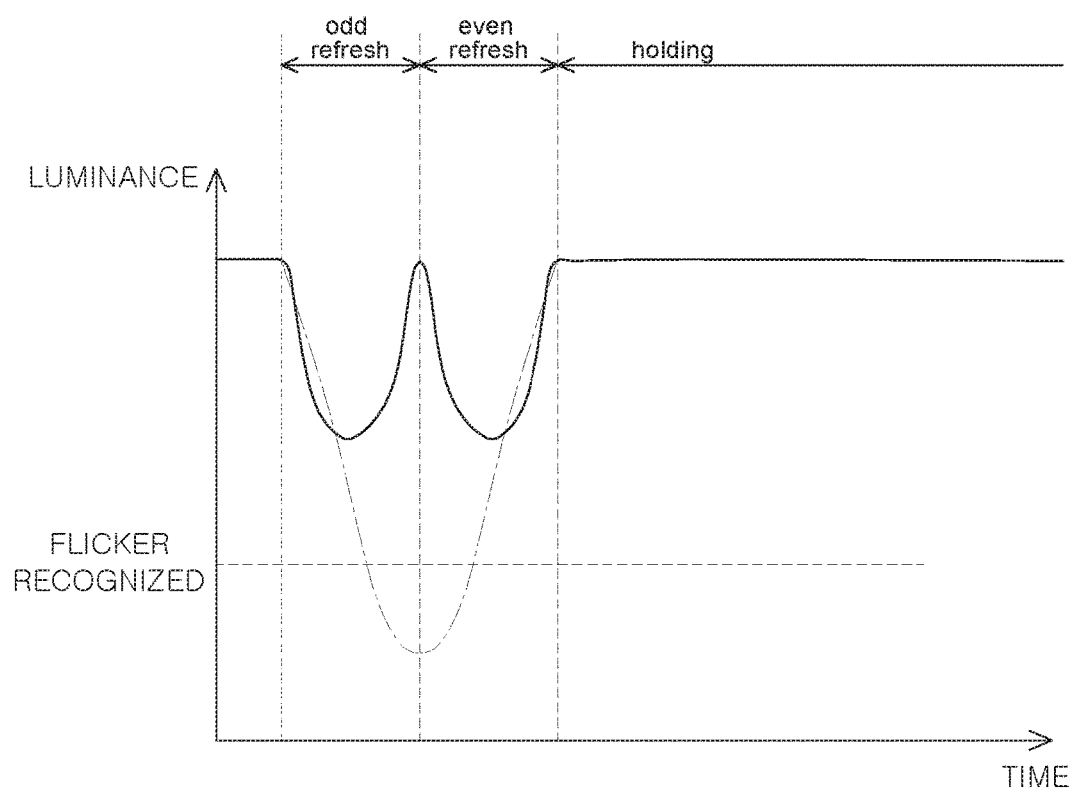
FIG. 6 is a luminance graph in the low-speed driving mode of the OLED device according to another exemplary embodiment of the present disclosure.

FIG. 5 is a waveform diagram showing a gate signal in a low-speed driving mode of an OLED device according to another exemplary embodiment of the present disclosure. FIG. 6 is a luminance graph in the low-speed driving mode of the OLED device according to another exemplary embodiment of the present disclosure. The waveform diagram according to another exemplary embodiment of the present disclosure shown in FIG. 5 and the luminance graph shown in FIG. 6 are substantially the same as the waveform diagram shown in FIG. 3 and the luminance graph shown in FIG. 4 except the number of refresh sections. Therefore, a redundant explanation thereof will be omitted herein.

Referring to FIG. 5, the entire refresh section includes an odd-numbered refresh section and an even-numbered refresh section. That is, if the entire refresh section includes k number of refresh sections, k is 2. For example, a low-speed driving mode can maintain the entire refresh section for 16.6 msec and a horizontal holding section for 983.4 msec during a time period of 1 second. Thus, the odd-numbered refresh section may be maintained for 8.3 msec and the even-numbered refresh section may also be maintained for 8.3 msec.

The odd-numbered refresh section refers to a section in which an odd-numbered gate line is refreshed, and the even-numbered refresh section refers to a section in which an even-numbered gate line is refreshed.

Referring to FIG. 5, during the odd-numbered refresh section, a shifted gate signal GS is supplied to each of odd-numbered gate lines in sequence and during the even-numbered refresh section, the shifted gate signal GS is supplied to each of even-numbered gate lines in sequence. Specifically, during the odd-numbered refresh section, a scan signal is shifted in sequence and then supplied only to the odd-numbered gate lines and a scan signal in a low state is supplied to the even-numbered gate lines. Likewise, during the even-numbered refresh section, a scan signal is shifted in sequence and then supplied only to the even-numbered gate lines and a scan signal in a low state is supplied to the odd-numbered gate lines. For example, during the odd-numbered refresh section ranging from 0 sec to 8.3 msec, a shifted scan signal is supplied to a first gate line, a third gate line, and a fifth gate line in sequence and a scan signal in a low state is supplied to the even-numbered gate lines. During the even-numbered refresh section ranging from 8.3 msec to 16.6 msec, a shifted scan signal is supplied to a second gate line, a fourth gate line, and a sixth gate line in sequence and a scan signal in a low state is supplied to the odd-numbered gate lines.

FIG. 5 illustrates that the odd-numbered refresh section is present prior to the even-numbered refresh section in the entire refresh section. However, the even-numbered refresh section may be present prior to the odd-numbered refresh section.

In FIG. 6, a solid line is a graph showing a luminance change during a refresh section and a holding section caused by a low-speed driving method according to the exemplary embodiment illustrated in FIG. 5.

Referring to FIG. 6, the luminance of the OLED device is decreased during the odd-numbered refresh section and the luminance of the OLED device is decreased during the even-numbered refresh section by a low-speed driving mode illustrated in FIG. 5. That is, during the entire refresh section, the luminance is decreased by being divided twice. Specifically, during the odd-numbered refresh section, only pixels disposed on the odd-numbered gate lines are initialized but pixels disposed on the even-numbered gate lines are not initialized. Therefore, a luminance decrease during the odd-numbered refresh section is about 50% smaller than that in the case where all of the pixels are initialized. Also, during the even-numbered refresh section, only pixels disposed on the even-numbered gate lines are initialized but pixels disposed on the odd-numbered gate lines are not initialized. Therefore, a luminance decrease during the even-numbered refresh section is about 50% smaller than a luminance decrease during the entire refresh section in the case where all of the pixels are initialized.

Therefore, a luminance decrease during the entire refresh section is divided into a luminance decrease during the odd-numbered refresh section and a luminance decrease during the even-numbered refresh section. Thus, the minimum values of luminance are remarkably increased. Accordingly, a luminance decrease which can be recognized does not occur during the refresh section, so that a flicker phenomenon can be reduced even in the low-speed driving mode.

Particularly, in an OLED device including a multi-type TFT, a switching TFT in a pixel is configured as an oxide semiconductor TFT and a driving TFT in the pixel is configured as an LTPS TFT. In this case, a refresh section is divided in an interlaced manner. Thus, during the refresh section, a time interval in which the switching TFT is driven can be secured as much as possible, so that the reliability of the switching TFT can be secured and a luminance decrease during the refresh section can be reduced.

Figure 7:
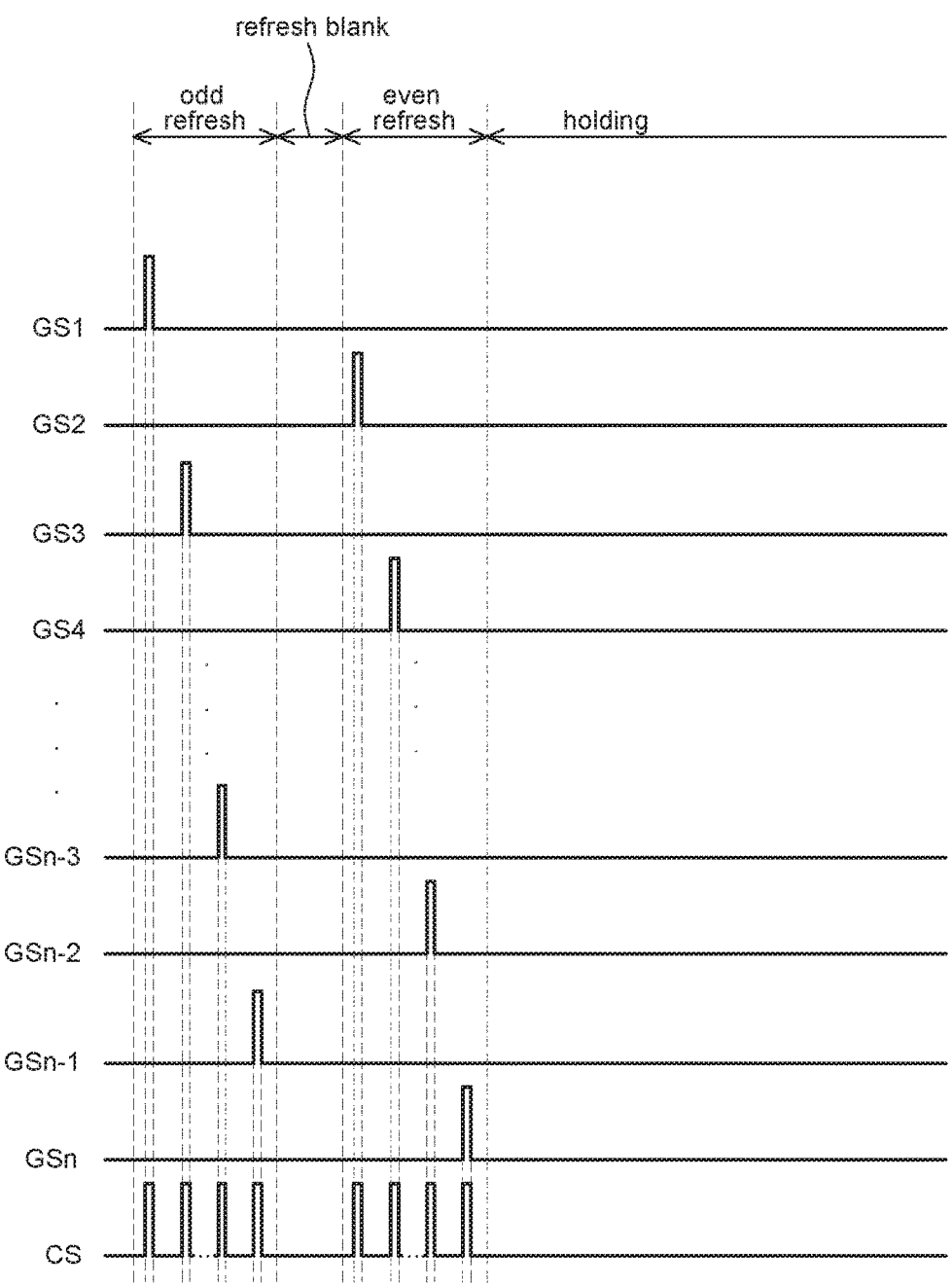
FIG. 7 is a waveform diagram showing a gate signal in a low-speed driving mode of an OLED device according to yet another exemplary embodiment of the present disclosure.
Figure 8:
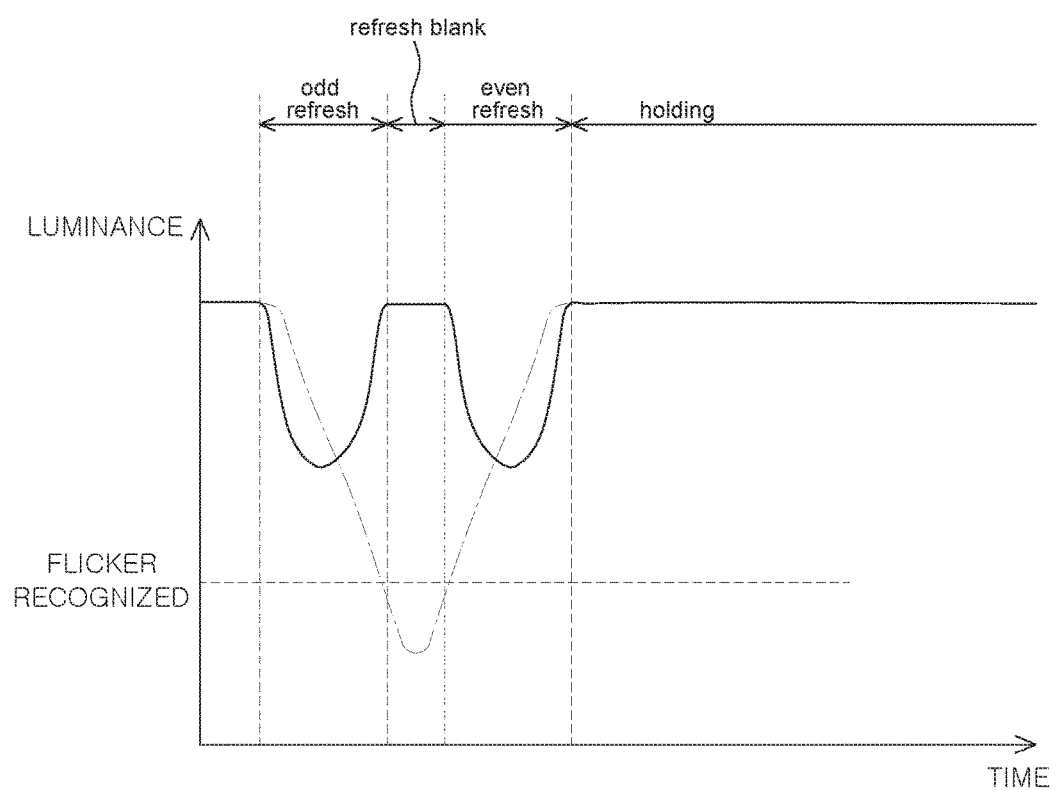
FIG. 8 is a luminance graph in the low-speed driving mode of the OLED device according to yet another exemplary embodiment of the present disclosure.

FIG. 7 is a waveform diagram showing a gate signal in a low-speed driving mode of an OLED device according to yet another exemplary embodiment of the present disclosure. FIG. 8 is a luminance graph in the low-speed driving mode of the OLED device according to yet another exemplary embodiment of the present disclosure. The waveform diagram according to yet another exemplary embodiment of the present disclosure shown in FIG. 7 and the luminance graph shown in FIG. 8 are substantially the same as the waveform diagram shown in FIG. 5 and the luminance graph shown in FIG. 6 except a refresh blank section. Therefore, a redundant explanation thereof will be omitted herein.

Referring to FIG. 7, a low-speed driving mode of the OLED device according to yet another exemplary embodiment of the present disclosure controls the gate signal GS such that a refresh blank section is included between an odd-numbered refresh section and an even-numbered refresh section. That is, the entire refresh section includes the odd-numbered refresh section, the even-numbered refresh section, and the refresh blank section. For example, the low-speed driving mode can control each of the odd-numbered refresh section and the even-numbered refresh section to 8 msec while maintain the entire refresh section for 16.6 msec and also maintain a horizontal holding section for 983.4 msec while controlling the refresh blank section between the odd-numbered refresh section and the even-numbered refresh section to 0.6 msec during a time period of 1 second.

In FIG. 8, a solid line is a graph showing a luminance change during a refresh section and a holding section caused by a low-speed driving method according to the exemplary embodiment illustrated in FIG. 7.

Referring to FIG. 8, the luminance of the OLED device is decreased during the odd-numbered refresh section and recovered during the refresh blank section and then the luminance of the OLED device is decreased during the even-numbered refresh section by a low-speed driving mode illustrated in FIG. 7. That is, during the entire refresh section, the luminance is decreased by being divided twice and there is a section in which the luminance is recovered and maintained between the two luminance decreases.

Therefore, a luminance decrease during the odd-numbered refresh section and a luminance decrease during the even-numbered refresh section may be separated by the refresh blank section. That is, a luminance decrease during the odd-numbered refresh section and a luminance decrease during the even-numbered refresh section are not overlapped with each other due to the refresh blank section. Thus, the refresh blank section suppresses an overlap of luminance decreases between the odd-numbered refresh section and the even-numbered refresh section. Accordingly, the refresh blank section can suppress worsening of a luminance decrease during the entire refresh section and also reduce the luminance decrease in the entire refresh section.

Particularly, in an OLED device including a multi-type TFT, a switching TFT in a pixel is configured as an oxide semiconductor TFT and a driving TFT in the pixel is configured as an LTPS TFT. In this case, a refresh section is divided in an interlaced manner. Thus, during the refresh section, a time interval in which the switching TFT is driven can be secured as much as possible, so that the reliability of the switching TFT can be secured and a luminance decrease during the refresh section can be reduced.

That is, a luminance decrease during each of the odd-numbered refresh section and the even-numbered refresh section is about 50% smaller than that in the case where the entire refresh section is not divided. Particularly, since the luminance is not decreased during the refresh blank section, a luminance decrease during the odd-numbered refresh section and a luminance decrease during the even-numbered refresh section are separated. Thus, a luminance decrease during the entire refresh section can be further suppressed.

As such, the OLED device 100 includes a driving TFT and a switching TFT in the pixel driving circuit, and active layers respectively constituting the driving TFT and the switching TFT may be prepared using materials different from each other. As such, the TFTs having different properties from each other are used as the driving TFT and the switching TFT in the single pixel driving circuit. Therefore, the OLED device 100 may include a multi-type TFT.

Specifically, in the OLED device 100 including a multi-type TFT, an LTPS TFT using low temperature poly-silicon (hereinafter, referred to as "LTPS") is used as a TFT including an active layer formed of a poly-crystalline semiconductor material. The poly-silicon material has high mobility (100 cm$^2$/Vs or more), low energy power consumption and excellent reliability. Thus, the poly-silicon material can be applied to the gate driver 130 and/or a multiplexer (MUX) for use in a driving device for driving TFTs for display device. Preferably, the poly-silicon material may be applied to driving TFTs within the pixels P of the OLED device 100.

Further, in the OLED device 100 including a multi-type TFT, an oxide semiconductor TFT including an active layer formed of an oxide semiconductor material is used. The oxide semiconductor material has a low off-current. Therefore, the oxide semiconductor material may be suitable for switching TFTs which remain on for a short time and off for a long time.

Particularly, the OLED device 100 including a multi-type TFT according to an exemplary embodiment of the present disclosure includes the pixel driving circuit in which the switching TFT is configured as the oxide semiconductor TFT and the driving TFT is configured as the LTPS TFT. However, in the OLED device 100 of the present disclosure, the switching TFT is not limited to the oxide semiconductor TFT and the driving TFT is not limited to the LTPS TFT. The OLED device 100 may have various configurations of a multi-type TFT. Further, in the OLED device 100 of the present disclosure, the pixel driving circuit may include only one kind of TFTs instead of a multi-type TFT.

Further, in the OLED device 100 according to an exemplary embodiment of the present disclosure, the pixel driving circuit including a coupling capacitor may have various configurations in order to improve a delay of a current flowing in the organic light emitting diode caused by a difference in a threshold voltage (Vth) and mobility of the driving TFT due to a process variation or the like and a voltage drop of a high-potential voltage (VDD).

In the pixel driving circuit including the coupling capacitor, a voltage Vg is rapidly increased at a gate node of the driving TFT due to bootstrapping. A current Ioled without a delay flows in the organic light emitting diode so as to correspond to a voltage Vgs between a gate and a source of the driving TFT. Therefore, the OLED device 100 of the present disclosure can minimize a flicker phenomenon caused by a luminance decrease in the organic light emitting diode.

II. [Internal Compensation] Vgs Increase in Driving TFT-4T2C Structure

Prior Art—Comparative Example

Figure 9:
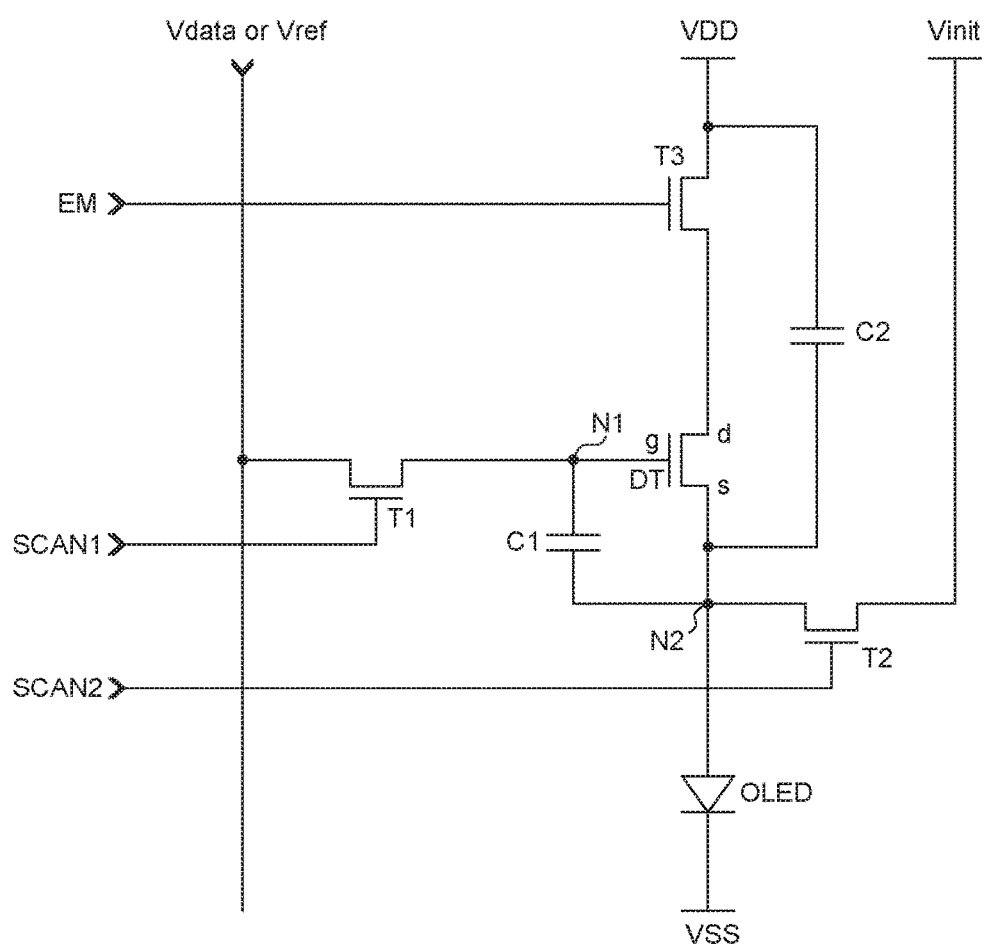
FIG. 9 is a circuit diagram showing a pixel circuit in an OLED device according to the prior art.

FIG. 9 is a circuit diagram showing a pixel circuit 800 in an OLED device according to the prior art.

Referring to FIG. 9, a pixel circuit 800 includes a driving TFT DT, three switching TFTs, and two capacitors.

The driving TFT DT includes a gate node as a first node N1 connected to a first switching TFT T1, a source node as a second node N2 connected to a second switching TFT T2, and a drain node as a third node N3 connected to a third switching TFT T3.

Specifically, the gate node of the driving TFT DT is electrically connected to a data line that supplies a data voltage Vdata or a reference voltage Vref. Thus, the gate node of the driving TFT DT is connected to a source node of the first switching TFT T1 so as to receive the data voltage Vdata or the reference voltage Vref. The drain node of the driving TFT DT is electrically connected to a high-potential voltage (VDD) line. Thus, the drain node of the driving TFT DT is connected to a source node of the third switching TFT T3 so as to receive a high-potential voltage VDD. The source node of the driving TFT DT is electrically connected to the organic light emitting diode. Specifically, the source node of the driving TFT DT is connected to an anode of the organic light emitting diode and a source node of the second switching TFT T2.

Therefore, if the third switching TFT T3 is turned on and the driving TFT DT is also turned on in response to an emission control signal EM, the driving TFT DT controls the intensity of a current flowing in the organic light emitting diode on the basis of a voltage applied to the gate node and the source node. Thus, the driving TFT DT can control the luminance of the organic light emitting diode.

The first switching TFT T1 includes a gate node connected to a first scan signal (SCAN1) line, a drain node connected to the data line, and the source node as the first node N1 connected to the driving TFT DT. Specifically, the gate node of the first switching TFT T1 is connected to the SCAN1 line, and, thus, the first switching TFT T1 is turned on or off in response to a first scan signal SCAN1. The drain node of the first switching TFT T1 is connected to the data line so as to transfer the data voltage Vdata or the reference voltage Vref to the gate node of the driving TFT DT. The source node of the first switching TFT T1 is directly connected to the gate node of the driving TFT DT.

Therefore, if the first scan signal SCAN1 is in a high state, the first switching TFT T1 is turned on so as to supply the data voltage Vdata or the reference voltage Vref to the gate node of the driving TFT DT.

The second switching TFT T2 includes a gate node connected to a second scan signal (SCAN2) line, a drain node connected to an initialization voltage (Vinit) line, and the source node connected to the source node of the driving TFT DT. Specifically, in the gate node of the second switching TFT T2, the second switching TFT T2 is turned on when a second scan signal SCAN2 is in a high state. The second switching TFT T2 supplies an initialization voltage Vinit to the second node N2. The source node of the second switching TFT T2 is directly connected to the source node of the driving TFT DT and the second node N2 connected to the anode of the organic light emitting diode.

Therefore, if the second scan signal SCAN2 is in a high state, the second switching TFT T2 is turned on so as to supply the initialization voltage Vinit to the second node N2. Thus, the data voltage Vdata written on the organic light emitting diode is initialized.

The third switching TFT T3 includes a gate node connected to an emission control signal (EM) line, a drain node connected to the high-potential voltage VDD line, and the source node connected to the drain node of the driving TFT DT. Specifically, the gate node of the third switching TFT T3 is connected to the EM line, so that the third switching TFT T3 is turned on when the emission control signal EM is in a high state. The drain node of the third switching TFT T3 is directly connected to the VDD line.

Therefore, if the emission control signal EM is in a high state, the third switching TFT T3 is turned on so as to supply the high-potential voltage VDD to the drain node of the driving TFT DT. Thus, the driving TFT DT adjusts the amount of current in the organic light emitting diode depending on the data voltage Vdata.

The two capacitors may be storage capacitors configured to store a voltage applied to the gate node or the source node of the driving TFT DT. Also, the two capacitors are connected in series at the source node of the driving TFT DT.

A first capacitor C1 is electrically connected to the first node N1 as the gate node of the driving TFT DT and the second node N2 as the source node of the driving TFT DT. Thus, the first capacitor C1 stores a voltage difference between a voltage to be applied to the first node N1 and a voltage to be applied to the second node N2. A second capacitor C2 is electrically connected to the second node N2 as the source node of the driving TFT DT and the VDD line. Further, the second capacitor C2 is connected in series to the first capacitor C1 at the second node N2. Thus, the second capacitor C2 stores a voltage according to voltage distribution with the first capacitor C1.

For example, the first capacitor C1 stores and samples a threshold voltage of the driving TFT DT as the voltage difference between the first node N1 and the second node N2. Further, if the data voltage Vdata is applied, the first capacitor C1 stores and programs a voltage determined by voltage distribution with the second capacitor C2. That is, the first capacitor C1 and the second capacitor C2 sample the threshold voltage of the driving TFT DT according to a source-follower method. If potentials of the first node N1 and the second node N2 are changed, the first capacitor C1 and the second capacitor C2 store the potentials of the first node N1 and the second node N2, respectively, by voltage distribution. The sampling and the programming of the first capacitor C1 will be described later with reference to FIG. 10.

Figure 10:
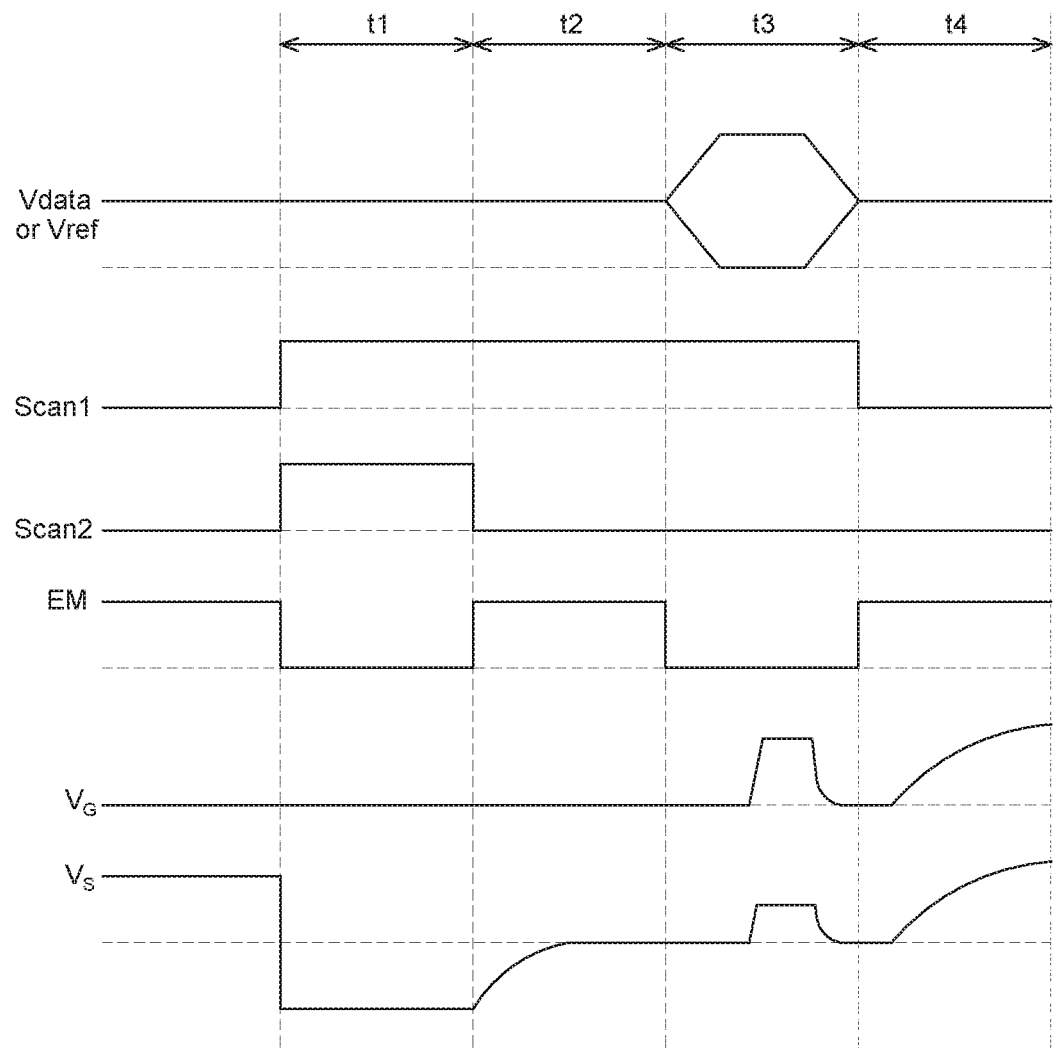
FIG. 10 is a waveform diagram showing a signal input into the pixel circuit illustrated in FIG. 9 and a resultant output signal.

FIG. 10 is a waveform diagram showing a signal input into the pixel circuit 800 illustrated in FIG. 9 and a resultant output signal. For convenience in explanation, FIG. 9 will be referred to hereinafter.

Referring to FIG. 10, a refresh section includes an initialization period t1, a sampling period t2, a programming period t3, and an emission section t4. The refresh section may be set to about 1 horizontal period (1 H). In some exemplary embodiments, the emission section t4 may not be included in the 1 horizontal period (1 H). During the refresh section, data are written on pixels aligned on a horizontal line in a pixel array. Specifically, during the refresh section, the threshold voltage of the driving TFT DT in the pixel circuit 800 is sampled and the data voltage Vdata is compensated by the threshold voltage. Thus, the data voltage Vdata is compensated and written on a pixel in order to determine the amount of current in the organic light emitting diode regardless of the threshold voltage. FIG. 10 illustrates that each of the initialization period t1, the sampling period t2, the programming period t3, and the emission section t4 is maintained for the same duration time. However, a duration time for each of the initialization period t1, the sampling period t2, the programming period t3, and the emission section t4 may be changed in various ways according to an exemplary embodiment.

Firstly, when the initialization period t1 starts, the first scan signal SCAN1 and the second scan signal SCAN2 rise to a high state. At the same time, the emission control signal EM falls to a low state. Thus, during the initialization period t1, the first switching TFT T1 and the second switching TFT T2 are turned on and the third switching TFT T3 is turned off. Therefore, the reference voltage Vref is supplied to the first node N1 through the data line by the first switching TFT T1. Also, the initialization voltage Vinit is supplied to the second node N2 through the Vinit line by the second switching TFT T2. That is, since the initialization voltage Vinit is supplied to the second node N2 as the source node of the driving TFT DT, the data voltage Vdata written on the organic light emitting diode is initialized.

During the sampling period t2, the first scan signal SCAN1 is maintained in a high state and the second scan signal SCAN2 is maintained in a low state. The emission control signal EM rises when the sampling period t2 starts, and then remains in a high state during the sampling period t2. Thus, during the sampling period t2, the first switching TFT T1 and the third switching TFT T3 are turned on and the second switching TFT T2 is turned off. Therefore, the reference voltage Vref is supplied to the first node N1 through the turned-on first switching TFT T1 and the high-potential voltage VDD is supplied to the drain node of the driving TFT DT through the turned-on third switching TFT T3. That is, during the sampling period t2, a voltage of the first node N1 is maintained at the reference voltage Vref and a voltage of the second node N2 is increased by a current (hereinafter, referred to "Ids") between the drain and the source of the driving TFT DT. In this case, a voltage (hereinafter, referred to as "Vgs") between the gate and the source of the driving TFT DT is sampled as a threshold voltage of the driving TFT DT according to the source-follower method. The sampled threshold voltage of the driving TFT DT is stored in the first capacitor C1. Thus, during the sampling period t2, a voltage of the first node N1 is equal to the reference voltage Vref and a voltage of the second node N2 is equal to Vref−Vth.

During the programming period t3, the first scan signal SCAN1 is maintained in a high state and the second scan signal SCAN2 is maintained in a low state. The emission control signal EM falls when the programming period t3 starts, and then remains in a low state during the programming period t3. Thus, during the programming period t3, only the first switching TFT T1 is turned on and the second switching TFT T2 and the third switching TFT T3 are turned off. Therefore, the data voltage Vdata is supplied to the first node N1 through the turned-on first switching TFT T1 and the drain node and the source node of the driving TFT DT are floated.

During the programming period t3, the data voltage Vdata is supplied to the first node N1. Thus, a voltage variation in the first node N1 is distributed between the first capacitor C1 and the second capacitor C2. A voltage of the second node N2 is set to a voltage value as a result of voltage distribution. Specifically, a voltage variation in the first node N1 is Vdata−Vref and a voltage variation in the second node N2 during the programming period t3 is C1/(C1+C2)*(Vdata−Vref) due to voltage distribution between the first capacitor C1 and the second capacitor C2 connected in series to each other. That is, a voltage of the second node N2 becomes equal to the sum of Vref−Vth determined in the sampling period t2 and C1/(C1+C2)*(Vdata−Vref) as the voltage variation in the second node N2 during the programming period t3. In other words, the voltage of the second node N2 in the programming period t3 is equal to (Vref−Vth)+C1/(C1+C2)*(Vdata−Vref) and Vgs of the driving TFT DT is programmed to be (1−C1/(C1+C2))*(Vdata−Vref)+Vth.

During the emission section t4, the first scan signal SCAN1 is maintained in a low state and the second scan signal SCAN2 is also maintained in a low state. The emission control signal EM rises when the emission section t4 starts, and then remains in a high state during the emission section t4. Thus, during the emission section t4, the first switching TFT T1 and the second switching TFT T2 are turned off and the third switching TFT T3 is turned on. Therefore, the high-potential voltage VDD is supplied to the drain node of the driving TFT DT through the turned-on third switching TFT T3 and a condition of Vds>Vgs>Vth is satisfied. Thus, a current flows to the organic light emitting diode through the driving TFT DT. Specifically, during the emission period t4, a current (hereinafter, referred to as "Ioled") flowing in the organic light emitting diode is adjusted by Vgs of the driving TFT DT and the organic light emitting diode emits light due to Ioled. As such, Ioled flowing in the organic light emitting diode during the emission section t4 can be represented by the following Equation 1.

$$Ioled = \frac{k}{2}[(1-C') \times (Vdata - Vref)]^2 \quad \text{[Equation 1]}$$

Herein, k is a proportional constant reflecting various factors of the pixel circuit 800 and C' is equal to C1/(C1+C2). According to Equation 1, since Vth is eliminated from Equation 1, the current Ioled flowing in the organic light emitting diode is not affected by the threshold voltage of the driving TFT DT.

In a low-speed driving mode, the emission section t4 needs to be maintained until the next frame. However, after the organic light emitting diode starts emitting light due to a parasitic capacitance in the pixel circuit 800 or a voltage change in the pixel, Ioled is gradually decreased, and, thus, the luminance of the organic light emitting display device is decreased. Further, a low luminance can be recognized, so that a flicker phenomenon may occur. Otherwise, after the emission control signal EM is applied in the emission section t4, an increase rate of Ioled is decreased due to a parasitic capacitance in the pixel circuit 800 or a voltage change in the pixel. Thus, there is a delay in emission by the organic light emitting diode with a sufficient luminance. Accordingly, a low luminance can be recognized, so that a flicker phenomenon may occur.

Various examples of the present disclosure for reducing such a flicker phenomenon will be suggested below.

Example 1—TFT-Added Structure

Figure 11:
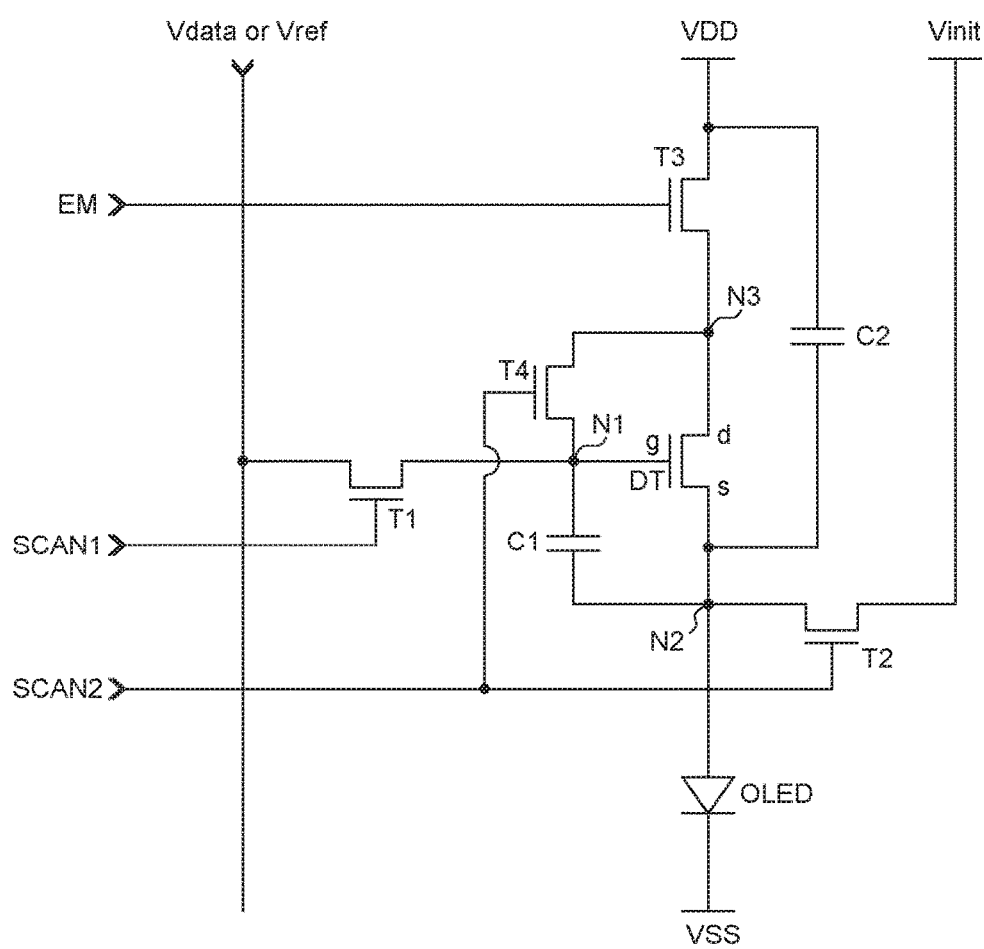
FIG. 11 is a circuit diagram showing a pixel circuit in an OLED device according to still another exemplary embodiment of the present disclosure.
Figure 12:
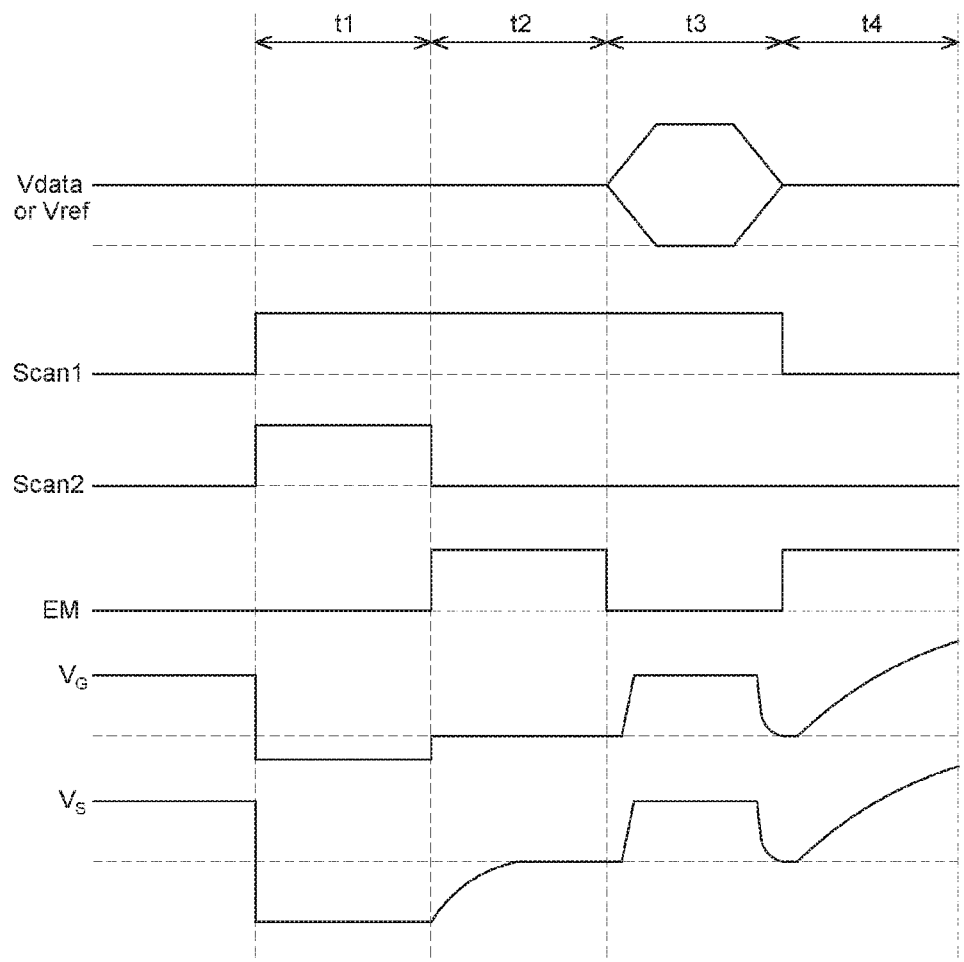
FIG. 12 is a waveform diagram showing a signal input into the pixel circuit illustrated in FIG. 11 and a resultant output signal.

FIG. 11 is a circuit diagram showing a pixel circuit 1000 in an OLED device according to still another exemplary embodiment of the present disclosure. FIG. 12 is a waveform diagram showing a signal input into the pixel circuit 1000 illustrated in FIG. 11 and a resultant output signal. A signal input into a pixel circuit 1000 illustrated in FIG. 12 is substantially the same as the signal input into the pixel circuit 800 illustrated in FIG. 9. Therefore, a redundant explanation thereof will be omitted herein. The pixel circuit 1000 illustrated in FIG. 11 is substantially the same as the pixel circuit 800 illustrated in FIG. 8 except that a fourth switching TFT T4 is further provided. Therefore, a redundant explanation thereof will be omitted herein.

Referring to FIG. 11, the pixel circuit 1000 includes the driving TFT DT, four switching TFTs, and two capacitors.

The fourth switching TFT T4 includes a gate node connected to the SCAN2 line, a drain node connected to a third node N3 as the source node of the third switching TFT T3, and a source node connected to the first node N1 as the gate node of the driving TFT DT. Specifically, the gate node of the fourth switching TFT T4 is connected to the SCAN2 line, and, thus, the fourth switching TFT T4 is turned on or off in response to the second scan signal SCAN2. Thus, when the fourth switching TFT T4 is turned on in response to the second scan signal SCAN2, the first node N1 and the third node N3 are connected to each other. Thus, a voltage of the first node N1 and a voltage of the third node N3 become identical to each other. That is, if the first scan signal SCAN1 is in a high state while the second scan signal SCAN2 is in a high state, the reference voltage Vref is supplied to the first node N1. Therefore, the voltage of the third node N3 becomes equal to the reference voltage Vref as the voltage of the first node N1.

Further, a parasitic capacitor is present between the drain node and the source node of the fourth switching TFT T4. Thus, if the third switching TFT T3 is turned on in response to the emission control signal EM, the high-potential voltage VDD is supplied to the third node N3 and the voltage of the third node N3 is coupled by the parasitic capacitor of the fourth switching TFT T4. Therefore, a voltage of the gate node of the driving TFT DT as the first node N1 may be increased. Further, an off-current in the driving TFT DT may be reduced by the parasitic capacitor of the fourth switching TFT T4.

Therefore, when the organic light emitting diode starts emitting light, the voltage of the gate node of the driving TFT DT may be increased and the off-current may be suppressed by the parasitic capacitor of the fourth switching TFT T4. Accordingly, the voltage of the gate node of the driving TFT DT increased by the fourth switching TFT T4 may increase Vgs of the driving TFT DT and suppress a decrease in Ioled in the horizontal holding section.

Referring to FIG. 12, when the initialization period t1 starts, the first scan signal SCAN1 and the second scan signal SCAN2 rise to a high state. At the same time, the emission control signal EM falls to a low state. Thus, during the initialization period t1, the first switching TFT T1, the second switching TFT T2, and the fourth switching TFT T4 are turned on and the third switching TFT T3 is turned off. When the fourth switching TFT T4 is turned on, the first node N1 and the third node N3 are connected to each other. Thus, a voltage of the first node N1 and a voltage of the third node N3 become identical to each other.

Therefore, during the initialization period t1, Vg as the voltage of the first node N1 is equal to the reference voltage Vref. Also, the initialization voltage Vinit is supplied to the second node N2 by the second switching TFT T2 through the Vinit line. That is, since the initialization voltage Vinit is supplied to the second node N2 as the source node of the driving TFT DT, the data voltage Vdata written on the organic light emitting diode is initialized.

During the sampling period t2, the first scan signal SCAN1 is maintained in a high state and the second scan signal SCAN2 is maintained in a low state. The emission control signal EM rises when the sampling period t2 starts, and then remains in a high state during the sampling period t2. Thus, during the sampling period t2, the first switching TFT T1 and the third switching TFT T3 are turned on and the second switching TFT T2 and the fourth switching TFT T4 are turned off.

Therefore, the reference voltage Vref is supplied to the first node N1 through the turned-on first switching TFT T1 and the high-potential voltage VDD is supplied to the drain node of the driving TFT DT through the turned-on third switching TFT T3. The parasitic capacitor of the fourth switching TFT T4 couples the third node N3 to the first node N1. That is, during the sampling period t2, the high-potential voltage VDD is supplied to the third node N3 and the voltage of the first node N1 becomes higher than the reference voltage Vref due to coupling by the parasitic capacitor. A voltage of the second node N2 is increased by Ids of the driving TFT DT. According to the source-follower method, Vgs of the driving TFT DT is sampled as a threshold voltage of the driving TFT DT and the sampled threshold voltage of the driving TFT DT is stored in the first capacitor C1.

During the programming period t3, the first scan signal SCAN1 is maintained in a high state and the second scan signal SCAN2 is maintained in a low state. The emission control signal EM falls when the programming period t3 starts, and then remains in a low state during the programming period t3. Thus, during the programming period t3, only the first switching TFT T1 is turned on and the second switching TFT T2, the third switching TFT T3, and the fourth switching TFT T4 are turned off. Therefore, the data voltage Vdata is supplied to the first node N1 through the turned-on first switching TFT T1 and the drain node and the source node of the driving TFT DT are floated.

Therefore, during the programming period t3, Vgs of the driving TFT DT is programmed on the basis of the threshold voltage of the driving TFT DT sampled in the sampling period t2 and the voltage increased by the fourth switching TFT T4.

During the emission section t4, the first scan signal SCAN1 is maintained in a low state and the second scan signal SCAN2 is also maintained in a low state. The emission control signal EM rises when the emission section t4 starts, and then remains in a high state. Thus, during the emission section t4, the first switching TFT T1, the second switching TFT T2, and the fourth switching TFT T4 are turned off and the third switching TFT T3 is turned on.

Therefore, the high-potential voltage VDD may be supplied to the drain node of the driving TFT DT through the turned-on third switching TFT T3. Also, a voltage of the gate node of the driving TFT DT may be increased due to coupling by the parasitic capacitor of the fourth switching TFT T4. During the horizontal holding section in which the organic light emitting diode continuously emits light, Ioled is rarely decreased due to the parasitic capacitor of the fourth switching TFT T4.

Specifically, the parasitic capacitor of the fourth switching TFT T4 may increase the voltage of the gate node of the driving TFT DT by coupling when the emission of light starts. Then, in the horizontal holding section, the parasitic capacitor of the fourth switching TFT T4 may suppress a decrease in the voltage of the gate node of the driving TFT DT by coupling. Accordingly, Ioled is rarely decreased.

Figure 13:
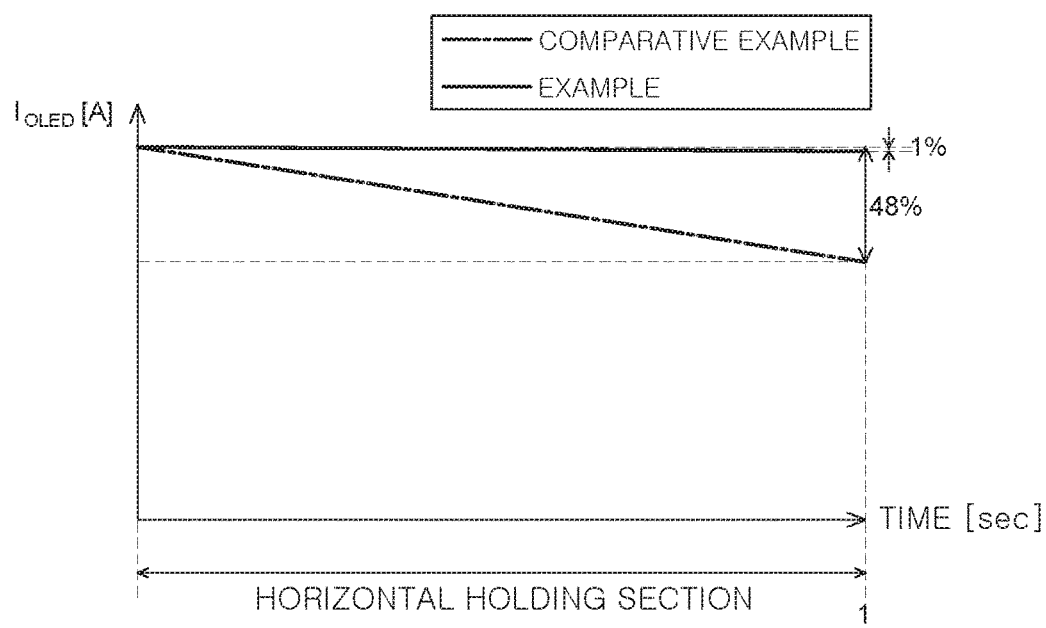
FIG. 13 is a graph of OLED current ($I_{OLED}$) in a Comparative Example and in an Example embodiment of the present disclosure.

FIG. 13 is an Ioled graph provided to show the effects of Comparative Example and Example. Herein, Comparative Example is Ioled in the OLED device according to the prior art illustrated in FIG. 9, and Example is Ioled in the OLED device according to still another exemplary embodiment of the present disclosure illustrated in FIG. 11.

Referring to FIG. 13, in Comparative Example, after the emission of light starts, Ioled was decreased by about 48% during the horizontal holding section. In Example, after the emission of light starts, Ioled was decreased by only about 1% during the horizontal holding section.

That is, according to Example of the present disclosure, the parasitic capacitor of the fourth switching TFT T4 increases the voltage of the first node N1 by coupling during the initialization period t1 and suppresses a decrease in Vgs of the driving TFT DT by coupling during the emission section t4 and the horizontal holding section. Thus, Ioled can be maintained almost constantly during the horizontal holding section.

Particularly, if a switching TFT in a pixel is configured as an oxide semiconductor TFT and a driving TFT DT in the pixel is configured as an LTPS TFT, Vgs of the driving TFT DT is increased. Thus, a delay in Ioled may be decreased and a response speed of the driving TFT DT may be improved.

Further, according to Example of the present disclosure, a delay in Ioled can be decreased and a flicker phenomenon which may occur due to a luminance decrease during the horizontal holding section caused by an off-current of the driving TFT DT can be remarkably reduced.

Example 2—Capacitor-Added Structure

Figure 14:
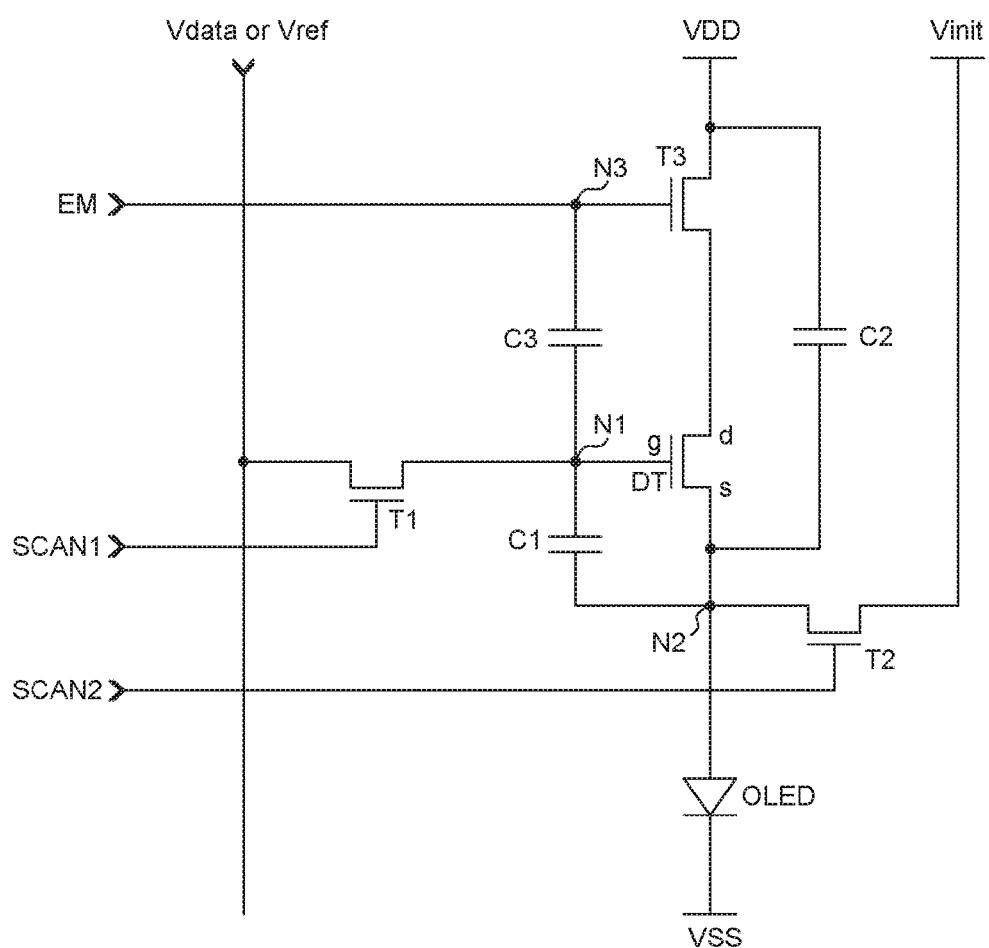
FIG. 14 is a circuit diagram showing a pixel driving circuit in an OLED device according to an exemplary embodiment of the present disclosure.

Hereinafter, a pixel of the present disclosure will be described in detail. FIG. 14 is a driving circuit diagram of the pixel illustrated in FIG. 1.

Referring to FIG. 14, a pixel 1 includes an organic light emitting diode OLED and a pixel driving circuit 200 including four transistors and three capacitors and configured to drive the organic light emitting diode OLED.

Specifically, the pixel driving circuit 200 includes a driving transistor DT, first to third switching transistor T1 to T3, and first to third capacitors C1 to C3.

In this case, the first capacitor C1 and the second capacitor C2 may be storage capacitors and the third capacitor C3 may be a coupling capacitor.

The driving TFT DT includes a gate node as a first node N1 connected to the first switching TFT T1, a source node as a second node N2 connected to the second switching TFT T2, and a drain node connected to the third switching TFT T3.

Specifically, the gate node of the driving TFT DT is electrically connected to the data line DL that supplies the data voltage Vdata or the reference voltage Vref. Thus, the gate node of the driving TFT DT is connected to a source node of the first switching TFT T1 so as to receive the data voltage Vdata or the reference voltage Vref. The drain node of the driving TFT DT is electrically connected to the high-potential voltage VDD line. Thus, the drain node of the driving TFT DT is connected to a source node of the third switching TFT T3 so as to receive the high-potential voltage VDD. The source node of the driving TFT DT is electrically connected to the organic light emitting diode. Specifically, the source node of the driving TFT DT is connected to an anode of the organic light emitting diode and a source node of the second switching TFT T2.

Therefore, if the third switching TFT T3 is turned on and the driving TFT DT is also turned on in response to the emission control signal EM, the driving TFT DT controls the intensity of a current Ioled flowing in the organic light emitting diode on the basis of a voltage applied to the gate node and the source node. Thus, the driving TFT DT can control the luminance of the organic light emitting diode.

The first switching TFT T1 includes a gate node connected to the SCAN1 line, a drain node connected to the data line, and the source node as the first node N1 connected to the driving TFT DT. Specifically, the gate node of the first switching TFT T1 is connected to the SCAN1 line, and, thus, the first switching TFT T1 is turned on or off in response to the first scan signal SCAN1. The drain node of the first switching TFT T1 is connected to the data line DL so as to transfer the data voltage Vdata or the reference voltage Vref to the gate node of the driving TFT DT. The source node of the first switching TFT T1 is directly connected to the gate node of the driving TFT DT.

Therefore, if the first scan signal SCAN1 is in a high state, the first switching TFT T1 is turned on so as to supply the data voltage Vdata or the reference voltage Vref to the gate node of the driving TFT DT.

The second switching TFT T2 includes a gate node connected to the SCAN2 line, a drain node connected to the Vinit line, and the source node connected to the source node of the driving TFT DT. Specifically, the second switching TFT T2 is turned on when the second scan signal SCAN2 is in a high state. The second switching TFT T2 supplies the initialization voltage Vinit to the second node N2. The source node of the second switching TFT T2 is directly connected to the source node of the driving TFT DT and the second node N2 connected to the anode of the organic light emitting diode.

Therefore, if the second scan signal SCAN2 is in a high state, the second switching TFT T2 is turned on so as to supply the initialization voltage Vinit to the second node N2. Thus, the data voltage Vdata written on the organic light emitting diode is initialized.

The third switching TFT T3 includes a gate node as a third node N3 connected to the EM line, a drain node connected to the VDD line, and the source node connected to the drain node of the driving TFT DT. Specifically, the gate node of the third switching TFT T3 is connected to the EM line, so that the third switching TFT T3 is turned on when the emission control signal EM is in a high state. The drain node of the third switching TFT T3 is directly connected to the VDD line.

Therefore, if the emission control signal EM is in a high state, the third switching TFT T3 is turned on so as to supply the high-potential voltage VDD to the drain node of the driving TFT DT. Thus, the driving TFT DT adjusts the amount of current in the organic light emitting diode depending on the data voltage Vdata.

The first capacitor C1 and the second capacitor C2 may be storage capacitors configured to store a voltage to be applied to the gate node or the source node of the driving TFT DT. Also, the two storage capacitors are connected in series at the source node of the driving TFT DT.

The first capacitor C1 is electrically connected to the first node N1 as the gate node of the driving TFT DT and the second node N2 as the source node of the driving TFT DT. Thus, the first capacitor C1 stores a voltage difference between a voltage to be applied to the first node N1 and a voltage to be applied to the second node N2. The second capacitor C2 is electrically connected to the second node N2 as the source node of the driving TFT DT and the VDD line. Further, the second capacitor C2 is connected in series to the first capacitor C1 at the second node N2. Thus, the second capacitor C2 stores a voltage according to voltage distribution with the first capacitor C1.

For example, the first capacitor C1 stores and samples a threshold voltage Vth of the driving TFT DT as the voltage difference between the first node N1 and the second node N2. Further, if the data voltage Vdata is applied, the first capacitor C1 stores and programs a voltage determined by voltage distribution with the second capacitor C2. That is, the first capacitor C1 and the second capacitor C2 sample the threshold voltage Vth of the driving TFT DT according to the source-follower method. If potentials of the first node N1 and the second node N2 are changed, the first capacitor C1 and the second capacitor C2 store the potentials of the first node N1 and the second node N2, respectively, by voltage distribution.

Referring to FIG. 14, the third capacitor C3 of the pixel driving circuit 200 according to an exemplary embodiment of the present disclosure is disposed between the third node N3 as the gate node of the third switching TFT T3 and the first node N1 as the gate node of the driving TFT DT. That is, the third capacitor C3 is disposed between the EM line and the first node N1 as being electrically connected thereto.

Therefore, if the emission control signal EM is in a high state, the first node N1 is charged with a rapidly increased and bootstrapped voltage by capacitive coupling between the first capacitor C1 and the third capacitor C3. That is, if the emission control signal EM is in a high state, the emission control signal EM is supplied to the third node N3 and a voltage of the first node N1 is rapidly increased due to capacitive coupling between the first and third capacitors C1 and C3. Further, since the voltage of the first node N1, i.e., a voltage of the gate node of the driving TFT DT, is increased, a voltage of the source node of the driving TFT DT is also increased.

Therefore, if the third switching TFT T3 is turned on in response to the emission control signal EM, the high-potential voltage VDD is applied to the drain node of the driving TFT DT. Further, a gate voltage of the driving TFT DT is rapidly increased due to capacitive coupling between the first capacitor C1 and the third capacitor C3. Then, the second node N2 as the source node of the driving TFT DT is also rapidly increased.

As a result, in the pixel driving circuit 200 in which the current Ioled flowing in the organic light emitting diode is adjusted by Vgs of the driving TFT DT and the organic light emitting diode emits light due to Ioled, the intensity of Ioled can also be more rapidly increased due to capacitive coupling between the first capacitor C1 and the third capacitor C3.

Therefore, a rapid increase in a voltage applied to the gate node of the driving TFT DT caused by capacitive coupling can remarkably decrease a delay in time of increasing the current Ioled flowing in the organic light emitting diode.

In addition, capacitive coupling which occurs when two capacitors are connected in series to each other will be described.

The capacitors tend to maintain a voltage difference between both ends and are mutually involved in their values by capacitive coupling. This is closely related to the conservation law of electrical charge. The conservation law of electrical charge is represented by the following Equation 2.

$$Q=CV, Q1=Q2$$

$$C1(\Delta V1-\Delta V2)=C2(\Delta V2-\Delta V3), \Delta V3=0$$

$$C1(\Delta V1-\Delta V2)=C2\Delta V2$$

$$\therefore \Delta V2=C1/C1+C2*\Delta V1 \qquad \text{[Equation 2]}$$

Herein, Q1 and Q2 are charges and C1 and C2 are capacitors. According to Equation 2, a voltage variation of one end of a capacitor shown in Equation 2 is related to a voltage value changed by capacitive coupling.

Referring to FIG. 14, in the pixel driving circuit 200 of the present disclosure, a voltage of the gate node of the driving TFT DT is affected by the first capacitor C1 and the third capacitor C3 and thus increased due to capacitive coupling. Such a phenomenon is referred to as bootstrapping.

Figure 15:
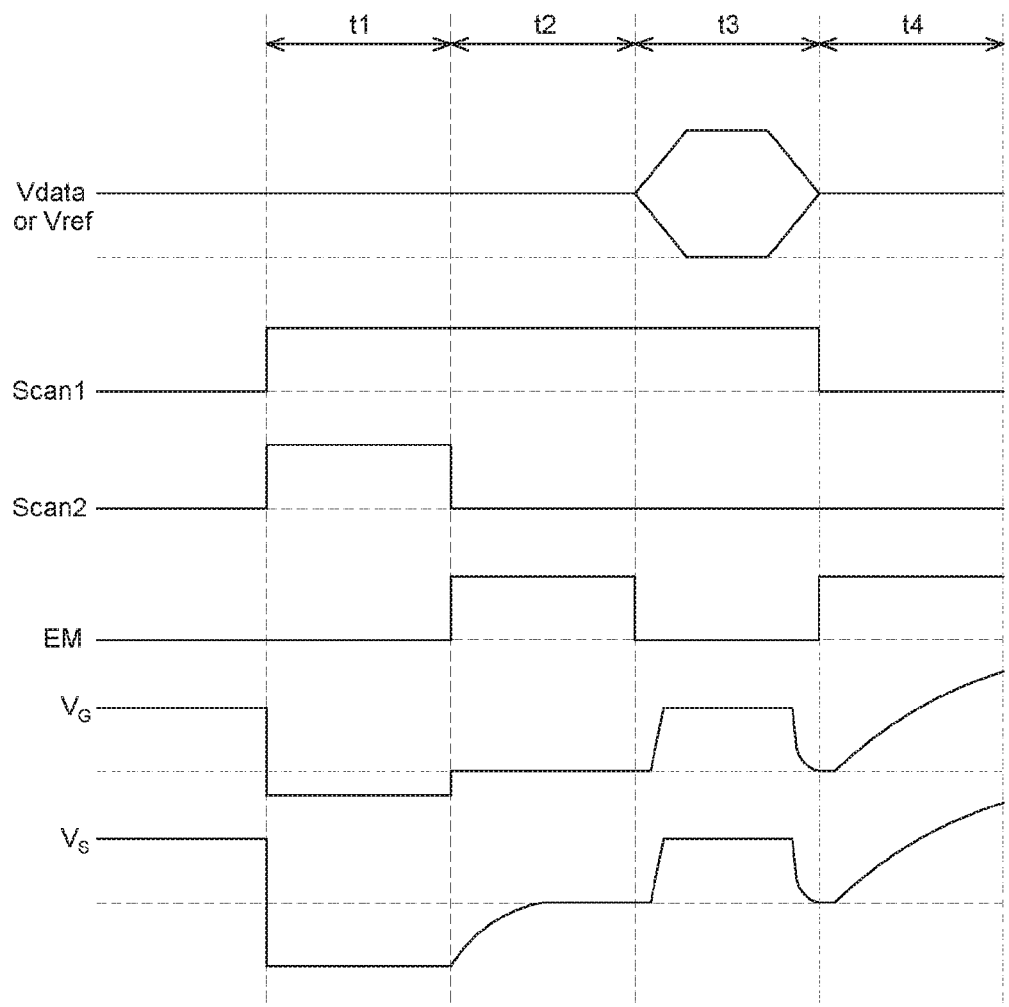
FIG. 15 is a waveform diagram showing a signal input into the pixel driving circuit illustrated in FIG. 14 and a resultant output signal.

FIG. 15 is a waveform diagram showing a signal input into the pixel driving circuit 200 illustrated in FIG. 14 and a resultant output signal. For convenience in explanation, FIG. 14 and FIG. 15 will be referred to hereinafter.

Referring to FIG. 15, a refresh section includes an initialization period t1, a sampling period t2, a programming period t3, and an emission section t4. The refresh section may be set to about 1 horizontal period (1 H). In some exemplary embodiments, the emission section t4 may not be included in the 1 horizontal period (1 H). During the refresh section, data are written on pixels aligned on a horizontal line in a pixel array. Specifically, during the refresh section, the threshold voltage Vth of the driving TFT DT in the pixel driving circuit 200 is sampled and the data voltage Vdata is compensated by the threshold voltage Vth. Thus, the data voltage Vdata is compensated and written on a pixel in order to determine the amount of current in the organic light emitting diode regardless of the threshold voltage Vth.

FIG. 15 illustrates that each of the initialization period t1, the sampling period t2, the programming period t3, and the emission section t4 is maintained for the same duration time. However, a duration time for each of the initialization period t1, the sampling period t2, the programming period t3, and the emission section t4 may be changed in various ways according to an exemplary embodiment.

Firstly, when the initialization period t1 starts, the first scan signal SCAN1 and the second scan signal SCAN2 rise to a high state. At the same time, the emission control signal EM falls to a low state. Thus, during the initialization period t1, the first switching TFT T1 and the second switching TFT T2 are turned on and the third switching TFT T3 is turned off.

Therefore, the reference voltage Vref is supplied to the first node N1 through the data line by the first switching TFT T1. During the initialization period t1, the first node N1 is charged with the reference voltage Vref. Also, the initialization voltage Vinit is supplied to the second node N2 through the Vinit line by the second switching TFT T2. That is, since the initialization voltage Vinit is supplied to the second node N2 as the source node of the driving TFT DT, the data voltage Vdata written on the organic light emitting diode is initialized to the initialization voltage Vinit.

During the sampling period t2, the first scan signal SCAN1 is maintained in a high state and the second scan signal SCAN2 is maintained in a low state. The emission control signal EM rises when the sampling period t2 starts, and then remains in a high state during the sampling period t2. Thus, during the sampling period t2, the first switching TFT T1 and the third switching TFT T3 are turned on and the second switching TFT T2 is turned off.

During the sampling period t2, the reference voltage Vref is continuously supplied to the first node N1 through the turned-on first switching TFT T1 and the high-potential voltage VDD is supplied to the drain node of the driving TFT DT through the turned-on third switching TFT T3.

Then, the emission control signal EM in a high state is supplied during the sampling period t2. Thus, the third switching TFT T3 is turned on and the voltage of the first node N1 is rapidly increased due to capacitive coupling between the first capacitor C1 and the third capacitor C3. Also, since the first scan signal SCAN1 is maintained in a high state, the first switching TFT T1 is turned on and the reference voltage Vref is continuously supplied to the first node N1. That is, during the sampling period t2, the voltage of the first node N1 is rapidly increased by as much as a voltage coupled to the reference voltage Vref.

That is, during the sampling period t2, the voltage of the first node N1 is not maintained at the reference voltage Vref and becomes higher than the reference voltage Vref due to coupling by the third capacitor C3. Thus, during the sampling period t2, the first node N1 may be applied with a voltage (hereinafter, referred to as "V'ref") higher than the reference voltage Vref and the second node N2 may be applied with a voltage equal to V'ref minus the threshold voltage Vth. The voltage of the second node N2 is rapidly increased by a current (hereinafter, referred to "Ids") between the drain and the source of the driving TFT DT.

In this case, a voltage (hereinafter, referred to as "Vgs") between the gate and the source of the driving TFT DT is sampled as the threshold voltage Vth of the driving TFT DT according to the source-follower method. The sampled threshold voltage Vth of the driving TFT DT is stored in the first capacitor C1.

During the programming period t3, the first scan signal SCAN1 is maintained in a high state and the second scan signal SCAN2 is maintained in a low state. The emission control signal EM falls when the programming period t3 starts, and then remains in a low state during the programming period t3. Thus, during the programming period t3, only the first switching TFT T1 is turned on and the second switching TFT T2 and the third switching TFT T3 are turned off. Therefore, the data voltage Vdata is supplied to the first node N1 through the turned-on first switching TFT T1 and the drain node and the source node of the driving TFT DT are floated.

Therefore, during the programming period t3, Vgs of the driving TFT DT is programmed on the basis of the threshold voltage Vth of the driving TFT DT sampled in the sampling period t2 and the voltage V'ref increased due to coupling by the third capacitor C3.

Also, during the programming period t3, the data voltage Vdata is supplied to the first node N1. Thus, the voltage of the first node N1 is changed. Then, the voltage of the second node rapidly increased during the sampling period t2 may be changed to a voltage reflecting the data voltage Vdata supplied to the first node N1 due to electrical connection to the first capacitor C1 and the second capacitor C2.

Therefore, during the programming period t3, the data voltage Vdata is supplied to the first node N1. Thus, a voltage variation in the first node N1 is distributed between the first capacitor C1 and the second capacitor C2. The voltage of the second node N2 is set to a voltage value as a result of voltage distribution. Specifically, a voltage variation in the first node N1 is Vdata−V'ref and a voltage variation in the second node N2 during the programming period t3 is C1/(C1+C2)*(Vdata−V'ref) due to voltage distribution between the first capacitor C1 and the second capacitor C2 connected in series to each other. That is, a voltage of the second node N2 becomes equal to the sum of V'ref−Vth determined in the sampling period t2 and C1/(C1+C2)*(Vdata−V'ref) as the voltage variation in the second node N2 during the programming period t3. In other words, the voltage of the second node N2 in the programming period t3 is equal to (V'ref−Vth)+C1/(C1+C2)*(Vdata−V'ref) and Vgs of the driving TFT DT is programmed to be (1−C1/(C1+C2))*(Vdata−V'ref)+Vth.

For example, if V'ref is increased to be similar to the data voltage Vdata by coupling of the third capacitor C3, Vgs of the driving TFT DT is constantly maintained at the sampled voltage.

During the emission section t4, the current Ioled flowing in the organic light emitting diode is adjusted by Vgs of the driving TFT DT and the organic light emitting diode emits light due to Ioled. As such, Ioled flowing in the organic light emitting diode during the emission section t4 can be represented by the following Equation 3.

$$Ioled = \frac{k}{2}[(1 - C') \times (Vdata - Vref)]^2 \qquad \text{[Equation 3]}$$

Herein, k is a proportional constant reflecting various factors of the pixel circuit 200 and C' is equal to C1/(C1+C2). According to Equation 3, since the threshold voltage Vth is eliminated from Equation 3, the current Ioled flowing in the organic light emitting diode is not affected by the threshold voltage Vth of the driving TFT DT.

According to the prior art, after the emission control signal EM is applied in the emission section t4, an increase rate of Ioled is decreased due to a parasitic capacitance in the pixel circuit 200 or a voltage change in the pixel. Thus, there is a delay in emission by the organic light emitting diode with a sufficient luminance. Accordingly, a low luminance can be recognized, so that a flicker phenomenon may occur.

Referring to FIG. 15, during the emission section t4, the first scan signal SCAN1 is maintained in a low state and the second scan signal SCAN2 is also maintained in a low state. The emission control signal EM rises when the emission section t4 starts, and then remains in a high state. Thus, during the emission section t4, the first switching TFT T1 and the second switching TFT T2 are turned off and the third switching TFT T3 is turned on.

Therefore, if the emission control signal EM is in a high state, the third switching TFT T3 is turned on so as to supply the high-potential voltage VDD to the drain node of the driving TFT DT. Thus, the driving TFT DT adjusts the amount of current in the organic light emitting diode depending on the data voltage Vdata.

During the emission section t4, the high-potential voltage VDD is supplied to the drain node of the driving TFT DT through the turned-on third switching TFT T3. The voltages of the first node N1, i.e., the gate node of the driving TFT DT, and the second node N2, i.e., the source node, rapidly increased due to coupling by the third capacitor C3 function to minimize a delay of the current Ioled flowing in the organic light emitting diode.

Figure 16:
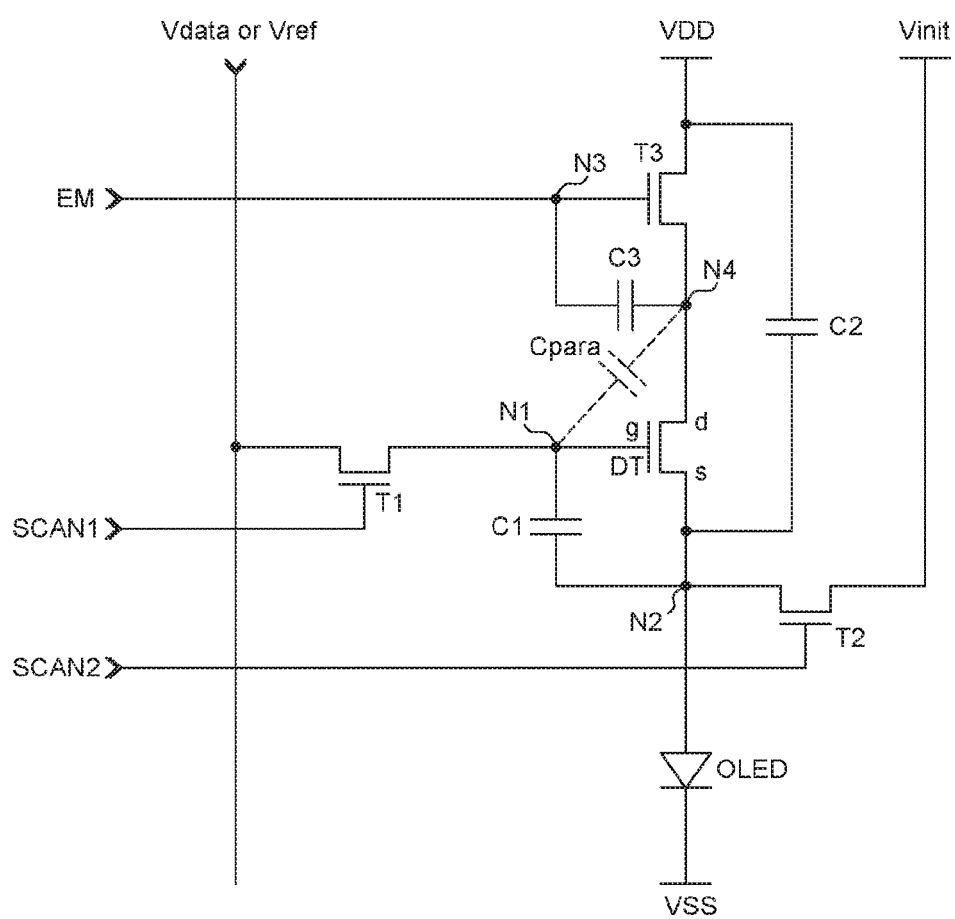
FIG. 16 is a circuit diagram showing a pixel driving circuit in an OLED device according to still another exemplary embodiment of the present disclosure.

FIG. 16 is a circuit diagram showing a pixel driving circuit in an OLED device according to another exemplary embodiment of the present disclosure.

A pixel circuit illustrated in FIG. 16 is substantially the same as the pixel driving circuit illustrated in FIG. 14 except the alignment of a third capacitor. Therefore, a redundant explanation thereof will be omitted herein. That is, a pixel driving circuit 300 of the present disclosure is substantially the same as the pixel driving circuit 200 illustrated in FIG. 14 except a node connected to the third capacitor C3 which is a coupling capacitor. Therefore, a redundant explanation thereof will be omitted herein.

Referring to FIG. 16, the pixel driving circuit 300 includes a driving TFT DT, three switching TFT, a first capacitor C1, a second capacitor C2, and a third capacitor C3. In this case, the first capacitor C1 and the second capacitor C2 may be storage capacitors and the third capacitor C3 may be a coupling capacitor.

The third capacitor C3 is disposed between the third node N3 as the gate node of the third switching TFT T3 and a fourth node N4 as the drain node of the driving TFT DT. That is, the third capacitor C3 is disposed between the EM line and the fourth node N4 as being electrically connected thereto.

Therefore, if the emission control signal EM is in a high state, a constant voltage is charged between the third node N3 and the fourth node N4 by the third capacitor C3. That is, the emission control signal EM is supplied to the third node N3 and a voltage of the fourth node N4 is rapidly increased due to capacitive coupling between the first capacitor C1 and the third capacitor C3.

Further, a parasitic capacitor Cpara may be present between the first node N1 as the gate node of the driving TFT DT and the fourth node N4 as the drain node of the driving TFT DT. The parasitic capacitor Cpara of the driving TFT DT and the first capacitor C1 may form a second capacitive coupling subsequent to the capacitive coupling between the first capacitor C1 and the third capacitor C3.

Therefore, if the emission control signal EM is in a high state, the voltage of the fourth node N4 is increased due to coupling by the third capacitor C3 and the voltage of the first node N1 is increased due to coupling by the parasitic capacitor Cpara of the driving TFT DT. Therefore, the voltage of the first node N1 is rapidly increased due to double coupling by the third capacitor C3 and the parasitic capacitor Cpara of the driving TFT DT.

In other words, if the emission control signal EM is in a high state, the voltage of the fourth node N4 is increased. Therefore, the voltage of the first node N1 as the gate node of the driving TFT DT is also rapidly increased due to the second capacitive coupling.

Therefore, if the third switching TFT T3 is turned on in response to the emission control signal EM, the high-potential voltage VDD is applied to the drain node of the driving TFT DT. Further, a gate voltage of the driving TFT DT is rapidly increased due to double capacitive coupling by the third capacitor C3 and the parasitic capacitor Cpara.

Also, a voltage of the second node N2 may be equal to the voltage of the first node N1 minus the threshold voltage Vth. The voltage of the second node N2 is rapidly increased by a current (hereinafter, referred to "Ids") between the drain and the source of the driving TFT DT.

As a result, in the pixel driving circuit 300 in which the current Ioled flowing in the organic light emitting diode is adjusted by Vgs of the driving TFT DT and the organic light emitting diode emits light due to Ioled, the intensity of Ioled can also be more rapidly increased due to double capacitive coupling by the third capacitor C3 and the parasitic capacitor Cpara.

Also, a rapid increase in a voltage applied to the gate node of the driving TFT DT caused by capacitive coupling can remarkably decrease a delay in time of increasing Ioled.

Figure 17:
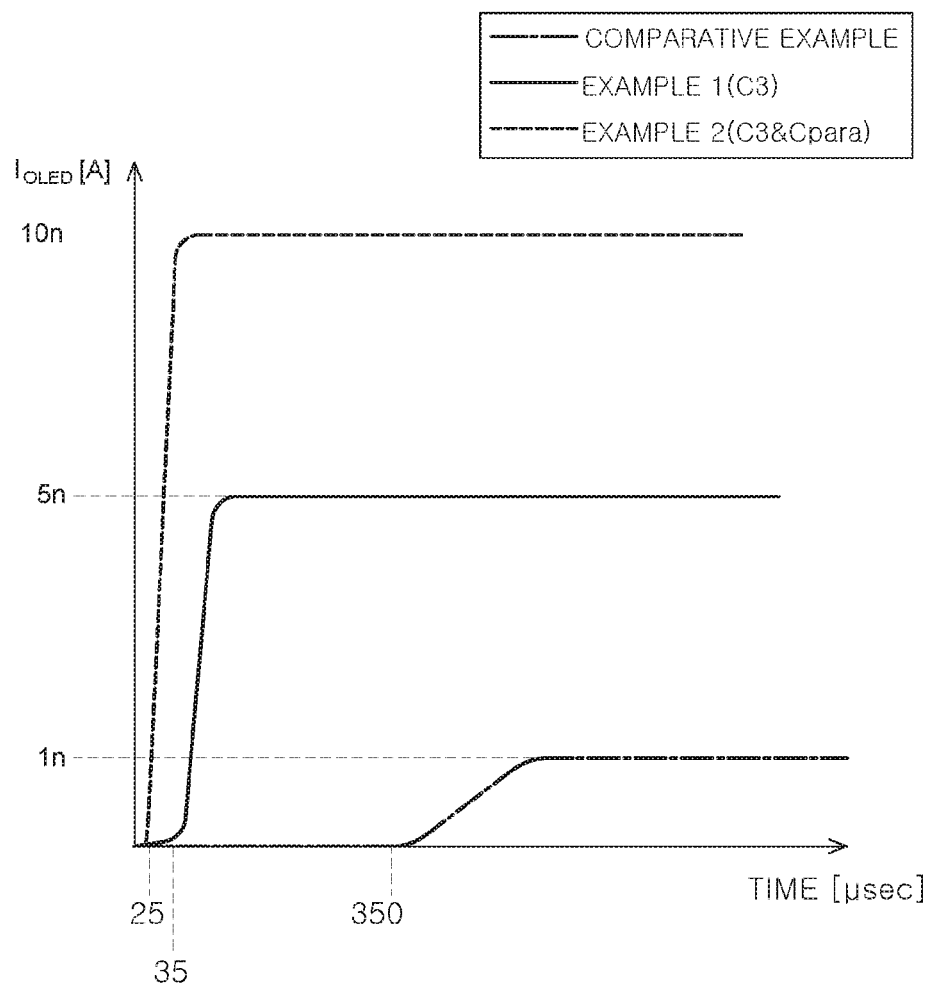
FIG. 17 is a graph of OLED current ($I_{OLED}$) in a Comparative Example and in Example embodiments of the present disclosure.

FIG. 17 is a graph showing a change in Ioled in an OLED device according to another exemplary embodiment of the present disclosure. Also, FIG. 17 illustrates Comparative Example and Examples to show a change in Ioled.

Herein, Example 1 is Ioled in the OLED device according to an exemplary embodiment of the present disclosure illustrated in FIG. 14, and Example 2 is Ioled in the OLED device according to another exemplary embodiment of the present disclosure illustrated in FIG. 16.

Herein, FIG. 17 is a graph showing a change in Ioled according to time. In FIG. 17, the time starts from when the emission control signal EM is supplied to the pixel driving circuit.

Referring to FIG. 17, in Comparative Example, a delay of Ioled is about 350 μs and the maximum intensity of Ioled is about 1 nA. Meanwhile, in Example 1, a delay of Ioled is about 35 μs and the maximum intensity of Ioled is about 5 nA and in Example 2, a delay of Ioled is about 25 μs and the maximum intensity of Ioled is about 10 nA.

That is, even if the maximum value of Ioled is different in each Example, a delay of Ioled in each of Examples of the present disclosure can be remarkably decreased as compared with Comparative Example.

According to Examples of the present disclosure, the voltage of the gate node of the driving TFT DT is rapidly increased by the third capacitor C3 and the parasitic capacitor Cpara which are coupling capacitors. Thus, when the emission section t4 starts, Ioled is rapidly increased, so that a delay of Ioled can be remarkably decreased.

III. [Internal Compensation] Increase in Vgs of Driving TFT DT-6T1C Structure

Prior Art—Comparative Example

Figure 18:
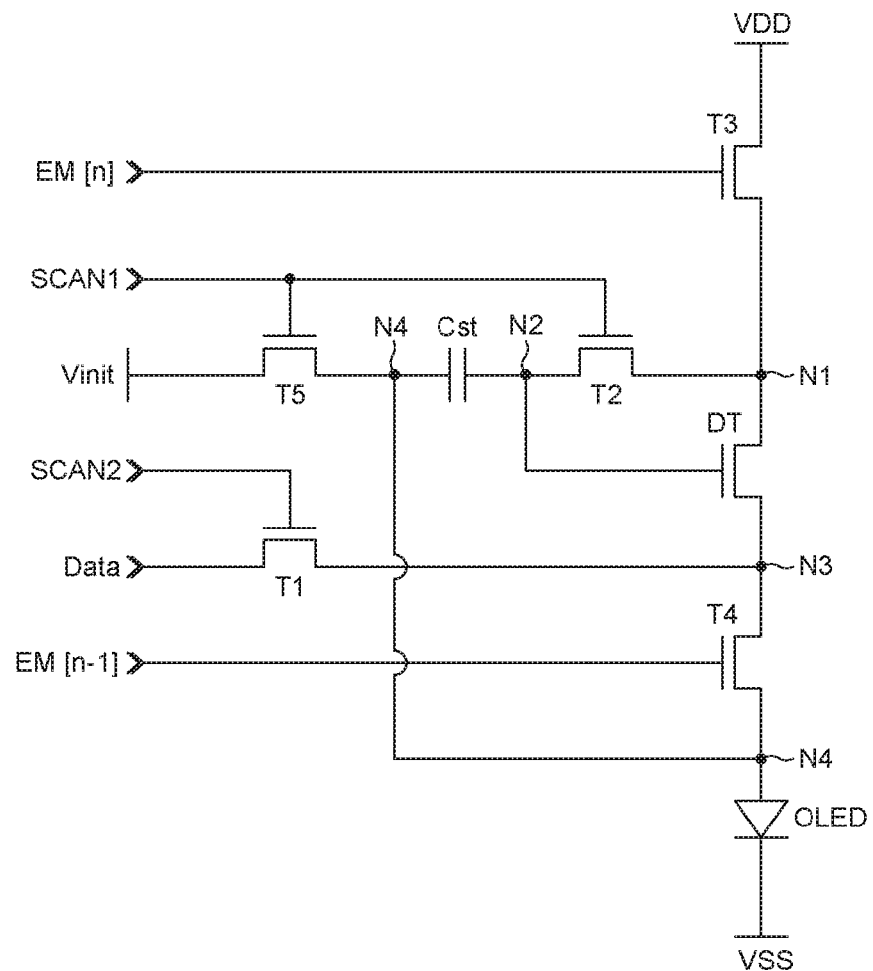
FIG. 18 is a circuit diagram showing a pixel circuit in an OLED device according to the prior art.

FIG. 18 is a circuit diagram showing a pixel circuit in an OLED device according to the prior art.

Referring to FIG. 18, a pixel circuit 1700 includes a driving TFT DT, five switching TFTs, and a capacitor.

The driving TFT DT includes a gate node connected to a node of the capacitor, a drain node electrically connected to a second switching TFT T2 and a third switching TFT T3, and a source node electrically connected to a first switching TFT T1 and a fourth switching TFT T4.

Specifically, the gate node of the driving TFT DT stores the high-potential voltage VDD when the second switching TFT T2 and the third switching TFT T3 are turned on. If the data voltage Vdata is supplied in a state where the second switching TFT T2 is turned on, the data voltage Vdata is written on the gate node of the driving TFT DT according to the source-follower method. The driving TFT DT supplies a driving current to an organic light emitting diode in response to an emission control signal and controls the luminance of the organic light emitting diode depending on the amount of current.

The first switching TFT T1 includes a gate node connected to the SCAN2 line, a drain node connected to the data line, and a source node connected to the source node of the driving TFT DT. Thus, the first switching TFT T1 is turned on or off in response to the second scan signal SCAN2. That is, if the second scan signal SCAN2 in a high state is supplied to the gate node of the first switching TFT T1, the data voltage Vdata is supplied from the drain node of the first switching TFT T1 to a third node N3 as the source node of the driving TFT DT.

The second switching TFT T2 includes a gate node connected to the SCAN1 line, a drain node connected to a drain node of the driving TFT DT and a drain node of the third switching TFT T3, and the source node connected to the gate node of the driving TFT DT. Thus, the second switching TFT T2 may be turned on in response to the first scan signal SCAN1. That is, if the first scan signal SCAN1 is in a high state, the second switching TFT T2 is turned on. Thus, the second switching TFT T2 transfers a voltage in a first node N1 as the drain node of the driving TFT DT to a second node N2 as the gate node of the driving TFT DT.

Therefore, if the first scan signal SCAN1 is in a high state, the second switching TFT T2 supplies the high-potential voltage VDD of the first node N1 or the sampled voltage of the driving TFT DT to the second node N2. Thus, the data voltage Vdata written on the organic light emitting diode is initialized, or the data voltage Vdata is written and the threshold voltage of the driving TFT DT is sampled.

The third switching TFT T3 includes a gate node connected to an nth emission control signal (EM[n]) line, a drain node connected to the VDD line, and the source node connected to the drain node of the driving TFT DT. Thus, the third switching TFT T3 may be turned on in response to an nth emission control signal EM[n]. That is, if the nth emission control signal EM[n] is in a high state, the third switching TFT T3 is turned on. Thus, the third switching TFT T3 supplies the high-potential voltage VDD from the source node to the first node N1 as the drain node of the driving TFT DT.

Therefore, if the emission control signal is in a high state, the third switching TFT T3 supplies the high-potential voltage VDD to the drain node of the driving TFT DT. Thus, the driving TFT DT adjusts the amount of current in the organic light emitting diode depending on the data voltage Vdata.

The fourth switching TFT T4 includes a gate node connected to an n−1th emission control signal (EM[n−1]) line, a drain node connected to the source node of the driving TFT DT, and a source node connected to the organic light emitting diode. Thus, the fourth switching TFT T4 may be turned on in response to an n−1th emission control signal EM[n−1]. That is, if the n−1th emission control signal EM[n−1] is in a high state, the fourth switching TFT T4 is turned on. Thus, the third node N3 as the source node of the driving TFT DT and a fourth node N4 as the source node of the fourth switching TFT T4 are connected to each other.

Therefore, if the fourth switching TFT T4 is turned on in response to the n−1th emission control signal EM[n−1], a voltage of the third node N3 is supplied to the fourth node N4. If the fourth switching TFT T4, the driving TFT DT, and the third switching TFT T3 are turned on, the high-potential voltage VDD is supplied to the driving TFT DT and a driving current is supplied to the organic light emitting diode. Thus, the organic light emitting diode emits light.

The fifth switching TFT T5 includes a gate node connected to the SCAN1 line, a source node connected to the Vinit line, and a drain node connected to a fourth node N4 as an anode of the organic light emitting diode. Thus, the fifth switching TFT T5 may be turned on in response to the first scan signal SCAN1. That is, if the first scan signal SCAN1 is in a high state, the fifth switching TFT T5 is turned on. Thus, the initialization voltage Vinit is supplied to the fourth node N4.

Therefore, if the fifth switching TFT T5 is turned on in response to the first scan signal SCAN1, the initialization voltage Vinit is supplied to the fourth node N4, so that the data voltage Vdata written on the organic light emitting diode is initialized.

The capacitor may be a storage capacitor Cst that stores a voltage to be applied to the gate node of the driving TFT DT. In this case, the capacitor is disposed between the second node N2 as the gate node of the driving TFT DT and a fourth node N4 electrically connected to the anode of the organic light emitting diode. That is, the capacitor is electrically connected to the second node N2 and the fourth node N4 and configured to store a voltage difference between a voltage to be applied to the gate node of the driving TFT DT and a voltage to be applied to the anode of the organic light emitting diode.

Figure 19:
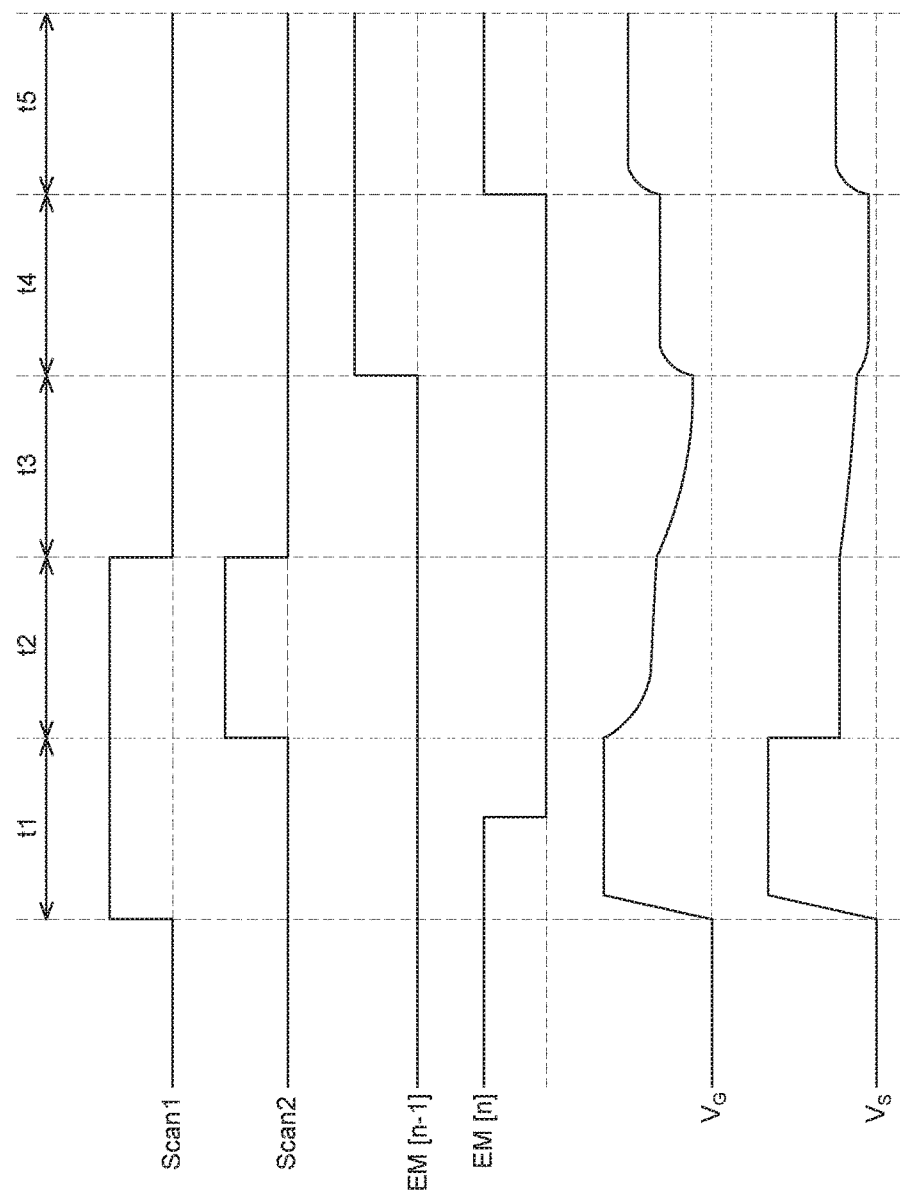
FIG. 19 is a waveform diagram showing a signal input into the pixel circuit illustrated in FIG. 18 and a resultant output signal.

FIG. 19 is a waveform diagram showing a signal input into the pixel circuit 1700 illustrated in FIG. 18 and a resultant output signal. For convenience in explanation, FIG. 18 will be referred to hereinafter.

Referring to FIG. 19, the data voltage Vdata is written on each of pixels passing through an initialization period t1, a sampling period t2, a voltage holding section t3, a connection section t4, and an emission section t5 and disposed on a horizontal line. Then, each of the pixels emits light. FIG. 19 illustrates that each of the initialization period t1, the sampling period t2, the voltage holding section t3, the connection section t4, and the emission section t5 is maintained for the same duration time. However, a duration time for each of the initialization period t1, the sampling period t2, the voltage holding section t3, the connection section t4, and the emission section t5 may be changed in various ways according to an exemplary embodiment. For example, the voltage holding section t3 may be shorter than the other sections.

Firstly, when the initialization period t1 starts, the first scan signal SCAN1 rises to a high state and the second scan signal SCAN2 is maintained in a low state. At the same time, the n−1th emission control signal EM[n−1] is maintained in a low state and the nth emission control signal EM[n] falls from a high state to a low state during the initialization period t1. Thus, during the initialization period t1, the second switching TFT T2 and the fifth switching TFT T5 are turned on and the first switching TFT T1 and the fourth switching TFT T4 are turned off. Further, the third switching TFT T3 is turned on only in a section in which the nth emission control signal EM[n] is in a high state. When the nth emission control signal EM[n] falls to a low state, the third switching TFT T3 is turned off. Therefore, the initialization voltage Vinit is supplied to the fourth node N4 through the fifth switching TFT T5. While the third switching TFT T3 is turned on, the high-potential voltage VDD is supplied to the second node N2 through the second switching TFT T2. That is, since the initialization voltage Vinit is supplied to the fourth node N4 as the source node of the driving TFT DT, the data voltage Vdata written on the organic light emitting diode is initialized and the high-potential voltage VDD is supplied to the gate node of the driving TFT DT.

During the sampling period t2, the first scan signal SCAN1 is maintained in a high state and the second scan signal SCAN2 rises to a high state. During the sampling period t2, all of the nth emission control signal EM[n] and the n−1th emission control signal EM[n−1] are maintained in a low state. Thus, during the sampling period t2, the first switching TFT T1, the second switching TFT T2, and the fifth switching TFT T5 are turned on and the third switching TFT T3 and the fourth switching TFT T4 are turned off. Therefore, the data voltage Vdata is supplied to the third node N3 through the first switching TFT T1. Further, when the second switching TFT T2 is turned on, the first node N1 as the drain node of the driving TFT DT and the second node N2 as the gate node of the driving TFT DT are connected to each other. Thus, Vgs of the driving TFT DT is sampled as Vth of the driving TFT DT according to the source-follower method. Also, when the fifth switching TFT T5 is turned on, the initialization voltage Vinit is supplied to the fourth node N4 and the capacitor stores Vdata+Vth−Vinit. Thus, during the sampling period t2, a voltage of the first node N1 and the second node N2 is equal to Vdata+Vth, a voltage of the third node N3 is equal to Vdata, and a voltage of the fourth node N4 is equal to the initialization voltage Vinit.

When the voltage holding section t3 starts, the first scan signal SCAN1 and the second scan signal SCAN2 fall to a low state and the nth emission control signal EM[n] and the n−1th emission control signal EM[n−1] are maintained in a low state. Thus, during the voltage holding section t3, all of the switching TFTs are turned off. Therefore, the first node N1, the second node N2, the third node N3, and the fourth node N4 sampled or written in the sampling period t2 are floated, and a voltage of each node remains unchanged.

Particularly, in an OLED device in which a switching TFT in a pixel is configured as an oxide semiconductor TFT and a driving TFT DT in the pixel is configured as an LTPS TFT, the pixel circuit 1700 is more suitable for low-speed drive. Specifically, the switching TFT configured as the oxide semiconductor TFT has a very low off-current and thus is suitable to hold the respective voltages of the first node N1, the second node N2, the third node N3, and the fourth node N4 during the voltage holding section t3. That is, in the switching TFT configured as the oxide semiconductor TFT, an off-current is very low during the voltage holding section t3, so that the respective voltages of the first node N1, the second node N2, the third node N3, and the fourth node N4 are not decreased but held. Accordingly, if the switching TFT in the pixel is configured as an oxide semiconductor TFT and the driving TFT DT in the pixel is configured as an LTPS TFT, an off-current is low even in low-speed drive. Therefore, during the voltage holding section t3, the voltages of the respective nodes may be held with almost no decrease.

During the connection section t4, the first scan signal SCAN1 and the second scan signal SCAN2 are maintained in a low state. When the connection section t4 starts, the n−1th emission control signal EM[n−1] rises to a high state and the nth emission control signal EM[n] is maintained in a low state. Thus, during the connection section t4, only the fourth switching TFT T4 is turned on and all of the first switching TFT T1, the second switching TFT T2, the third switching TFT T3, and the fifth switching TFT T5 are turned off. Therefore, since the fourth switching TFT T4 is turned on, the third node N3 and the fourth node N4 are connected to each other and Vdata held in the third node N3 is supplied to the fourth node N4.

During the emission section t5, the first scan signal SCAN1 and the second scan signal SCAN2 are maintained in a low state. The nth emission control signal EM[n] rises to a high state when the emission section t5 starts, and then remains in a high state during the emission section t5. Further, the n−1th emission control signal EM[n−1] is also maintained in a high state. Thus, during the emission section t5, the first switching TFT T1, the second switching TFT T2, and the fifth switching TFT T5 are turned off and the third switching TFT T3 and the fourth switching TFT T4 are turned on. Further, the driving TFT DT is also turned on by Vdata+Vth which has been stored in the second node N2 until the connection section t4. Thus, a path for a driving current to flow is formed from the VDD line to the organic light emitting diode. That is, during the emission section t5, Ioled flows to the organic light emitting diode through the turned-on driving TFT DT, third switching TFT T3 and fourth switching TFT T4. Also, in the emission section t5, Vgs of the driving TFT DT is expressed as a voltage including Vdata and Vth of the driving TFT DT is compensated. Therefore, the intensity of Ioled is adjusted by the intensity of Vdata of the driving TFT DT and the organic light emitting diode emits light due to Ioled.

In a low-speed driving mode, the emission section t5 needs to be maintained until the next frame. However, after the organic light emitting diode starts emitting light due to a parasitic capacitance in the pixel circuit 1700 or a voltage change in the pixel, Ioled is gradually decreased, and, thus, the luminance of the organic light emitting diode is decreased. Further, a low luminance can be recognized, so that a flicker phenomenon may occur. Otherwise, after the emission control signal is applied in the emission section t5, an increase rate of Ioled is decreased due to a parasitic capacitance in the pixel circuit 1700 or a voltage change in the pixel. Thus, there is a delay in emission by the organic light emitting diode with a sufficient luminance. Accordingly, a low luminance can be recognized, so that a flicker phenomenon may occur.

Various examples of the present disclosure for reducing such a flicker phenomenon will be suggested below.

Example—Addition of Coupling Capacitor

Figure 20:
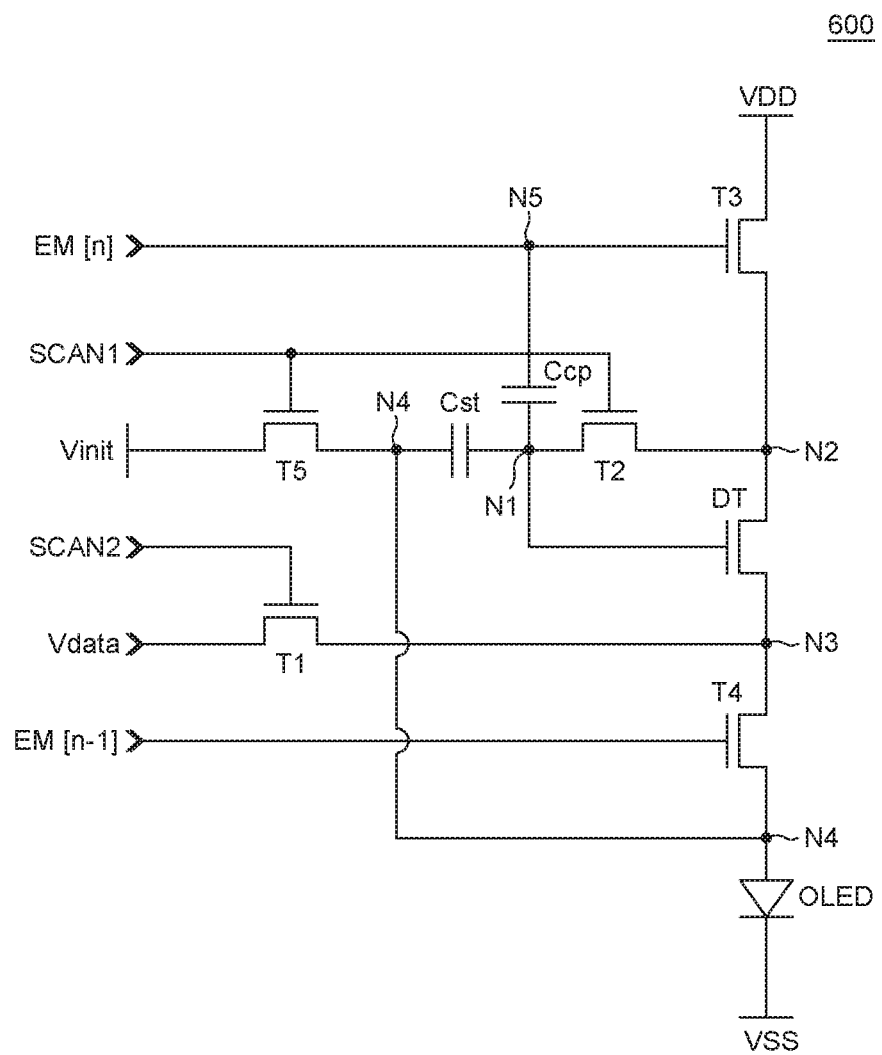
FIG. 20 is a circuit diagram showing a pixel driving circuit in an OLED device according to an exemplary embodiment of the present disclosure.

FIG. 20 is a driving circuit diagram of the pixel illustrated in FIG. 1.

Referring to FIG. 20, a pixel P includes the organic light emitting diode OLED and the pixel driving circuit 600 including six transistors and two capacitors and configured to drive the organic light emitting diode OLED.

Specifically, the pixel driving circuit 600 includes a driving transistor DT, first to fifth switching transistors T1 to T5, and first and second capacitors.

In this case, the first capacitor may be a storage capacitor Cst and the second capacitor may be a coupling capacitor Ccp.

The driving TFT DT includes a gate node as a first node N1 connected to a node of the storage capacitor Cst, a drain node as a second node N2 electrically connected to the second switching TFT T2 and the third switching TFT T3, and a source node as a third node N3 electrically connected to the first switching TFT T1 and the fourth switching TFT T4.

Specifically, the drain node of the driving TFT DT is electrically connected to the VDD line. Thus, if the second switching TFT T2 and the third switching TFT T3 are turned on, the gate node of the driving TFT DT stores the high-potential voltage VDD.

Further, while the first switching TFT T1 is turned on, the data voltage Vdata is supplied to the source node of the driving TFT DT. When the second switching TFT T2 is turned on, the data voltage Vdata in the source node of the driving TFT DT is supplied to the first node N1 as the gate node of the driving TFT DT.

Specifically, if the second switching TFT T2 is turned on, a second node N2 as the drain node of the driving TFT DT and the first node N1 as the gate node of the driving TFT DT are connected to each other. Thus, Vgs of the driving TFT DT becomes Vth of the driving TFT DT according to a diode connection method. Therefore, if the first switching TFT T1 is turned on and the data voltage Vdata is supplied to the source node of the driving TFT DT, Vdata+Vth is supplied to the gate node of the driving TFT DT.

The source node of the driving TFT DT is electrically connected to the organic light emitting diode. Specifically, the source node of the driving TFT DT is connected to a drain node of the fourth switching TFT T4 as a fourth node N4. Further, the source node of the driving TFT DT is electrically connected to the anode of the organic light emitting diode and connected to a source node of the first switching TFT T1.

If the fourth switching TFT T4, the driving TFT DT, and the third switching TFT T3 are turned on, the driving TFT DT supplies the high-potential voltage VDD and the driving current to the organic light emitting diode. Thus, the organic light emitting diode emits light.

The first switching TFT T1 includes a gate node connected to the SCAN2 line, a drain node connected to the data line, a source node connected to the third node N3 as the source node of the driving TFT DT. Thus, the first switching TFT T1 is turned on or off in response to the second scan signal SCAN2. That is, if the second scan signal SCAN2 in a high state is supplied to the gate node of the first switching TFT T1, the data voltage Vdata is supplied from the drain node of the first switching TFT T1 to the third node N3 as the source node of the driving TFT DT.

The second switching TFT T2 includes a gate node connected to the SCAN1 line, a drain node connected to the drain node of the driving TFT DT and a source node of the third switching TFT T3, and a source node connected to the gate node of the driving TFT DT. Further, the source node of the second switching TFT T2 is connected to a node of the storage capacitor Cst and a node of the coupling capacitor Ccp.

Thus, the second switching TFT T2 is turned on or off in response to the first scan signal SCAN1. That is, if the first scan signal SCAN1 is in a high state, the second switching TFT T2 is turned on. Thus, the second switching TFT T2 transfers a voltage of the second node N2 as the drain node of the driving TFT DT to a voltage of the first node N1 as the gate node of the driving TFT DT.

Further, the nth emission control signal EM[n] is supplied as a DC voltage to a gate node of the third switching TFT T3 until it falls from a high state to a low state. Thus, the coupling capacitor Ccp is not affected by the DC voltage. Thus, while the second switching TFT T2 is turned on, only the high-potential voltage VDD is supplied to the first node N1 as the gate node of the driving TFT DT.

The third switching TFT T3 includes the gate node connected to the EM[n] line, a drain node connected to the VDD line, and a source node connected to the drain node of the driving TFT DT. Further, the gate node of the third switching TFT T3 may become a fifth node N5 connected to a node of the coupling capacitor Ccp.

Thus, the third switching TFT T3 may be turned on or off in response to the nth emission control signal EM[n]. That is, if the nth emission control signal EM[n] is in a high state, the third switching TFT T3 is turned on to supply the high-potential voltage VDD from the source node to the second node N2 as the drain node of the driving TFT DT.

Further, if the nth emission control signal EM[n] is in a high state during the emission section, a voltage of the first node N1 as the gate node of the driving TFT DT is rapidly increased due to coupling between the coupling capacitor Ccp and the storage capacitor Cst connected to a fifth node N5 as the gate node of the third switching TFT T3.

If the emission control signal EM is in a high state, the third switching TFT T3 supplies the high-potential voltage VDD to the drain node of the driving TFT DT and a current (hereinafter, referred to "Ids") between the drain and the source of the driving TFT DT flows in the organic light emitting diode. Therefore, the driving TFT Dt adjusts the amount of current in the organic light emitting diode depending on the data voltage Vdata.

The fourth switching TFT T4 includes a gate node connected to the EM[n−1] line, a drain node connected to the source node of the driving TFT DT, and a source node electrically connected to the organic light emitting diode. Thus, the fourth switching TFT T4 may be turned on in response to the n−1th emission control signal EM[n−1].

That is, if the n−1th emission control signal EM[n−1] is in a high state during the connection section, the fourth switching TFT T4 is turned on. Thus, the third node N3 as the source node of the driving TFT DT and the fourth node N4 as the source node of the fourth switching TFT T4 are connected to each other.

Therefore, if the fourth switching TFT T4 is turned on in response to the n−1th emission control signal EM[n−1], the voltage Vdata of the third node N3 is supplied to the fourth node N4.

If the fourth switching TFT T4, the driving TFT DT, and the third switching TFT T3 are turned on during the emission section, the high-potential voltage VDD is supplied to the driving TFT DT and the driving current Ids is supplied to the organic light emitting diode. Thus, the organic light emitting diode emits light.

The fifth switching TFT T5 includes a gate node connected to the SCAN1 line, a source node connected to the Vinit line, and a drain node connected to a node of the storage capacitor Cst and a fourth node N4 as the anode of the organic light emitting diode.

Thus, the fifth switching TFT T5 may be turned on in response to the first scan signal SCAN1. That is, if the first scan signal SCAN1 is in a high state, the fifth switching TFT T5 is turned on to supply the initialization voltage Vinit to the fourth node N4. Therefore, if the fifth switching TFT T5 is turned on in response to the first scan signal SCAN1, the initialization voltage Vinit is supplied to the fourth node N4. Thus, the data voltage Vdata written on the organic light emitting diode is initialized.

Also, the initialization voltage Vinit and the voltage supplied to the first node N1 may be related to a voltage to be stored in the storage capacitor Cst.

Specifically, the storage capacitor Cst stores a voltage to be applied to the gate node of the driving TFT DT. In this case, a node of the storage capacitor Cst is connected to the first node N1 as the gate node of the driving TFT DT and the other node is connected to the fourth node N4 electrically connected to the anode of the organic light emitting diode.

That is, the storage capacitor Cst is electrically connected to the first node N1 and the fourth node N4 and stores a voltage difference between a voltage to be applied to the gate node of the driving TFT DT and a voltage to be applied to the anode of the organic light emitting diode.

Specifically, a node of the storage capacitor Cst is applied with Vdata+Vth when the first switching TFT T1 and the second switching TFT T2 are turned on. The other node of the storage capacitor Cst is applied with the initialization voltage Vinit when the fifth switching TFT T5 is turned on. Therefore, a voltage charged in the storage capacitor Cst is equal to Vdata+Vth−Vinit.

Referring to FIG. 20, the coupling capacitor Ccp of the pixel driving circuit 600 according to an exemplary embodiment of the present disclosure is disposed between the first node N1 as the gate node of the driving TFT DT and the fifth node N5 as the gate node of the third switching TFT T3. That is, the coupling capacitor Ccp is disposed between the EM[n] line and the first node N1 so as to be electrically connected thereto.

Therefore, if the nth emission control signal EM[n] is in a high state during the emission section, a rapidly increased and bootstrapped voltage is supplied to the first node N1 due to capacitive coupling between the storage capacitor Cst and the coupling capacitor Ccp. That is, if the nth emission control signal EM[n] is supplied to the gate electrode of the third switching TFT T3, a voltage of the first node N1 is coupled by the coupling capacitor Ccp then rapidly increased in association with the nth emission control signal EM[n]. Further, as the voltage of the gate node of the driving TFT DT, i.e., the voltage of the first node N1, is increased, the voltage of the source node of the driving TFT DT is also increased.

Therefore, during the emission section, if the third switching TFT T3 is turned on by the nth emission control signal EM[n], the high-potential voltage VDD is applied to the second node N2 as the drain node of the driving TFT DT. Further, a rapidly increased voltage is applied to the first node N1 as the gate node of the driving TFT DT due to capacitive coupling between the storage capacitor Cst and the coupling capacitor Ccp. Further, during the emission section, when the second switching TFT T2 is turned off, the high-potential voltage VDD in the second node N2 is not supplied to the first node N1 as the gate node of the driving TFT DT. As a result, only a voltage bootstrapped by the coupling capacitor Ccp is supplied to the first node N1 as the gate node of the driving TFT DT.

Then, the voltage of the third node N3 as the source node of the driving TFT DT is also rapidly increased. For example, if the voltage of the first node N1 is increased to be higher than Vdata+Vth due to coupling by the coupling capacitor Ccp, Vgs of the driving TFT DT is constantly maintained as a sampled voltage. Thus, the voltage of the third node N3 as the source node of the driving TFT DT is also greatly increased. As a result, in the pixel driving circuit 600 in which the current Ioled flowing in the organic light emitting diode can be adjusted by Vgs of the driving TFT DT and the organic light emitting diode emits light due to Ioled, the intensity of Ioled can be more rapidly increased due to capacitive coupling between the storage capacitor Cst and the coupling capacitor Ccp.

Therefore, a rapid increase in a voltage applied to the gate node of the driving TFT DT caused by capacitive coupling can remarkably decrease a delay in time of increasing the current Ioled flowing in the organic light emitting diode.

In addition, capacitive coupling which occurs when two capacitors are connected in series to each other will be described.

The capacitors tend to maintain a voltage difference between both ends and are mutually involved in their values by capacitive coupling. This is closely related to the conservation law of electrical charge. The conservation law of electrical charge is represented by the following Equation 4.

$$Q=CV, Q1=Q2$$

$$C1(\Delta V1-\Delta V2)=C2(\Delta V2-\Delta V3), \Delta V3=0$$

$$C1(\Delta V1-\Delta V2)=C2\Delta V2$$

$$\therefore \Delta V2=C1/C1+C2*\Delta V1 \quad \text{[Equation 4]}$$

Herein, Q1 and Q2 are charges and C1 and C2 are capacitors. According to Equation 4, a voltage variation of one end of a capacitor shown in Equation 4 is related to a voltage value changed by capacitive coupling.

Referring to FIG. 20, in the pixel driving circuit 600 of the present disclosure, a voltage of the gate node of the driving TFT DT is affected by the storage capacitor Cst and the coupling capacitor Ccp and thus increased due to capacitive coupling. Such a phenomenon is referred to as bootstrapping.

Figure 21:
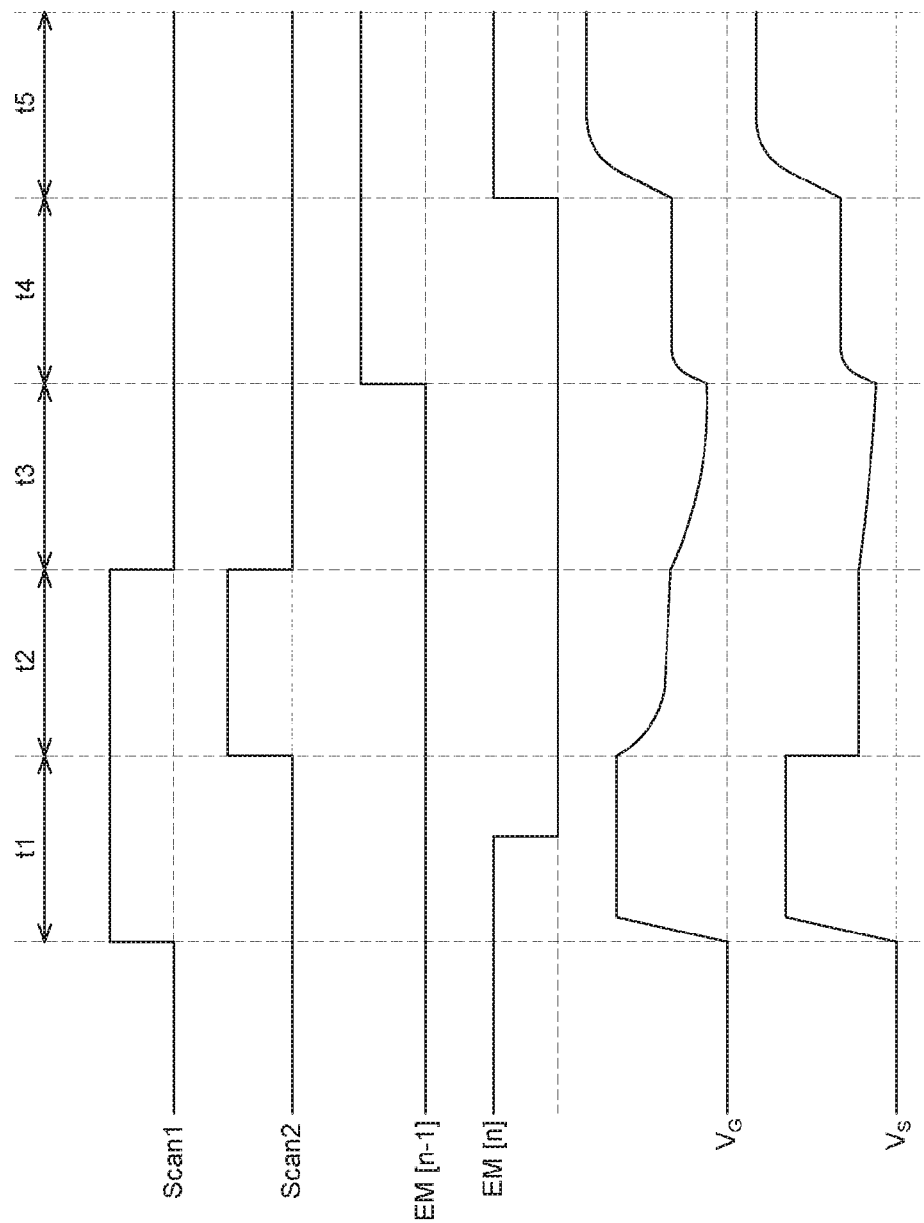
FIG. 21 is a waveform diagram showing a signal input into the pixel driving circuit illustrated in FIG. 20 and a resultant output signal.

FIG. 21 is a waveform diagram showing a signal input into the pixel driving circuit 600 illustrated in FIG. 20 and a resultant output signal. For convenience in explanation, FIG. 20 and FIG. 21 will be referred to hereinafter.

Referring to FIG. 21, a refresh section includes an initialization period t1, a sampling period t2, a voltage holding section t3, a connection section t4, and an emission section t5. The refresh section may be set to about 1 horizontal period (1 H). During the refresh section, data are written on pixels aligned on a horizontal line in a pixel array. Specifically, during the refresh section, the threshold voltage Vth of the driving TFT DT in the pixel driving circuit 600 is sampled and the data voltage Vdata is compensated by the threshold voltage Vth. Thus, the data voltage Vdata is compensated and written on a pixel in order to determine the amount of current in the organic light emitting diode regardless of the threshold voltage Vth.

Referring to FIG. 21, the data voltage Vdata is written on each of pixels passing through the initialization period t1, the sampling period t2, the voltage holding section t3, the connection section t4, and the emission section t5 and disposed on one horizontal line. Then, each of the pixels emits light. FIG. 21 illustrates that each of the initialization period t1, the sampling period t2, the voltage holding section t3, the connection section t4, and the emission section t5 is maintained for the same duration time. However, a duration time for each of the initialization period t1, the sampling period t2, the voltage holding section t3, the connection section t4, and the emission section t5 may be changed in various ways according to an exemplary embodiment. For example, the voltage holding section t3 may be shorter than the other sections.

Firstly, when the initialization period t1 starts, the first scan signal SCAN1 rises to a high state and the second scan signal SCAN2 is maintained in a low state. At the same time, the n−1th emission control signal EM[n−1] is maintained in a low state and the nth emission control signal EM[n] falls from a high state to a low state during the initialization period t1.

Thus, during the initialization period t1, the second switching TFT T2 and the fifth switching TFT T5 are turned on and the first switching TFT T1 and the fourth switching TFT T4 are turned off. Further, the third switching TFT T3 is turned on only in a section in which the nth emission control signal EM[n] is in a high state. When the nth emission control signal EM[n] falls to a low state, the third switching TFT T3 is turned off.

Therefore, the initialization voltage Vinit is supplied to the fourth node N4 through the fifth switching TFT T5. While the third switching TFT T3 is turned on, the high-potential voltage VDD is supplied to the first node N1 through the second switching TFT T2. That is, since the initialization voltage Vinit is supplied to the fourth node N4 as the source node of the driving TFT DT, the data voltage Vdata written on the organic light emitting diode is initialized and the high-potential voltage VDD is supplied to the gate node of the driving TFT DT.

Further, the nth emission control signal EM[n] is supplied as a DC voltage to the gate node of the third switching TFT T3 until it falls from a high state to a low state. Thus, the coupling capacitor Ccp is not affected by the DC voltage. Therefore, only the high-potential voltage VDD is supplied to the first node N1 as the gate node of the driving TFT DT.

During the sampling period t2, the first scan signal SCAN1 is maintained in a high state and the second scan signal SCAN2 rises to a high state. During the sampling period t2, all of the nth emission control signal EM[n] and the n−1th emission control signal EM[n−1] are maintained in a low state.

Thus, during the sampling period t2, the first switching TFT T1, the second switching TFT T2, and the fifth switching TFT T5 are turned on and the third switching TFT T3 and the fourth switching TFT T4 are turned off.

Therefore, the data voltage Vdata is supplied to the third node N3 through the first switching TFT T1. Further, when the third switching TFT T3 is turned off, the supply of the high-potential voltage VDD to the first node N1 is stopped. Then, when the driving TFT DT and the second switching TFT T2 are turned on, the data voltage Vdata supplied to the third node N3 is supplied to the first node N1 connected to a node of the storage capacitor Cst.

Specifically, since the third switching TFT T3 is turned off, a voltage of the first node N1 is decreased from the high-potential voltage VDD to the data voltage Vdata. By scanning such a voltage change, the threshold voltage Vth of the driving TFT DT can be checked. As a result, during the sampling period t2, the threshold voltage Vth of the driving TFT DT can be sampled.

Therefore, when the third switching TFT T3 is turned off and the second switching TFT T2 is turned on, the second node N2 as the drain node of the driving TFT DT and the first node N1 as the gate node of the driving TFT DT are connected to the each other. Thus, Vgs of the driving TFT DT is sampled as Vth of the driving TFT DT.

Also, when the fifth switching TFT T5 is turned on, the initialization voltage Vinit is supplied to the fourth node N4. When the first switching TFT T1 and the second switching TFT T2 are turned on, Vdata+Vth is supplied to the first node N1. As a result, the storage capacitor Cst stores Vdata+Vth−Vinit.

Thus, during the sampling period t2, a voltage of the first node N1 and the second node N2 is equal to Vdata+Vth, a voltage of the third node N3 is equal to Vdata, and a voltage of the fourth node N4 is equal to the initialization voltage Vinit.

When the voltage holding section t3 starts, the first scan signal SCAN1 and the second scan signal SCAN2 fall to a low state and the nth emission control signal EM[n] and the n−1th emission control signal EM[n−1] are maintained in a low state. Thus, during the voltage holding section t3, all of the switching TFTs T1 to T5 are turned off. Therefore, the first to fifth nodes N1 to N5 sampled or written in the sampling period t2 are floated, and a voltage of each node remains unchanged.

Particularly, in an OLED device in which a switching TFT in a pixel is configured as an oxide semiconductor TFT and a driving TFT DT in the pixel is configured as an LTPS TFT, the pixel driving circuit 600 is more suitable for low-speed drive. Specifically, the switching TFT configured as the oxide semiconductor TFT has a very low off-current and thus is suitable to hold the respective voltages of the first to fifth nodes N1 to N5 during the voltage holding section t3. In the switching TFT configured as the oxide semiconductor TFT, an off-current is very low during the voltage holding section t3, so that the respective voltages of the first to fifth nodes N1 to N5 are not decreased but held. Accordingly, if the switching TFT in the pixel P of the present disclosure is configured as an oxide semiconductor TFT and the driving TFT DT in the pixel P is configured as an LTPS TFT, an off-current is low even in low-speed drive. Therefore, during the voltage holding section t3, the voltages of the respective nodes may be held with almost no decrease.

During the connection section t4, the first scan signal SCAN1 and the second scan signal SCAN2 are maintained in a low state. When the connection section t4 starts, the n−1th emission control signal EM[n−1] rises to a high state and the nth emission control signal EM[n] is maintained in a low state. Thus, during the connection section t4, only the fourth switching TFT T4 is turned on and all of the first switching TFT T1, the second switching TFT T2, the third switching TFT T3, and the fifth switching TFT T5 are turned off. Therefore, since the fourth switching TFT T4 is turned on, the third node N3 and the fourth node N4 are electrically connected to each other and Vdata held in the third node N3 is supplied to the fourth node N4.

During the emission section t5, the first scan signal SCAN1 and the second scan signal SCAN2 are maintained in a low state. The nth emission control signal EM[n] rises to a high state when the emission section t5 starts, and then remains in a high state during the emission section t5. Further, the n−1th emission control signal EM[n−1] is also maintained in a high state. Thus, during the emission section t5, the first switching TFT T1, the second switching TFT T2, and the fifth switching TFT T5 are turned off and the third switching TFT T3 and the fourth switching TFT T4 are turned on. Further, the driving TFT DT is also turned on by Vdata+Vth which has been stored in the first node N1 until the connection section t4. Thus, a path for a driving current to flow is formed from the VDD line to the organic light emitting diode. That is, during the emission section t5, Ioled flows to the organic light emitting diode through the turned-on driving TFT DT, third switching TFT T3 and fourth switching TFT T4.

Also, if the nth emission control signal EM[n] is in a high state, a rapidly increased and bootstrapped voltage is supplied to the first node N1 due to capacitive coupling between the storage capacitor Cst and the coupling capacitor Ccp. That is, if the nth emission control signal EM[n] is supplied to the gate electrode of the third switching TFT T3, a voltage of the first node N1 is increased in association with the nth emission control signal EM[n] due to coupling by the coupling capacitor Ccp. The voltage increased due to coupling by the coupling capacitor Ccp is higher than Vdata+Vth stored in the first node N1 during the connection section t4.

Further, during the emission section t5, as the voltage of the gate node of the driving TFT DT, i.e., the voltage of the first node N1, is rapidly increased, the voltage of the source node of the driving TFT DT is also increased.

Also, in the emission section t5, Vgs of the driving TFT DT is expressed as a voltage including Vdata and the threshold voltage Vth of the driving TFT DT is compensated. Therefore, the intensity of Ioled is adjusted by the intensity of the data voltage Vdata of the driving TFT DT and the organic light emitting diode emits light due to Ioled.

During the emission section t5, the current Ioled flowing in the organic light emitting diode is adjusted by Vgs of the driving TFT DT and the organic light emitting diode emits light due to Ioled. As such, Ioled flowing in the organic light emitting diode during the emission section t4 can be represented by the following Equation 5.

$$Ioled = \frac{K}{2}[(1 - C') \times (Vdata - Vini)]^2 \qquad \text{[Equation 5]}$$

Herein, k is a proportional constant reflecting various factors of the pixel circuit 600 and C' is equal to C1/(C1+C2). According to Equation 5, since the threshold voltage Vth is eliminated from Equation 5, the current Ioled flowing in the organic light emitting diode is not affected by the threshold voltage Vth of the driving TFT DT.

According to the prior art, after the emission control signal EM is applied in the emission section t5, an increase rate of Ioled is decreased due to a parasitic capacitance in the pixel circuit 600 or a voltage change in the pixel. Thus, there is a delay in emission by the organic light emitting diode with a sufficient luminance. Accordingly, a low luminance can be recognized, so that a flicker phenomenon may occur.

Referring to FIG. 21, during the emission section t5, the first scan signal SCAN1 is maintained in a low state and the second scan signal SCAN2 is also maintained in a low state. The nth emission control signal EM[n] rises when the emission section t5 starts, and then remains in a high state. Thus, during the emission section t5, the first switching TFT T1 and the second switching TFT T2 are turned off and the third switching TFT T3 is turned on.

Therefore, if the nth emission control signal EM[n] is in a high state, the third switching TFT T3 is turned on so as to supply the high-potential voltage VDD to the drain node of the driving TFT DT. Thus, the driving TFT DT adjusts the amount of current in the organic light emitting diode depending on the data voltage Vdata.

During the emission section t5, the high-potential voltage VDD is supplied to the drain node of the driving TFT DT through the turned-on third switching TFT T3. The voltages of the first node N1, i.e., the gate node of the driving TFT DT, and the third node N2, i.e., the source node, rapidly increased due to coupling by the coupling capacitor Ccp function to minimize a delay of the current Ioled flowing in the organic light emitting diode.

Figure 22:
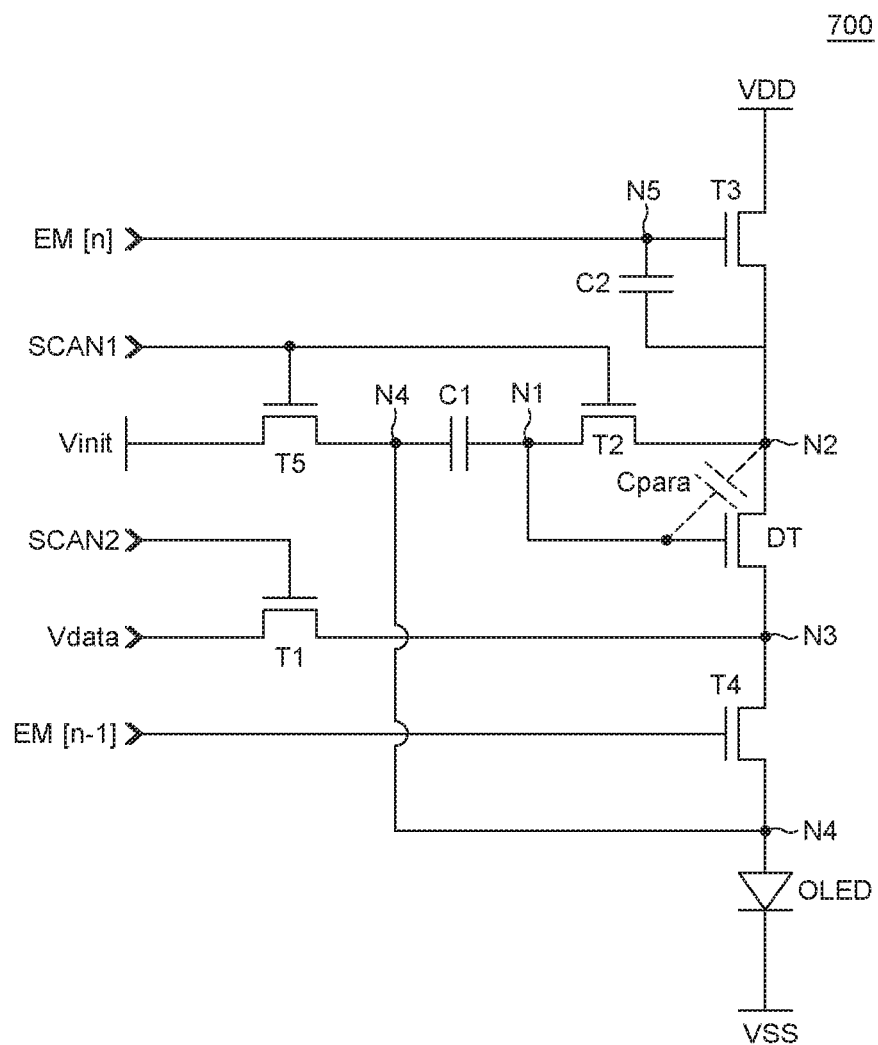
FIG. 22 is a circuit diagram showing a pixel driving circuit in an OLED device according to another exemplary embodiment of the present disclosure.

FIG. 22 is a circuit diagram showing a pixel driving circuit in an OLED device according to another exemplary embodiment of the present disclosure.

A pixel circuit illustrated in FIG. 22 is substantially the same as the pixel driving circuit illustrated in FIG. 20 except the alignment of the second capacitor C2. Therefore, a redundant explanation thereof will be omitted herein. That is, the pixel driving circuit 700 illustrated in FIG. 22 is substantially the same as the pixel driving circuit 600 illustrated in FIG. 20 except a node connected to the coupling capacitor Ccp. Therefore, a redundant explanation thereof will be omitted herein.

Referring to FIG. 22, the pixel driving circuit 700 includes the driving TFT DT, five switching TFT, the first capacitor C1, and the second capacitor C2. In this case, the first capacitor C1 may be a storage capacitor Cst and the second capacitor C2 may be a coupling capacitor Ccp.

The second capacitor C2 is disposed between the fifth node N5 as the gate node of the third switching TFT T3 and the second node N2 as the drain node of the driving TFT DT. That is, the second capacitor C2 is disposed between the EM[n] line and the second node N2 as being electrically connected thereto.

During the emission section, if the nth emission control signal EM[n] is in a high state, a voltage rapidly bootstrapped due to capacitive coupling of the second capacitor C2 is supplied to the second node N2. That is, the nth emission control signal EM[n] is supplied to the fifth node N5 and a voltage of the second node N2 is rapidly increased due to capacitive coupling by the second capacitor C2.

Further, a parasitic capacitor Cpara may be present between the first node N1 as the gate node of the driving TFT DT and the second node N2 as the drain node of the driving TFT DT. The parasitic capacitor Cpara of the driving TFT DT and the first capacitor C1 may form a second capacitive coupling subsequent to the capacitive coupling between the first capacitor C1 and the second capacitor C2.

Therefore, during the emission section, if the nth emission control signal EM[n] is in a high state, the voltage of the second node N2 is increased due to coupling by the second capacitor C2 and the voltage of the first node N1 is increased due to coupling by the parasitic capacitor Cpara of the driving TFT DT. Therefore, the voltage of the first node N1 is rapidly increased due to double coupling by the second capacitor C2 and the parasitic capacitor Cpara of the driving TFT DT.

In other words, if the nth emission control signal EM[n] is in a high state, the voltage of the second node N2 is increased. Therefore, the voltage of the first node N1 as the gate node of the driving TFT DT is also rapidly increased due to the second capacitive coupling.

Therefore, during the emission section, if the third switching TFT T3 is turned on in response to the nth emission control signal EM[n], the high-potential voltage VDD is applied to the drain node of the driving TFT DT. Further, a gate voltage of the driving TFT DT is rapidly increased due to double capacitive coupling by the second capacitor C2 and the parasitic capacitor Cpara.

Also, a voltage of the third node N3 may be equal to the voltage of the first node N1 minus the threshold voltage Vth. Further, during the sampling period, when the first switching TFT T1 is turned on, the data voltage Vdata is supplied to the third node N3. Thus, the voltage of the first node N1 is equal to Vdata+Vth. Then, during the emission section, the voltage of the first node N1 is rapidly increased due to double capacitive coupling by the second capacitor C2 and the parasitic capacitor Cpara. Therefore, Vgs of the driving TFT DT is maintained at Vth, so that the voltage of the third node N3 is also rapidly increased.

As a result, in the pixel driving circuit 700 in which the organic light emitting diode emits light due to Ioled, the current Ioled flowing in the organic light emitting diode can be adjusted by Vgs of the driving TFT DT and the intensity of Ioled can also be more rapidly increased due to double capacitive coupling by the second capacitor C2 and the parasitic capacitor Cpara.

Also, a rapid increase in a voltage applied to the gate node of the driving TFT DT caused by capacitive coupling can remarkably decrease a delay in time of increasing Ioled.

Figure 23:
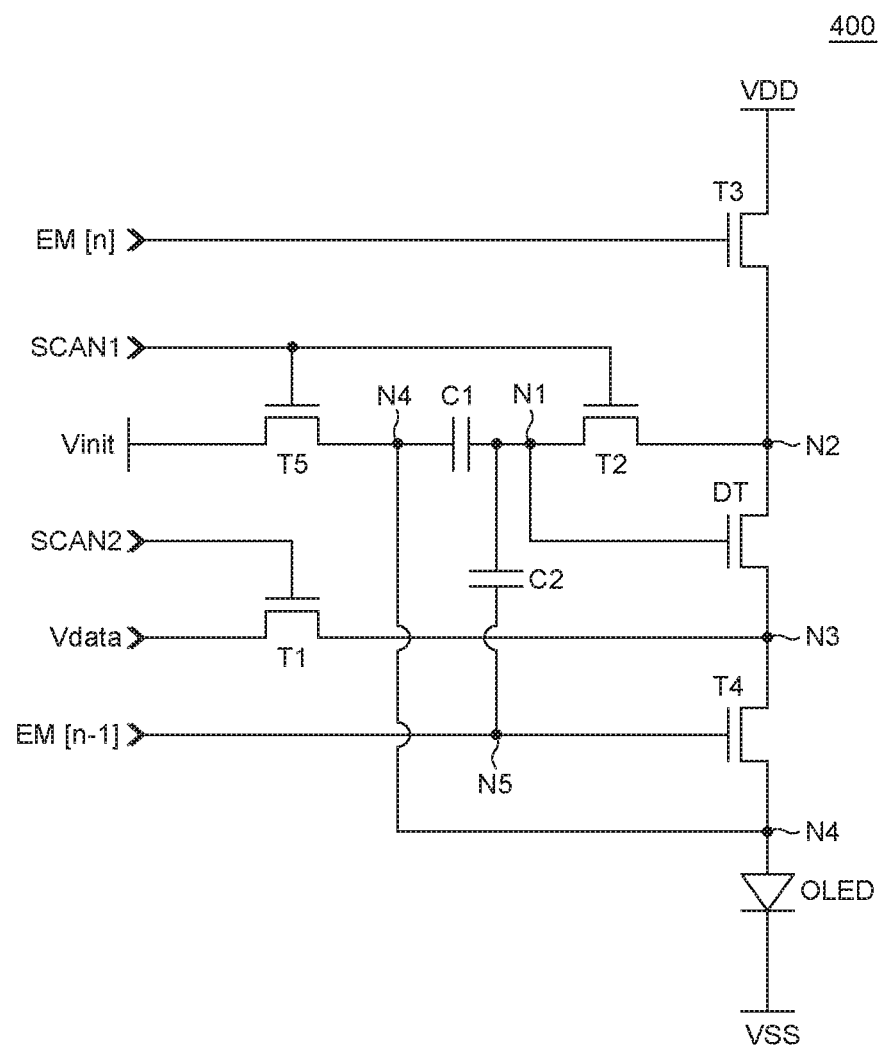
FIG. 23 is a circuit diagram showing a pixel driving circuit in an OLED device according to another exemplary embodiment of the present disclosure.

FIG. 23 is a circuit diagram showing a pixel driving circuit in an OLED device according to another exemplary embodiment of the present disclosure.

A pixel circuit illustrated in FIG. 23 is substantially the same as the pixel driving circuit illustrated in FIG. 20 except the alignment of the second capacitor C2. Therefore, a redundant explanation thereof will be omitted herein. That is, a pixel driving circuit 400 illustrated in FIG. 23 is substantially the same as the pixel driving circuit 600 illustrated in FIG. 20 except a node connected to the coupling capacitor Ccp. Therefore, a redundant explanation thereof will be omitted herein.

Referring to FIG. 23, the pixel driving circuit 400 includes the driving TFT DT, five switching TFTs, the first capacitor C1, and the second capacitor C2. In this case, the first capacitor C1 may be a storage capacitor Cst and the second capacitor C2 may be a coupling capacitor Ccp.

The second capacitor C2 is disposed between the first node N1 as the gate node of the driving TFT DT and the gate node of the fourth switching TFT T4. That is, the second capacitor C2 is disposed between a fifth node N5 as the gate node of the fourth switching TFT T4 connected to the EM[n-1] line and the first node N1 as being electrically connected thereto.

During the connection section, a voltage rapidly bootstrapped due to capacitive coupling of the second capacitor C2 is supplied to the first node N1.

Specifically, referring to FIG. 21, when the connection section t4 starts, the n-1th emission control signal EM[n-1] rises to a high state and the first scan signal SCAN1, the second scan signal SCAN2, and the nth emission control signal EM[n] are maintained in a low state. Thus, since the fourth switching TFT T4 is turned on, the third node N3 and the fourth node N4 are connected to each other. The voltage of the first node N1 is rapidly increased by the n-1th emission control signal EM[n-1] coupled by the second capacitor C2 and then supplied to the gate node of the fourth switching TFT T4.

That is, during the connection section t4, the n-1th emission control signal EM[n-1] is supplied to the fifth node N5 and the voltage bootstrapped by the n-1th emission control signal EM[n-1] is supplied to the first node N1 due to capacitive coupling between the first capacitor C1 and the second capacitor C2. Therefore, the voltage of the first node N1 is rapidly increased due to capacitive coupling by the second capacitor C2.

Specifically, the third node N3 may have a voltage equal to the voltage of the first node N1 minus the threshold voltage Vth until the sampling period t2. Further, when the first switching TFT T1 is turned on, the data voltage Vdata is supplied to the third node N3. Therefore, the voltage of the first node N1 is equal to Vdata+Vth.

Then, when the connection section t4 starts, the fourth switching TFT T4 is turned on while the n-1th emission control signal EM[n-1] is in a high state. Therefore, the data voltage Vdata supplied to the third node N3 is supplied to the fourth node N4. As a result, the data voltage Vdata is supplied to a node of the first capacitor C1.

Then, the first node N1 connected to the other node of the first capacitor C1 is supplied with a voltage Vcp which is rapidly increased by the n-1th emission control signal EM[n-1] coupled by the second capacitor C2 and then supplied to the gate node of the fourth switching TFT T4 and higher than Vdata+Vth. Therefore, the first capacitor C1 is charged with Vcp−Vdata.

Referring to FIG. 23, while the n-1th emission control signal EM[n-1] is in a high state, the voltage of the first node N1 in the pixel driving circuit 400 of the present disclosure is rapidly increased due to coupling by the second capacitor C2. Therefore, Vgs of the driving TFT DT is maintained at Vth, so that the voltage of the fourth node N4 is also rapidly increased.

As a result, in the pixel driving circuit 400 in which the organic light emitting diode emits light due to Ioled of the present disclosure, the current Ioled flowing in the organic light emitting diode can be adjusted by Vgs of the driving TFT DT and the intensity of Ioled can also be more rapidly increased due to coupling by the second capacitor C2.

Also, a rapid increase in a voltage applied to the gate node of the driving TFT DT caused by capacitive coupling can remarkably decrease a delay in time of increasing Ioled.

Figure 24:
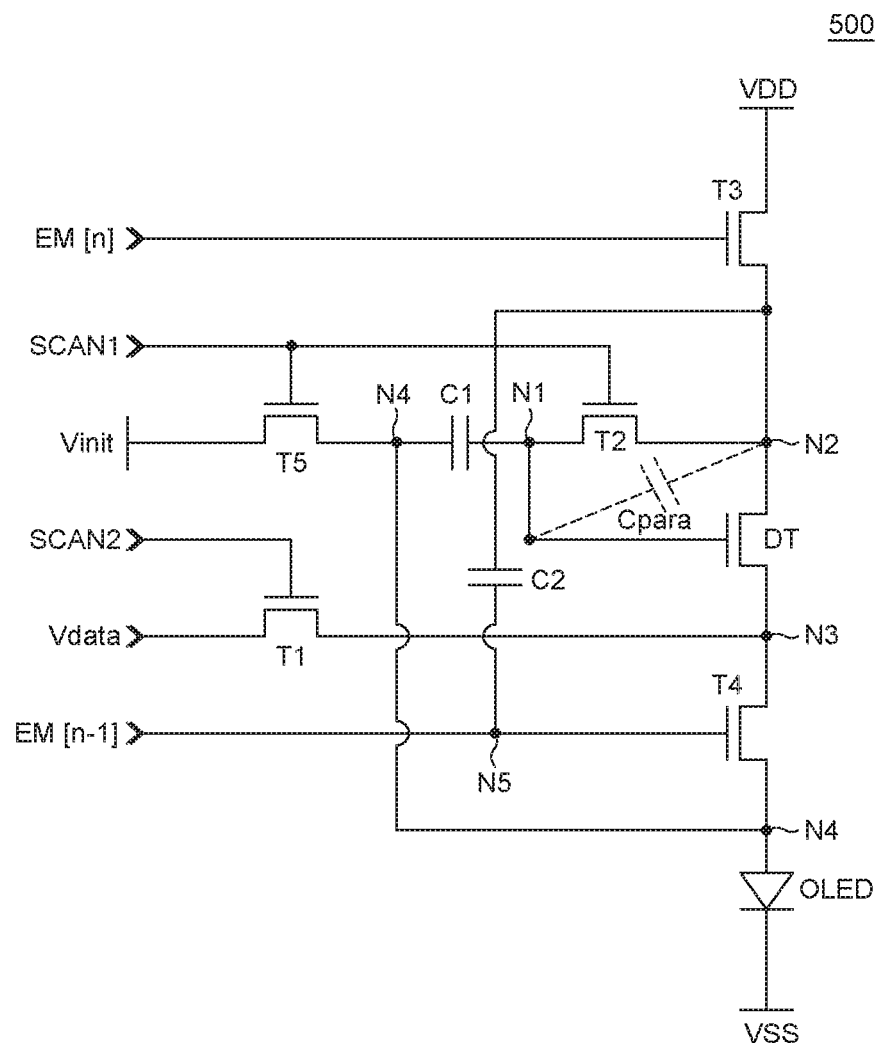
FIG. 24 is a circuit diagram showing a pixel driving circuit in an OLED device according to another exemplary embodiment of the present disclosure.

FIG. 24 is a circuit diagram showing a pixel driving circuit in an OLED device according to another exemplary embodiment of the present disclosure.

A pixel circuit illustrated in FIG. 24 is substantially the same as the pixel driving circuit illustrated in FIG. 20 except the alignment of a second capacitor C2. Therefore, a redundant explanation thereof will be omitted herein. That is, a pixel driving circuit 500 illustrated in FIG. 24 is substantially the same as the pixel driving circuit 600 illustrated in FIG. 20 except a part where the coupling capacitor Ccp is connected to a switching TFT. Therefore, a redundant explanation thereof will be omitted herein.

Referring to FIG. 24, the pixel driving circuit 500 includes the driving TFT DT, five switching TFTs, the first capacitor C1, and the second capacitor C2. In this case, the first capacitor C1 may be a storage capacitor Cst and the second capacitor C2 may be a coupling capacitor Ccp.

The second capacitor C2 is disposed between the second node N2 as the drain node of the driving TFT DT and the fifth node N5 as the gate node of the fourth switching TFT T4. That is, the second capacitor C2 is disposed between the EM[n-1] line and the second node N2 as being electrically connected thereto.

Further, a parasitic capacitor Cpara may be present between the first node N1 as the gate node of the driving TFT DT and the second node N2 as the drain node of the driving TFT DT. The parasitic capacitor Cpara of the driving TFT DT is connected in series to the second capacitor C2. Therefore, the parasitic capacitor Cpara of the driving TFT DT may form a second capacitive coupling subsequent to the coupling by the second capacitor C2.

During the connection section, the first node N1 is supplied with a rapidly bootstrapped voltage due to double capacitive coupling by the second capacitor C2 and the parasitic capacitor Cpara.

Specifically, referring to FIG. 21, when the connection section t4 starts, the n-1th emission control signal EM[n-1] rises to a high state and the first scan signal SCAN1, the second scan signal SCAN2, and the nth emission control signal EM[n] are maintained in a low state. Thus, since the fourth switching TFT T4 is turned on, the third node N3 and the fourth node N4 are connected to each other. The voltage of the second node N2 is rapidly increased by the n-1th emission control signal EM[n-1] coupled by the second capacitor C2 and then supplied to the gate node of the fourth switching TFT T4.

That is, during the connection section t4, the n-1th emission control signal EM[n-1] is supplied to the fifth node N5 and the voltage bootstrapped by the n−1th emission control signal EM[n−1] is supplied to the second node N2 due to capacitive coupling by the second capacitor C2. Therefore, the voltage of the second node N2 is rapidly increased due to capacitive coupling by the second capacitor C2.

Therefore, if the n−1th emission control signal EM[n−1] is in a high state during the connection section t4, the voltage of the second node N2 is increased due to coupling by the second capacitor C2 and the voltage of the first node N1 is increased due to coupling by the parasitic capacitor Cpara of the driving TFT DT. Therefore, the voltage of the first node N1 is rapidly increased due to double coupling by the second capacitor C2 and the parasitic capacitor Cpara of the driving TFT DT.

In other words, if the n−1th emission control signal EM[n−1] is in a high state, the voltage of the second node N2 is increased. Therefore, due to the second capacitive coupling subsequent thereto, the voltage of the first node N1 as the gate node of the driving TFT DT is also rapidly increased.

Specifically, the third node N3 may have a voltage equal to the voltage of the first node N1 minus the threshold voltage Vth until the sampling period t2. Further, when the first switching TFT T1 is turned on, the data voltage Vdata is supplied to the third node N3. Therefore, the voltage of the first node N1 is equal to Vdata+Vth.

Then, when the connection section t4 starts, the fourth switching TFT T4 is turned on while the n−1th emission control signal EM[n−1] is in a high state. Therefore, the data voltage Vdata supplied to the third node N3 is supplied to the fourth node N4. As a result, the data voltage Vdata is supplied to a node of the first capacitor C1.

Then, the first node N1 connected to the other node of the first capacitor C1 is supplied with a voltage Vcp which is higher than Vdata+Vth due to double coupling by the second capacitor C2 and the parasitic capacitor Cpara of the driving TFT DT. Therefore, the first capacitor C1 is charged with Vcp−Vdata.

Referring to FIG. 24, while the n−1th emission control signal EM[n−1] is in a high state, the voltage of the first node N1 in the pixel driving circuit 500 of the present disclosure is rapidly increased due to double coupling by the second capacitor C2 and the parasitic capacitor Cpara of the driving TFT DT. Therefore, Vgs of the driving TFT DT is maintained at Vth, so that the voltage of the fourth node N4 is also rapidly increased.

As a result, in the pixel driving circuit 500 in which the organic light emitting diode emits light due to Ioled of the present disclosure, the current Ioled flowing in the organic light emitting diode can be adjusted by Vgs of the driving TFT DT and the intensity of Ioled can also be more rapidly increased due to coupling by the second capacitor C2.

Also, a rapid increase in a voltage applied to the gate node of the driving TFT DT caused by capacitive coupling can remarkably decrease a delay in time of increasing Ioled.

Figure 25:
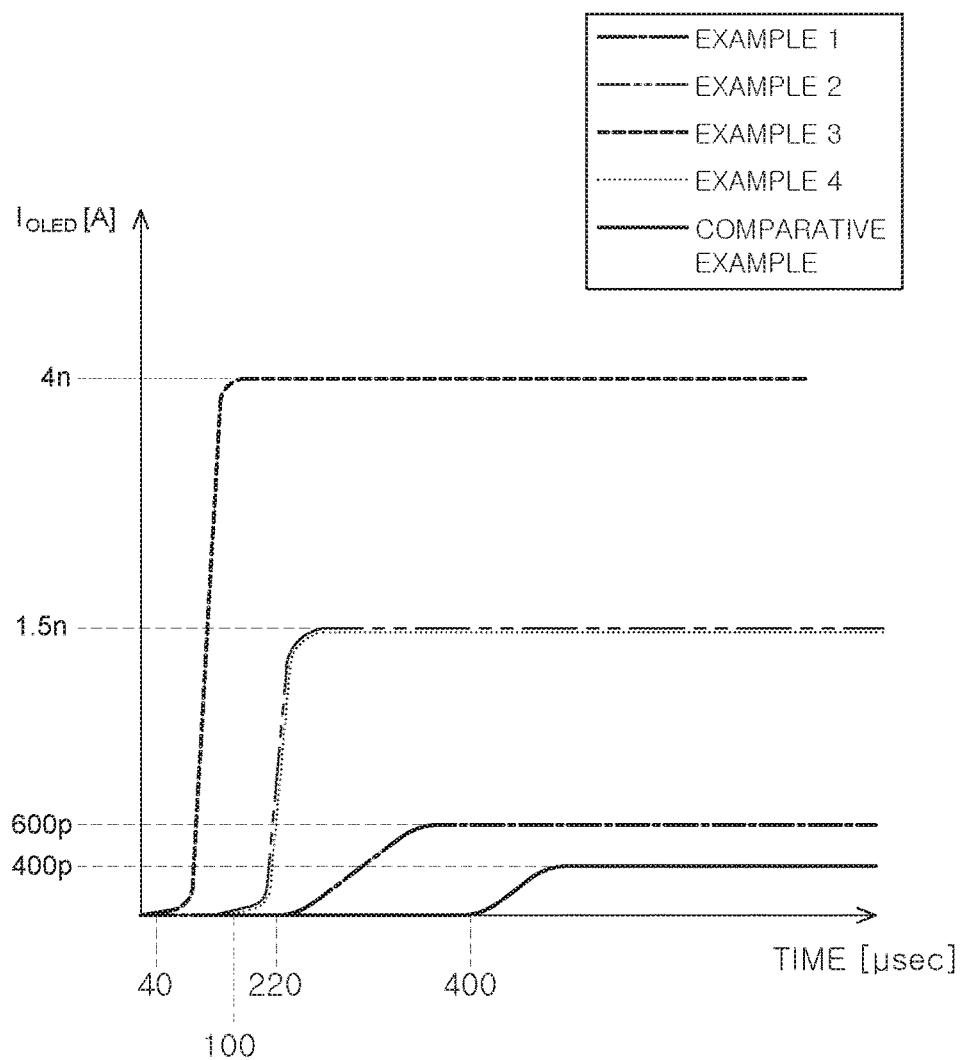
FIG. 25 is a graph of OLED current ($I_{OLED}$) in a Comparative Example and in Example embodiments of the present disclosure.

FIG. 25 is a graph showing a change in Ioled in an OLED device according to another exemplary embodiment of the present disclosure. Also, FIG. 25 illustrates Comparative Example and Examples to show a change in Ioled.

Herein, Example 1 is Ioled in the OLED device according to an exemplary embodiment of the present disclosure illustrated in FIG. 20, and Example 2 is Ioled in the OLED device according to another exemplary embodiment of the present disclosure illustrated in FIG. 22. Also, Example 3 is Ioled in the OLED device according to another exemplary embodiment of the present disclosure illustrated in FIG. 23, and Example 4 is Ioled in the OLED device according to another exemplary embodiment of the present disclosure illustrated in FIG. 24.

Herein, FIG. 25 is a graph showing a change in Ioled according to time. In FIG. 25, the time starts from when the nth emission control signal EM[n] is supplied to the pixel driving circuit.

Referring to FIG. 25, Comparative Example has a much longer delay of Ioled than Example 1 to Example 4. Specifically, a delay of Ioled in Comparative Example is about 440 μs. Meanwhile, a delay of Ioled in Example 1 is about 220 μs, a delay of Ioled in Example 2 is about 100 μs, a delay of Ioled in Example 3 is about 40 μs, and a delay of Ioled in Example 4 is about 100 μs.

That is, even if the maximum value of Ioled is different in each Example, a delay of Ioled in each of Examples of the present disclosure can be remarkably decreased as compared with Comparative Example.

Therefore, according to Examples of the present disclosure, the voltage of the gate node of the driving TFT DT is rapidly increased by the second capacitor C2 as a coupling capacitor or the second capacitor C2 and the parasitic capacitor Cpara which form doubling capacitive coupling. Thus, when the emission section t4 starts, Ioled is rapidly increased, so that a delay of Ioled can be remarkably decreased.

Figure 26:
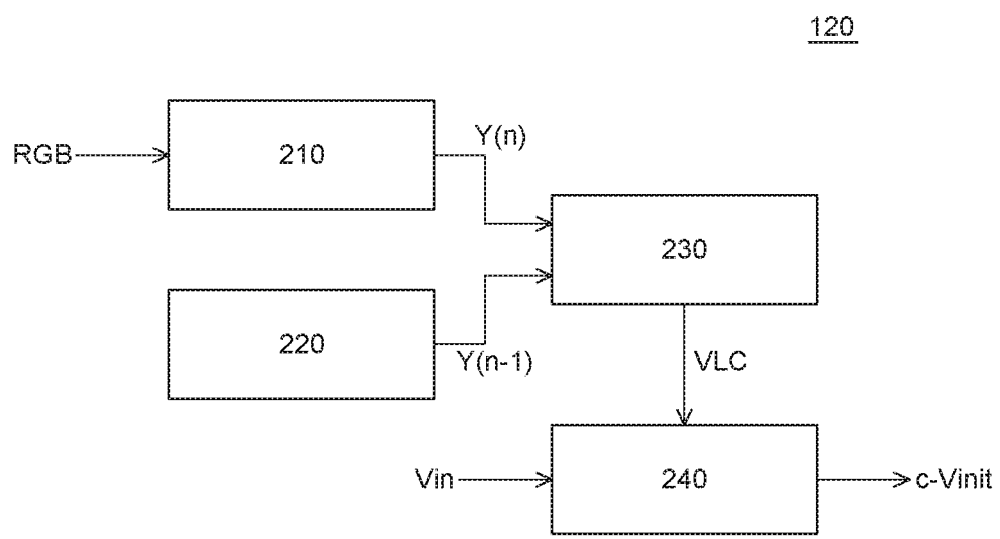
FIG. 26 is a schematic block diagram provided to explain a timing controller illustrated in FIG. 1.

IV. [External Compensation] External Compensation (1) Using Initialization Voltage Vinit Hereinafter, the timing controller 120 involved in the generation of an adjusted initialization voltage c-Vinit of the present disclosure will be described in detail. FIG. 26 is a schematic block diagram provided to explain a timing controller illustrated in FIG. 1.

Referring to FIG. 26, a timing controller 120 includes a luminance measurement unit 210, a memory unit 220, an initialization voltage level controller 230, and an initialization voltage generator 240.

The luminance measurement unit 210 receives pixel driving data RGB applied from a driving system (not illustrated) of the OLED device 100 and calculates a luminance value Y.

The luminance value Y can be calculated from the input pixel driving data RGB according to the following Equation 6.

$$Y(299*R+587*G+114*B)/1000 \qquad \text{[Equation 6]}$$

Referring to FIG. 26, the memory unit 220 stores the luminance value Y calculated from the input pixel driving data RGB. Specifically, the memory unit 220 already stores a luminance value Yn−1 of a previous frame and can also store a luminance value Yn of the present frame.

A luminance comparison unit 230 may compare the luminance value Yn of the pixel driving data RGB applied from the luminance measurement unit 210 during a section for the present frame Fn with the luminance value Yn−1 of the previous frame Fn−1 applied from the memory unit 220. As a result, if there is a difference of a predetermined value or more in luminance value Y between the present frame and the previous frame, the luminance comparison unit 230 generates an initialization voltage level control signal VLC.

The initialization voltage generator 240 is supplied with an input voltage Vin which is applied from the driving system (not illustrated) and converted into an initialization voltage Vinit required to drive a plurality of pixels P by the timing controller 120. Further, the initialization voltage generator 240 receives the initialization voltage level control signal VLC from the initialization voltage level controller 230. Then, if there is a difference between the luminance value Yn of the pixel driving data RGB in the present frame and the luminance value Yn−1 in the previous frame, the initialization voltage generator 240 applies an adjusted initialization voltage c-Vinit to the plurality of pixels P.

Therefore, the adjusted initialization voltage c-Vinit is applied as a considerably high voltage to an anode of the organic light emitting diode OLED. Even if a voltage of the source node of the driving TFT in the pixel driving circuit is slightly increased, the current Ioled can flow with a sufficient luminance without a delay.

Hereinafter, a pixel driving circuit applied with the adjusted initialization voltage c-Vinit will be described.

Figure 27:
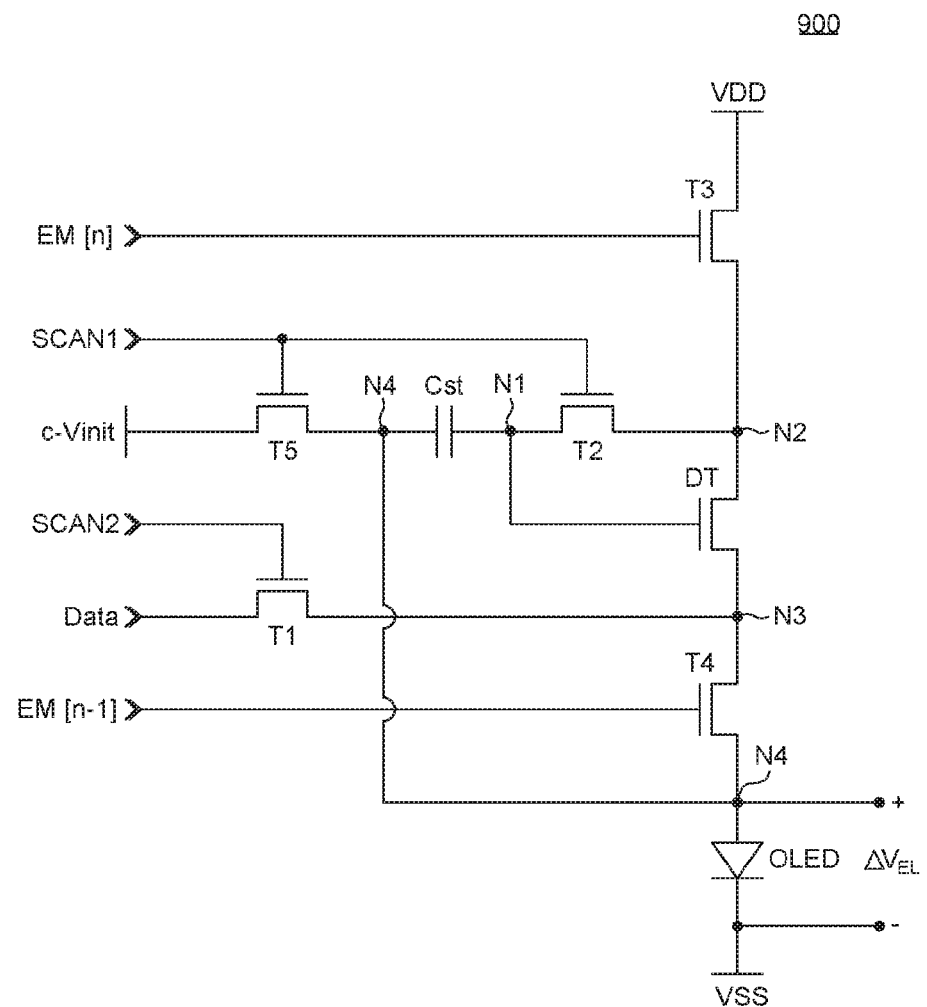
FIG. 27 is a circuit diagram showing a pixel driving circuit in an OLED device according to an exemplary embodiment of the present disclosure.

FIG. 27 is a circuit diagram showing a pixel driving circuit in an OLED device according to an exemplary embodiment of the present disclosure.

Referring to FIG. 27, a pixel P includes an organic light emitting diode EL and the pixel driving circuit 900 including six transistors and a capacitor and configured to drive the organic light emitting diode EL.

Specifically, the pixel driving circuit 900 includes a driving transistor DT, first to fifth switching transistors T1 to T5, and a storage capacitor Cst.

The driving TFT DT includes a gate node as a first node N1 connected to a node of the storage capacitor Cst, a drain node as a second node N2 electrically connected to the second switching TFT T2 and the third switching TFT T3, and a source node as a third node N3 electrically connected to the first switching TFT T1 and the fourth switching TFT T4.

Specifically, the drain node of the driving TFT DT is electrically connected to the VDD line. Thus, if the second switching TFT T2 and the third switching TFT T3 are turned on, the gate node of the driving TFT DT stores the high-potential voltage VDD.

Further, while the first switching TFT T1 is turned on, the data voltage Vdata is supplied to the source node of the driving TFT DT. When the second switching TFT T2 is turned on, the data voltage Vdata in the source node of the driving TFT DT is supplied to the first node N1 as the gate node of the driving TFT DT.

Specifically, if the second switching TFT T2 is turned on, a second node N2 as the drain node of the driving TFT DT and the first node N1 as the gate node of the driving TFT DT are connected to each other. Thus, Vgs of the driving TFT DT becomes Vth of the driving TFT DT according to the diode connection method. Therefore, if the first switching TFT T1 is turned on and the data voltage Vdata is supplied to the source node of the driving TFT DT, Vdata+Vth is supplied to the gate node of the driving TFT DT.

The source node of the driving TFT DT is electrically connected to the organic light emitting diode. Specifically, the source node of the driving TFT DT is connected to a drain node of the fourth switching TFT T4 as a fourth node N4. Further, the source node of the driving TFT DT is electrically connected to the anode of the organic light emitting diode and connected to a source node of the first switching TFT T1.

If the fourth switching TFT T4, the driving TFT DT, and the third switching TFT T3 are turned on, the driving TFT DT is supplied with the high-potential voltage VDD and supplies the driving current to the organic light emitting diode OLED. Thus, the organic light emitting diode emits light.

The first switching TFT T1 includes a gate node connected to the SCAN2 line, a drain node connected to the data line, a source node connected to the third node N3 as the source node of the driving TFT DT.

Thus, the first switching TFT T1 is turned on or off in response to the second scan signal SCAN2. That is, if the second scan signal SCAN2 in a high state is supplied to the gate node of the first switching TFT T1, the data voltage Vdata is supplied from the drain node of the first switching TFT T1 to the third node N3 as the source node of the driving TFT DT.

The second switching TFT T2 includes a gate node connected to the SCAN1 line, a drain node connected to the drain node of the driving TFT DT and a source node of the third switching TFT T3, and a source node connected to the gate node of the driving TFT DT. Further, the source node of the second switching TFT T2 is connected to a node of the storage capacitor Cst.

Thus, the second switching TFT T2 is turned on or off in response to the first scan signal SCAN1. That is, if the first scan signal SCAN1 is in a high state, the second switching TFT T2 is turned on. Thus, the second switching TFT T2 transfers a voltage of the second node N2 as the drain node of the driving TFT DT to a voltage of the first node N1 as the gate node of the driving TFT DT.

Further, the nth emission control signal EM[n] is supplied as a DC voltage to a gate node of the third switching TFT T3 until it falls from a high state to a low state. Thus, while the second switching TFT T2 is turned on, only the high-potential voltage VDD is supplied to the first node N1 as the gate node of the driving TFT DT.

The third switching TFT T3 includes the gate node connected to the EM[n] line, a drain node connected to the VDD line, and a source node connected to the drain node of the driving TFT DT.

Thus, the third switching TFT T3 may be turned on or off in response to the nth emission control signal EM[n]. That is, if the nth emission control signal EM[n] is in a high state, the third switching TFT T3 is turned on to supply the high-potential voltage VDD from the source node to the second node N2 as the drain node of the driving TFT DT.

Then, if the nth emission control signal EM[n] is in a high state, the third switching TFT T3 supplies the high-potential voltage VDD to the drain node of the driving TFT DT and a current (hereinafter, referred to "Ids") between the drain and the source of the driving TFT DT flows in the organic light emitting diode. Therefore, the driving TFT DT adjusts the amount of current in the organic light emitting diode depending on the data voltage Vdata.

The fourth switching TFT T4 includes a gate node connected to the EM[n−1] line, a drain node connected to the source node of the driving TFT DT, and a source node connected to the anode of the organic light emitting diode. Thus, the fourth switching TFT T4 may be turned on in response to the n−1th emission control signal EM[n−1].

That is, if the n−1th emission control signal EM[n−1] is in a high state during the connection section, the fourth switching TFT T4 is turned on. Thus, the third node N3 as the source node of the driving TFT DT and the fourth node N4 as the source node of the fourth switching TFT T4 are connected to each other.

Therefore, if the fourth switching TFT T4 is turned on in response to the n−1th emission control signal EM[n−1], the voltage Vdata of the third node N3 is supplied to the fourth node N4.

If the fourth switching TFT T4, the driving TFT DT, and the third switching TFT T3 are turned on during the emission section, the high-potential voltage VDD is supplied to the driving TFT DT and the driving current Ids is supplied to the organic light emitting diode. Thus, the organic light emitting diode emits light.

Referring to FIG. 27, the fifth switching TFT T5 includes a gate node connected to the SCAN1 line, a source node connected to an adjusted initialization (c-Vinit) line, and a drain node connected to a node of the storage capacitor Cst and a fourth node N4 as the anode of the organic light emitting diode.

During the initialization period, the fifth switching TFT T5 may be turned on in response to the first scan signal SCAN1. That is, if the first scan signal SCAN1 is in a high state, the fifth switching TFT T5 is turned on to supply the adjusted initialization voltage c-Vinit to the fourth node N4.

Therefore, if the fifth switching TFT T5 is turned on in response to the first scan signal SCAN1, the adjusted initialization voltage c-Vinit is supplied to the fourth node N4. Thus, the data voltage Vdata written on the organic light emitting diode is initialized.

For example, a parasitic capacitance CEL generated in the anode of the organic light emitting diode causes a time delay of the current Ioled involved in emission of the organic light emitting diode. Thus, even if the adjusted initialization voltage c-Vinit is applied to the anode of the organic light emitting diode and a low voltage is applied to the source node of the driving TFT DT, the current Ioled for driving the organic light emitting diode flows without a time delay.

Therefore, the current Ioled flowing in the organic light emitting diode rapidly moves, so that the OLED device without a luminance difference can be implemented.

The storage capacitor Cst stores a voltage to be applied to the gate node of the driving TFT DT. In this case, a node of the storage capacitor Cst is connected to the first node N1 as the gate node of the driving TFT DT and the other node is connected to the fourth node N4 electrically connected to the anode of the organic light emitting diode.

That is, the storage capacitor Cst is electrically connected to the first node N1 and the fourth node N4 and stores a voltage difference between a voltage to be applied to the gate node of the driving TFT DT and a voltage to be applied to the anode of the organic light emitting diode.

Specifically, a node of the storage capacitor Cst is applied with Vdata+Vth when the first switching TFT T1 and the second switching TFT T2 are turned on. The other node of the storage capacitor Cst is applied with the initialization voltage Vinit when the fifth switching TFT T5 is turned on. Therefore, a voltage charged in the storage capacitor Cst is equal to Vdata+Vth−Vinit.

Figure 28:
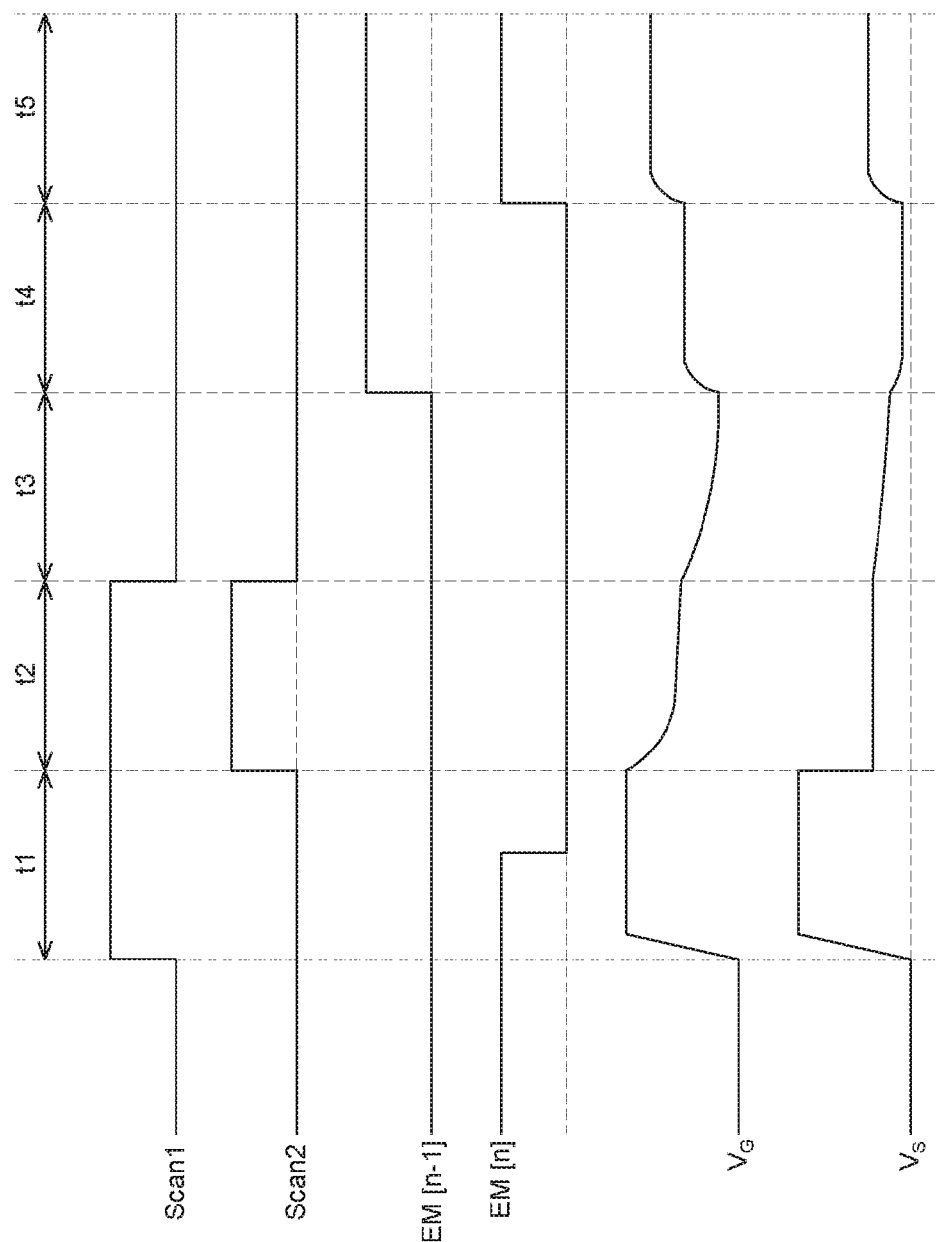
FIG. 28 is a waveform diagram showing a signal input into the pixel driving circuit illustrated in FIG. 27 and a resultant output signal.

FIG. 28 is a waveform diagram showing a signal input into the pixel driving circuit 900 illustrated in FIG. 27 and a resultant output signal. For convenience in explanation, FIG. 27 and FIG. 28 will be referred to hereinafter.

Referring to FIG. 28, a refresh section includes an initialization period t1, a sampling period t2, a voltage holding section t3, a connection section t4, and an emission section t5. The refresh section may be set to about 1 horizontal period (1 H). During the refresh section, data are written on pixels aligned on a horizontal line in a pixel array. Specifically, during the refresh section, the threshold voltage Vth of the driving TFT DT in the pixel driving circuit 900 is sampled and the data voltage Vdata is compensated by the threshold voltage Vth. Thus, the data voltage Vdata is compensated and written on a pixel in order to determine the amount of current in the organic light emitting diode regardless of the threshold voltage Vth.

Referring to FIG. 28, the data voltage Vdata is written on each of pixels passing through the initialization period t1, the sampling period t2, the voltage holding section t3, the connection section t4, and the emission section t5 and disposed on the horizontal line. Then, each of the pixels emits light.

FIG. 28 illustrates that each of the initialization period t1, the sampling period t2, the voltage holding section t3, the connection section t4, and the emission section t5 is maintained for the same duration time. However, a duration time for each of the initialization period t1, the sampling period t2, the voltage holding section t3, the connection section t4, and the emission section t5 may be changed in various ways according to an exemplary embodiment. For example, the voltage holding section t3 may be shorter than the other sections.

Firstly, when the initialization period t1 starts, the first scan signal SCAN1 rises to a high state and the second scan signal SCAN2 is maintained in a low state. At the same time, the n−1th emission control signal EM[n−1] is also maintained in a low state and the nth emission control signal EM[n] falls from a high state to a low state during the initialization period t1.

Thus, during the initialization period t1, the second switching TFT T2 and the fifth switching TFT T5 are turned on and the first switching TFT T1 and the fourth switching TFT T4 are turned off. Further, the third switching TFT T3 is turned on only in a section in which the nth emission control signal EM[n] is in a high state. When the nth emission control signal EM[n] falls to a low state, the third switching TFT T3 is turned off.

Therefore, the adjusted initialization voltage c-Vinit is supplied to the fourth node N4 through the fifth switching TFT T5. While the third switching TFT T3 is turned on, the high-potential voltage VDD is supplied to the first node N1 through the second switching TFT T2.

That is, since the adjusted initialization voltage c-Vinit is supplied to the anode of the organic light emitting diode, the data voltage Vdata written on the organic light emitting diode during a previous frame is initialized to the adjusted initialization voltage c-Vinit. Also, the high-potential voltage VDD is supplied to the gate node of the driving TFT DT.

Further, the nth emission control signal EM[n] is supplied as a DC voltage to the gate node of the third switching TFT T3 until it falls from a high state to a low state, so that the third switching TFT T3 is turned on. Then, the high-potential voltage VDD is supplied to the first node N1 as the gate node of the driving TFT DT.

During the sampling period t2, the first scan signal SCAN1 is maintained in a high state and the second scan signal SCAN2 rises to a high state. During the sampling period t2, all of the nth emission control signal EM[n] and the n−1th emission control signal EM[n−1] are maintained in a low state.

Thus, during the sampling period t2, the first switching TFT T1, the second switching TFT T2, and the fifth switching TFT T5 are turned on and the third switching TFT T3 and the fourth switching TFT T4 are turned off.

Therefore, the data voltage Vdata is supplied to the third node N3 through the first switching TFT T1.

Further, when the third switching TFT T3 is turned off, the supply of the high-potential voltage VDD to the first node N1 is stopped. Then, when the driving TFT DT and the second switching TFT T2 are turned on, the data voltage Vdata supplied to the third node N3 is supplied to the first node N1 connected to a node of the storage capacitor Cst.

Specifically, since the third switching TFT T3 is turned off, a voltage of the first node N1 is decreased from the high-potential voltage VDD to the data voltage Vdata. By scanning such a voltage change, the threshold voltage Vth of the driving TFT DT can be checked. As a result, during the sampling period t2, the threshold voltage Vth of the driving TFT DT can be sampled.

Therefore, when the third switching TFT T3 is turned off and the second switching TFT T2 is turned on, the second node N2 as the drain node of the driving TFT DT and the first node N1 as the gate node of the driving TFT DT are connected to the each other. Thus, Vgs of the driving TFT DT is sampled as Vth of the driving TFT DT.

Also, when the fifth switching TFT T5 is turned on, the adjusted initialization voltage c-Vinit is supplied to the fourth node N4. When the first switching TFT T1 and the second switching TFT T2 are turned on, Vdata+Vth is supplied to the first node N1. As a result, the storage capacitor Cst stores Vdata+Vth−c-Vinit.

Therefore, during the sampling period t2, a voltage of the first node N1 and the second node N2 is equal to Vdata+Vth, a voltage of the third node N3 is equal to Vdata, and a voltage of the fourth node N4 is equal to the adjusted initialization voltage c-Vinit.

Then, when the voltage holding section t3 starts, the first scan signal SCAN1 and the second scan signal SCAN2 fall to a low state and the nth emission control signal EM[n] and the n−1th emission control signal EM[n−1] are maintained in a low state.

Thus, during the voltage holding section t3, all of the switching TFTs T1 to T5 are turned off. Therefore, the first to fourth nodes N1 to N4 sampled or written in the sampling period t2 are floated respectively, and a voltage of each node remains unchanged.

Particularly, in an OLED device in which a switching TFT in a pixel is configured as an oxide semiconductor TFT and a driving TFT DT in the pixel is configured as an LTPS TFT, the pixel driving circuit 900 is more suitable for low-speed drive.

Specifically, the switching TFT configured as the oxide semiconductor TFT has a very low off-current and thus is suitable to hold the respective voltages of the first to fourth nodes N1 to N4 during the voltage holding section t3.

That is, in the switching TFT configured as the oxide semiconductor TFT, an off-current is very low during the voltage holding section t3, so that the respective voltages of the first to fourth nodes N1 to N4 are not decreased but held.

Accordingly, if the switching TFT in the pixel P of the present disclosure is configured as an oxide semiconductor TFT and the driving TFT DT in the pixel P is configured as an LTPS TFT, an off-current is low even in low-speed drive. Therefore, during the voltage holding section t3, the voltages of the respective nodes may be held with almost no decrease.

During the connection section t4, the first scan signal SCAN1 and the second scan signal SCAN2 are maintained in a low state. When the connection section t4 starts, the n−1th emission control signal EM[n−1] rises to a high state and the nth emission control signal EM[n] is maintained in a low state.

Thus, during the connection section t4, only the fourth switching TFT T4 is turned on and all of the first switching TFT T1, the second switching TFT T2, the third switching TFT T3, and the fifth switching TFT T5 are turned off. Therefore, since the fourth switching TFT T4 is turned on, the third node N3 and the fourth node N4 are electrically connected to each other and Vdata held in the third node N3 is supplied to the fourth node N4.

During the emission section t5, the first scan signal SCAN1 and the second scan signal SCAN2 are maintained in a low state. The nth emission control signal EM[n] rises when the emission section t5 starts, and then remains in a high state during the emission section t5.

Further, the n−1th emission control signal EM[n−1] is also maintained in a high state. Thus, during the emission section t5, the first switching TFT T1, the second switching TFT T2, and the fifth switching TFT T5 are turned off and the third switching TFT T3 and the fourth switching TFT T4 are turned on.

Further, the driving TFT DT is also turned on by Vdata+Vth which has been stored in the first node N1 until the connection section t4. Thus, a path for a driving current to flow is formed from the VDD line to the organic light emitting diode.

That is, during the emission section t5, Ioled flows to the organic light emitting diode through the turned-on driving TFT DT, third switching TFT T3 and fourth switching TFT T4.

According to an exemplary embodiment of the present disclosure, the adjusted initialization voltage c-Vinit having a higher voltage value than that of the prior art is input into the fourth node N4. Therefore, the voltage of the fourth node N4 connected to the anode of the organic light emitting diode functions to minimize a delay of the current Ioled flowing in the organic light emitting diode.

Specifically, the anode of the organic light emitting diode has a considerably high voltage due to the adjusted initialization voltage c-Vinit input into the fourth node N4. Therefore, a lower driving voltage is needed for the organic light emitting diode to emit light. Therefore, a low voltage input into the source node of the driving TFT DT can generate Ioled with a sufficient luminance.

Figure 29:
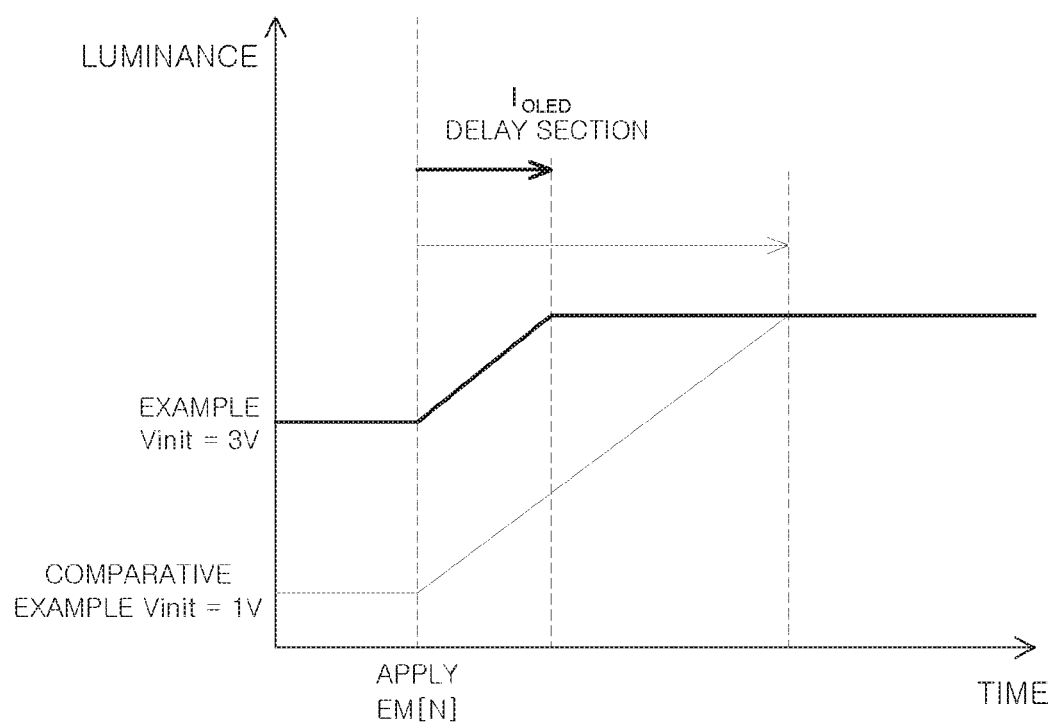
FIG. 29 is a graph showing a luminance change of a Comparative Example and an Example embodiment of the present disclosure, depending on a change in an initialization voltage.

FIG. 29 is a graph showing a luminance change of Comparative Example and Example depending on a change in an initialization voltage.

FIG. 29 shows a change in Ioled delay section before reaching an appropriate luminance according to Comparative Example and Example. Herein, FIG. 29 is a graph showing a change in luminance according to time. In FIG. 29, the time starts from when the initialization voltage is supplied to the pixel driving circuit 900.

Referring to FIG. 29, Comparative Example is the initialization voltage Vinit input into the pixel driving circuit in the OLED device according to the prior art. Example is the adjusted initialization voltage c-Vinit input into the pixel driving circuit 900 in the OLED device according to an exemplary embodiment illustrated in FIG. 27. Further, referring to FIG. 29, Comparative Example has a very long time delay of Ioled before reaching a specific luminance as compared with Example.

Referring to FIG. 29, an adjusted initialization voltage c-Vinit applied to the pixel driving circuit 900 according to Example of the present disclosure shows that only when a luminance of image data RGB is lower than a predetermined luminance, an initialization voltage Vinit is increased and then applied to the pixel driving circuit.

That is, before an emission control signal is applied, the initialization voltage Vinit according to Example is higher than an initialization voltage Vinit according to Comparative Example. Herein, Comparative Example may be the case where the constant initialization voltage Vinit is applied regardless of a luminance of image data RGB or the case where the luminance of the image data RGB is higher than a predetermined luminance.

The timing controller of the OLED device according to an exemplary embodiment of the present disclosure may increase an initialization voltage Vinit to have a luminance value at which a flicker phenomenon does not occur if a luminance value of input image data RGB is lower than a predetermined luminance.

That is, during a section where the luminance value is lower than the predetermined luminance, the initialization voltage Vinit is increased to boost a voltage of the fourth node N4 of the pixel driving circuit 900 connected to the anode of the organic light emitting diode. Thus, a flicker phenomenon can be suppressed.

Particularly, in an OLED device including a multi-type TFT, as an initialization voltage Vinit is increased, power consumption of a plurality of switching TFTs configured as oxide semiconductor TFTs may be increased. However, by temporarily increasing the initialization voltage Vinit only when a luminance is decreased and a flicker phenomenon occurs, an increase in power consumption can be suppressed. Accordingly, power consumption of the OLED device can be minimized and a flicker phenomenon can be reduced.

V. External Compensation (2) Using Initialization Voltage Vinit

Figure 30:
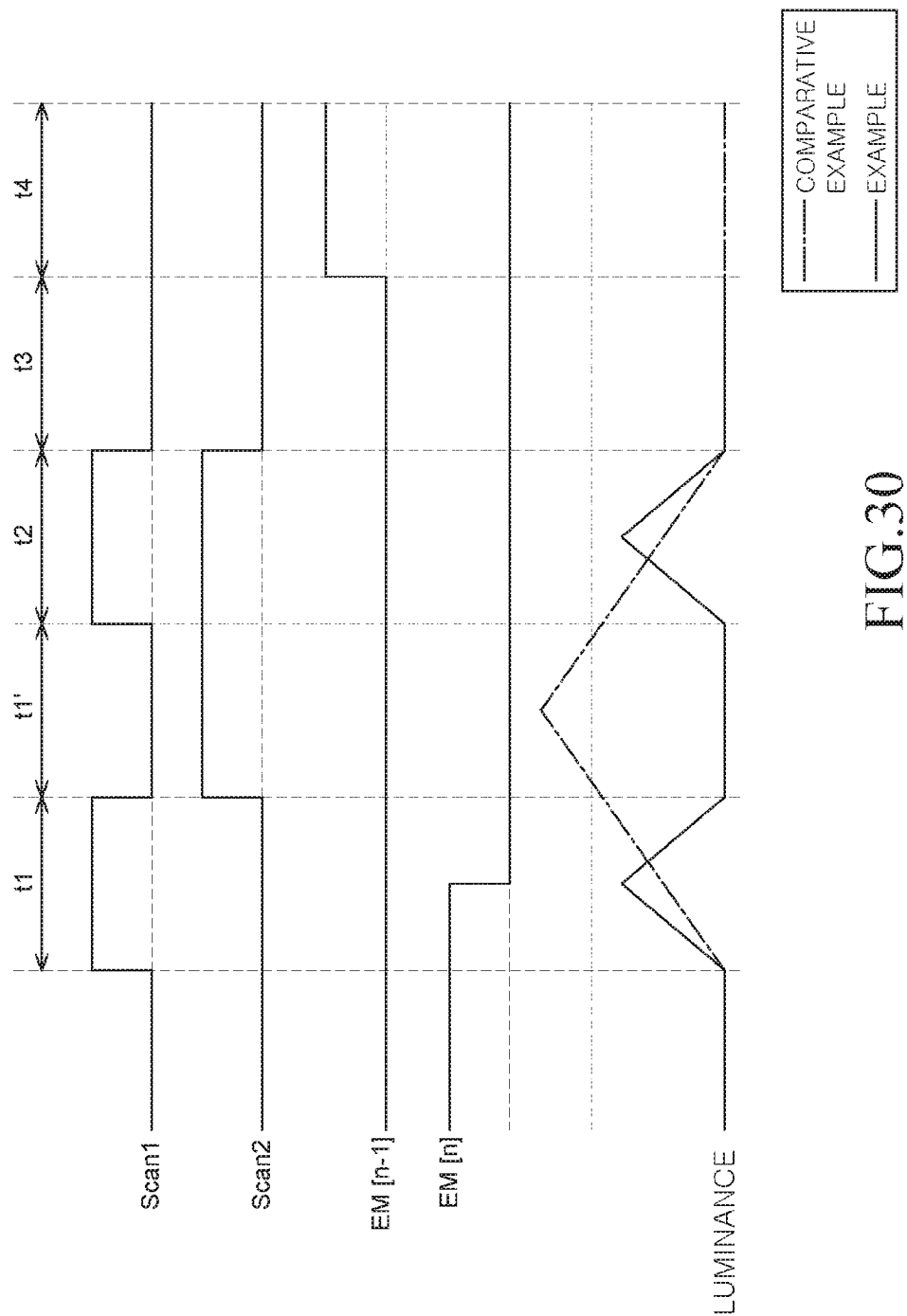
FIG. 30 is a waveform diagram showing a signal input into a pixel driving circuit and a change in black luminance according to an exemplary embodiment of the present disclosure.
Figure 31:
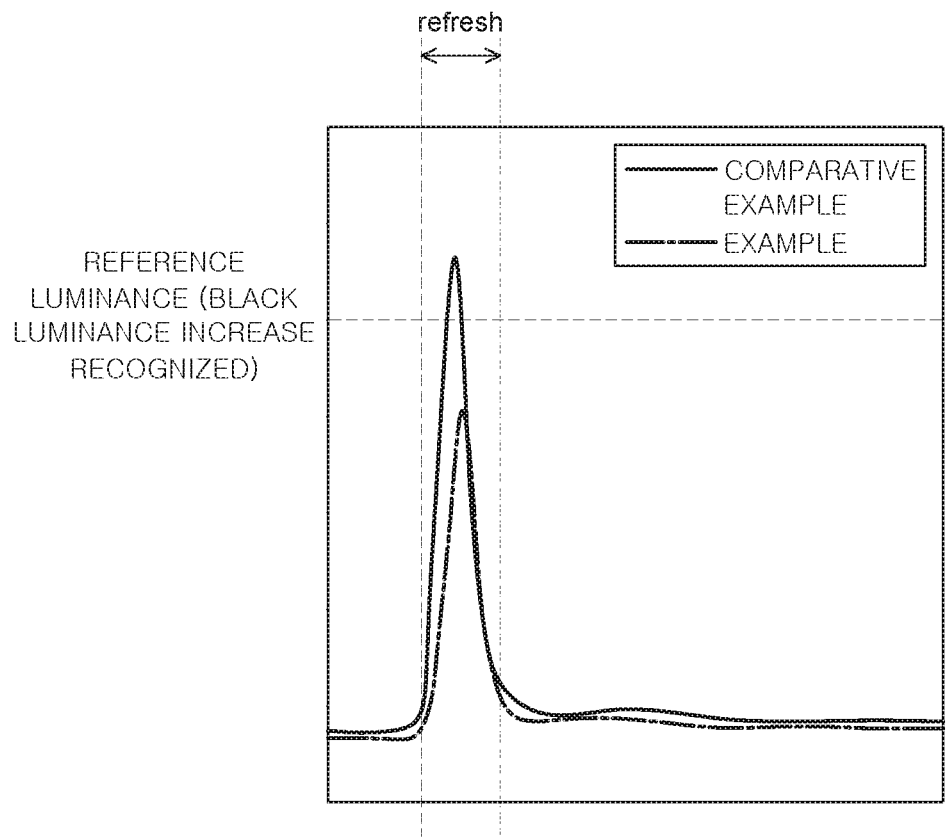
FIG. 31 is a graph showing recognition of black luminance during a refresh section according to a Comparative Example and an Example embodiment of the present disclosure.

FIG. 30 is a waveform diagram showing a signal input into a pixel driving circuit and a change in black luminance according to an exemplary embodiment of the present disclosure. Also, FIG. 31 is a graph showing recognition of black luminance during a refresh section according to Comparative Example and Example.

The pixel driving circuit has substantially the same configuration as illustrated in FIG. 27. Therefore, FIG. 27 will be referred hereinafter.

If the adjusted initialization voltage c-Vinit is increased to be higher than a predetermined voltage, a black luminance of the OLED device according to an exemplary embodiment of the present disclosure may be increased. Particularly, as the adjusted initialization voltage c-Vinit is increased, the black luminance is much more increased in the initialization period than in the other sections.

Therefore, in the initialization period, the black luminance may be increased such that a flicker can be recognized at a specific adjusted initialization voltage c-Vinit.

That is, if the adjusted initialization voltage c-Vinit is used, a driving voltage in the organic light emitting diode is increased, thereby decreasing a delay of the current Ioled flowing in the organic light emitting diode. Thus, a flicker phenomenon can be reduced. However, if the adjusted initialization voltage c-Vinit is higher than the predetermined voltage, the black luminance is increased. Thus, a flicker phenomenon may occur again or may be increased.

In other words, there may be a margin of the adjusted initialization voltage c-Vinit which can reduce a flicker phenomenon. Thus, the following driving method is suggested to suppress a flicker phenomenon caused by an increase in black luminance while increasing the adjusted initialization voltage c-Vinit.

Referring to FIG. 27 and FIG. 30, the entire initialization period in a pixel circuit having a 6T1C structure is divided. The entire initialization period is divided into a first initialization period t1 and a second initialization period t1'. Specifically, during the first initialization period t1 in the entire initialization period, the first scan signal SCAN1 is in a high state and the second scan signal SCAN2 is in a low state.

Thus, during the first initialization period t1, the first switching TFT T1 and the fourth switching TFT T4 are turned off and the second switching TFT T2, the third switching TFT T3, and the fifth switching TFT T5 are turned on. Therefore, the adjusted initialization voltage c-Vinit is supplied to the fourth node N4. At the same time, since the nth emission control signal is in a high state, the high-potential voltage VDD is applied to the first node N1 and the second node N2.

Referring to FIG. 30, since the adjusted initialization voltage c-Vinit is supplied to the fourth node N4 during the first initialization period t1, a current flowing in the organic light emitting diode may be gradually increased and the luminance may also be gradually increased.

Thus, in the entire initialization period, the second initialization period t1' is set such that the luminance of the organic light emitting diode increased by the adjusted initialization voltage c-Vinit cannot be recognized as a flicker. Specifically, during the second initialization period t1', the first scan signal SCAN1 falls to a low state in order for the adjusted initialization voltage c-Vinit not to be supplied to the fourth node N4.

That is, during the second initialization period t1', the first scan signal SCAN1 is in a low state and the second scan signal SCAN2 is in a high state.

Therefore, during the second initialization period t1', the first switching TFT T1 is turned on and the second switching TFT T2, the third switching TFT T3, the fourth switching TFT T4, and the fifth switching TFT T5 are turned off. Since all of the second switching TFT T2 and the fifth switching TFT T5 are turned off, the fourth node N4 is floated and the adjusted initialization voltage c-Vinit is not supplied to the fourth node N4.

That is, during the second initialization period t1', a current caused by the adjusted initialization voltage c-Vinit does not flow in the organic light emitting diode and the luminance of the organic light emitting diode is decreased. The adjusted initialization voltage c-Vinit supplied during the first initialization period t1 causes an increase in current flowing in the organic light emitting diode and an increase in luminance, which can be suppressed by converting a state of the first scan signal SCAN1 into a low state in the second initialization period t1'.

As such, in the entire initialization period, the second initialization period t1' in which a state of the first scan signal SCAN1 is converted into a low state to suppress an increase in luminance of the organic light emitting diode caused by the adjusted initialization voltage c-Vinit may be referred to as "initialization-divided section".

FIG. 30 illustrates that each of the entire initialization period t1 and t1', the sampling period t2, the voltage holding section t3, and the connection section t4 has the same length. However, the respective sections may have different lengths. For example, the voltage holding section t3 may be shorter than the other sections.

Referring to FIG. 31, there is a reference luminance which can be recognized by the human eye as a flicker due to an increase in black luminance. In Comparative Example, there is a luminance higher than the reference luminance in at least some sections among the entire initialization period t1 and t1' and the sampling period t2.

Meanwhile, in Example, a black luminance is temporarily increased in the first initialization period t1 and the sampling period t2 but is not higher than the reference luminance which can be recognized as a flicker. Therefore, it cannot be recognized as a flicker phenomenon.

Specifically, as illustrated in FIG. 30, the initialization period is divided into the first initialization period t1 and the second initialization period t1'. Thus, the supply of the adjusted initialization voltage c-Vinit to the fourth node N4 is suppressed by the first scan signal SCAN1. During the second initialization period t1', the adjusted initialization voltage c-Vinit is not supplied to the fourth node N4, so that the black luminance is decreased. Therefore, in Example illustrated in FIG. 31, the maximum value of the black luminance during the refresh section becomes lower than the reference luminance which can be recognized as a flicker.

According to an exemplary embodiment of the present disclosure, during the second initialization period t1' as the initialization-divided section in the entire initialization period t1 and t1', the organic light emitting diode is driven in a state where the first scan signal SCAN1 falls to a low state. Thus, the fourth node N4 is floated and the adjusted initialization voltage c-Vinit is not supplied to the fourth node N4 any longer. Thus, the luminance of the organic light emitting diode is decreased.

Therefore, during the second initialization period t1', the luminance of the organic light emitting diode is temporarily decreased, and during the sampling period t2, the adjusted initialization voltage c-Vinit is supplied again to the fourth node N4 by the first scan signal SCAN1. Thus, the luminance of the organic light emitting diode can be increased again.

That is, during the second initialization period t1', the first scan signal SCAN1 is controlled to be in a low state. Thus, it is possible to suppress an accumulative increase in luminance of the organic light emitting diode during the initialization period and the sampling period.

Therefore, during the initialization period and the sampling period, an increase in black luminance which may be caused by an increase in voltage of the fourth node N4 by the adjusted initialization voltage c-Vinit is suppressed by the first scan signal SCAN1. Thus, a flicker phenomenon can be reduced. Further, a margin of the adjusted initialization voltage c-Vinit which can reduce a flicker phenomenon can be increased.

The exemplary embodiments of the present disclosure can also be described as follows:

According to an aspect of the present disclosure, there is provided an OLED device. The OLED device includes each of a plurality of pixels including a pixel driving circuit. The each of the plurality of pixels includes an organic light emitting diode and a driving TFT configured to control driving of the organic light emitting diode and having an active layer of low temperature poly-silicon (LTPS), a gate node, a source node, and a drain node, first to fifth switching TFTs electrically connected to the driving TFT and each having an active layer of an oxide semiconductor, a gate node, a source node, and a drain node, a storage capacitor connected between the gate node of the driving TFT and the source node of the fifth switching TFT, and a coupling capacitor electrically connected in series to the storage capacitor and configured to cause capacitive coupling so as to supply a bootstrapped voltage to the gate node of the driving TFT.

The OLED device may further include a first node connected to the gate node of the driving TFT and electrically connected to the coupling capacitor so as to be supplied with the bootstrapped voltage.

The bootstrapped voltage of the first node may reduce a delay of a current flowing in the organic light emitting diode.

The OLED device may further include a second node connected to the drain node of the driving TFT and connected to the source node of the third switching TFT so as to be supplied with a high-potential voltage VDD.

When the second switching TFT is turned on, the first node may be charged with the high-potential voltage VDD supplied to the second node.

The OLED device may further include a third node connected to the source node of the driving TFT and supplied with a data voltage when the first switching TFT is turned on.

The third node may be increased in voltage in proportion to a voltage increase of the first node to maintain a constant sampling voltage in the storage capacitor.

The OLED device may further include a fourth node connected to the organic light emitting diode and supplied with an initialization voltage when the fifth switching TFT is turned on.

The third node may be connected to the drain node of the fourth switching TFT and configured to supply the data voltage to the fourth node when the fourth switching TFT is turned on.

The OLED device may further include a fifth node connected to the coupling capacitor and also connected to the gate node of the third switching TFT so as to be supplied with an Nth emission control signal.

A voltage variation of the first node increased due to coupling between the storage capacitor and the coupling capacitor may be determined by the Nth emission control signal.

One node of the coupling capacitor may be connected to the gate node of the third switching TFT and the other node of the coupling capacitor may be connected to the source node of the third switching TFT.

The gate node of the third switching TFT may be supplied with an Nth emission control signal so as to bootstrap the source node of the third switching TFT by the coupling capacitor.

The OLED device may further include a fifth node connected to the gate node of the third switching TFT which is supplied with the Nth emission control signal and also connected to the one node of the coupling capacitor.

The driving TFT includes a parasitic capacitor, and the parasitic capacitor may generate a continuous with the coupling capacitor.

One node of the parasitic capacitor may be connected to the second node and the other node of the parasitic capacitor may be connected to the first node.

The OLED device may further include a fifth node connected to a gate electrode of the fourth switching TFT and supplied with an N−1th emission control signal.

The fifth node is connected to the coupling capacitor and thus supplied with the N−1th emission control signal so as to be involved in generation of a bootstrapped voltage of the first node.

The driving TFT may be an LTPS TFT.

The first to fifth switching TFTs may be oxide semiconductor TFTs having a higher voltage holding capability than the LTPS TFT.

According to another aspect of the present disclosure, there is provided an OLED device. The OLED device includes each of a plurality of pixels having an organic light emitting diode and a pixel driving circuit that drives the organic light emitting diode. The pixel driving circuit includes a driving TFT configured to control driving of the organic light emitting diode and including a gate node as a first node, a drain node as a second node, and a source node as a third node, first to fifth switching TFTs electrically connected to the driving TFT, a storage capacitor connected to a fourth node as the drain node of the fifth switching TFT and configured to store a voltage to be applied to the driving TFT DT, and a coupling capacitor configured to supply a bootstrapped voltage to the first node as the gate node of the driving TFT. The pixel driving circuit operates in a period divided into an initialization period in which an initialization voltage Vinit is supplied to the fourth node and a high-potential voltage VDD is supplied to the first node, a sampling period in which a data voltage Vdata is supplied to the third node and a threshold voltage Vth of the driving TFT DT is scanned when the high-potential voltage VDD is decreased to the data voltage Vdata in the first node, a voltage holding section in which the first to fifth switching TFTs are turned off and each node is floated, a connection section in which the third node and the fourth node are electrically connected to each other and the data voltage Vdata held in the third node is supplied to the fourth node, and an emission section in which a voltage of the first node is rapidly increased by the coupling capacitor and a voltage of the source node of the driving TFT is also increased according to the increased voltage of the first node, so that a delay of a current involved in emission by the organic light emitting diode is minimized.

In the initialization period, the second switching TFT and the fifth switching TFT may be turned on and the first switching TFT and the fourth switching TFT may be turned off.

In the sampling period, the first switching TFT, the second switching TFT, and the fifth switching TFT may be turned on and the third switching TFT and the fourth switching TFT may be turned off.

When the third switching TFT is turned off and the second switching TFT is turned on, the second node as the drain node of the driving TFT DT and the first node as the gate node of the driving TFT DT may be electrically connected to each other.

When the first node and the second node are electrically connected, a gate-source voltage Vgs of the driving TFT DT may become the threshold voltage Vth.

When the fifth switching TFT is turned on, an initialization voltage Vinit may be supplied to the fourth node, and when the first switching TFT and the second switching TFT are turned on, the first node may be supplied with Vdata+Vth and the storage capacitor may store Vdata+Vth−Vinit.

Since each node is floated in the voltage holding section, the first to fifth switching TFTs may be oxide semiconductor TFTs having a low off-current.

In the connection section, the fourth switching TFT may be turned on in response to an N−1th emission control signal.

In the connection section, the coupling capacitor connected to the fourth switching TFT may be supplied with the N−1th emission control signal so as to bootstrap a voltage of the first node.

In the emission section, the first switching TFT, the second switching TFT, and the fifth switching TFT may be turned off and the third switching TFT and the fourth switching TFT may be turned on.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
a plurality of pixels, each of the plurality of pixels including:
an organic light emitting diode;
a driving thin film transistor (TFT) configured to control driving of the organic light emitting diode and having a low temperature poly-silicon (LTPS) active layer, a gate node, a source node, and a drain node;
first, second, third, fourth, and fifth switching TFTs electrically connected to the driving TFT, each of the first, second, third, fourth, and fifth switching TFTs having an oxide semiconductor active layer, a gate node, a source node, and a drain node;
a storage capacitor connected between the gate node of the driving TFT and the source node of the fifth switching TFT; and
a coupling capacitor electrically connected in series to the storage capacitor and configured to cause capacitive coupling so as to supply a bootstrapped voltage to the gate node of the driving TFT.

2. The organic light emitting display device according to claim 1, each of the plurality of pixels further comprising:
a first node connected to the gate node of the driving TFT and electrically connected to the coupling capacitor so as to be supplied with the bootstrapped voltage.

3. The organic light emitting display device according to claim 2, wherein the bootstrapped voltage of the first node reduces a delay of a current flowing in the organic light emitting diode.

4. The organic light emitting display device according to claim 2, wherein a voltage variation of the first node increased due to coupling between the storage capacitor and the coupling capacitor is determined by the Nth emission control signal.

5. The organic light emitting display device according to claim 1, each of the plurality of pixels further comprising:
a second node connected to the drain node of the driving TFT and connected to the source node of the third switching TFT, the third switching TFT operable to supply the second node with a high-potential voltage VDD.

6. The organic light emitting display device according to claim 5, wherein when the second switching TFT is turned on, the first node is charged with the high-potential voltage VDD supplied to the second node.

7. The organic light emitting display device according to claim 1, each of the plurality of pixels further comprising:
a third node connected to the source node of the driving TFT and supplied with a data voltage when the first switching TFT is turned on.

8. The organic light emitting display device according to claim 7, wherein a voltage at the third node is operably increased in proportion to a voltage increase of the first node to maintain a constant sampling voltage in the storage capacitor.

9. The organic light emitting display device according to claim 7, wherein the third node is connected to the drain node of the fourth switching TFT and configured to supply the data voltage to the fourth node when the fourth switching TFT is turned on.

10. The organic light emitting display device according to claim 1, each of the plurality of pixels further comprising:
a fourth node connected to the organic light emitting diode and supplied with an initialization voltage when the fifth switching TFT is turned on.

11. The organic light emitting display device according to claim 1, each of the plurality of pixels further comprising:
a fifth node connected to the coupling capacitor and connected to the gate node of the third switching TFT so as to be supplied with an Nth emission control signal.

12. The organic light emitting display device according to claim 1, wherein a first node of the coupling capacitor is connected to the gate node of the third switching TFT and a second node of the coupling capacitor is connected to the source node of the third switching TFT.

13. The organic light emitting display device according to claim 12, wherein the gate node of the third switching TFT is supplied with an Nth emission control signal so as to bootstrap the source node of the third switching TFT by the coupling capacitor.

14. The organic light emitting display device according to claim 1, wherein the driving TFT includes a parasitic capacitor, and the parasitic capacitor generates a continuous coupling with the coupling capacitor.

15. The organic light emitting display device according to claim 14, wherein a first node of the parasitic capacitor is connected to the drain node of the driving TFT, and a second node of the parasitic capacitor is connected to the gate node of the driving TFT.

16. The organic light emitting device according to claim 1, wherein the gate node of the fourth switching TFT is supplied with an N−1th emission control signal.

17. The organic light emitting display device according to claim 16, wherein the gate node of the fourth switching TFT is connected to the coupling capacitor and is supplied with the N−1th emission control signal so as to be involved in generation of the bootstrapped voltage of the gate node of the driving TFT.

18. An organic light emitting display (OLED) display device comprising:
a plurality of pixels, each of the pixels including an organic light emitting diode and a pixel driving circuit that drives the organic light emitting diode,
each of the pixel driving circuit including:
a driving thin film transistor (TFT) configured to control driving of the organic light emitting diode and including a gate node as a first node, a drain node as a second node, and a source node as a third node;
first, second, third, fourth, and fifth switching TFTs electrically connected to the driving TFT;
a storage capacitor connected to a fourth node as a drain node of the fifth switching TFT and configured to store a voltage to be applied to the driving TFT; and
a coupling capacitor configured to supply a bootstrapped voltage to the first node as the gate node of the driving TFT,
the pixel driving circuit operates in a period that includes:
an initialization period in which an initialization voltage Vinit is supplied to the fourth node and a high-potential voltage VDD is supplied to the first node;
a sampling period in which a data voltage Vdata is supplied to the third node and a threshold voltage Vth of the driving TFT is scanned when the high-potential voltage VDD is decreased to the data voltage Vdata in the first node;
a voltage holding section in which the first through fifth switching TFTs are turned off and each of the first through fourth nodes are floated;
a connection section in which the third node and the fourth node are electrically connected to each other and the data voltage Vdata held in the third node is supplied to the fourth node; and
an emission section in which a voltage of the first node is rapidly increased by the coupling capacitor and a voltage of the source node of the driving TFT is also increased according to the increased voltage of the first node, so that a delay of a current involved in emission by the organic light emitting diode is minimized.

19. The OLED display device according to claim 18, wherein in the initialization period, the second switching TFT and the fifth switching TFT are turned on and the first switching TFT and the fourth switching TFT are turned off.

20. The OLED display device according to claim 18, wherein in the sampling period, the first switching TFT, the second switching TFT, and the fifth switching TFT are turned on and the third switching TFT and the fourth switching TFT are turned off.

21. The OLED display device according to claim 20, wherein when the third switching TFT is turned off and the second switching TFT is turned on, the second node as the drain node of the driving TFT and the first node as the gate node of the driving TFT are electrically connected to each other.

22. The OLED display device according to claim 20, wherein when the fifth switching TFT is turned on, an initialization voltage Vinit is supplied to the fourth node, and when the first switching TFT and the second switching TFT are turned on, the first node is supplied with Vdata+Vth and the storage capacitor stores Vdata+Vth−Vinit.

23. The OLED display device according to claim 18, wherein the first through fifth switching TFTs are oxide semiconductor TFTs having a low off-current.

24. The OLED display device according to claim 18, wherein in the connection section, the fourth switching TFT is turned on in response to an N−1th emission control signal.

\* \* \* \* \*